US011644860B2

(12) United States Patent
Seger, Jr. et al.

(10) Patent No.: US 11,644,860 B2
(45) Date of Patent: May 9, 2023

(54) CONFIGURING A PROGRAMMABLE DRIVE SENSE UNIT

(71) Applicant: SigmaSense, LLC., Wilmington, DE (US)

(72) Inventors: Richard Stuart Seger, Jr., Belton, TX (US); Daniel Keith Van Ostrand, Leander, TX (US); Patrick Troy Gray, Cedar Park, TX (US); Michael Shawn Gray, Dripping Springs, TX (US); Timothy W. Markison, Mesa, AZ (US)

(73) Assignee: SigmaSense, LLC., Wilmington, DE (US)

( * ) Notice: Subject to any disclaimer, the term of this patent is extended or adjusted under 35 U.S.C. 154(b) by 0 days.

(21) Appl. No.: 17/814,165

(22) Filed: Jul. 21, 2022

(65) Prior Publication Data
US 2022/0357762 A1 Nov. 10, 2022

Related U.S. Application Data

(63) Continuation-in-part of application No. 17/653,398, filed on Mar. 3, 2022, which is a continuation of
(Continued)

(51) Int. Cl.
*G06F 1/10* (2006.01)
*H03M 1/12* (2006.01)
(Continued)

(52) U.S. Cl.
CPC ......... *G06F 1/10* (2013.01); *H03K 19/17784* (2013.01); *H03M 1/1255* (2013.01);
(Continued)

(58) Field of Classification Search
CPC .. G06F 1/10; H03K 19/17784; H03M 1/1255; H04B 1/0007; H04B 1/0017; H04B 1/0042
See application file for complete search history.

(56) References Cited

U.S. PATENT DOCUMENTS 6,218,972 B1   4/2001   Groshong
6,665,013 B1   12/2003  Fossum et al.
(Continued)

FOREIGN PATENT DOCUMENTS

CN   103995626 A   8/2014
CN   104182105 A   12/2014

OTHER PUBLICATIONS

Baker; How delta-sigma ADCs work. Part 1; Analog Applications Journal; Oct. 1, 2011; 6 pgs.
(Continued)

*Primary Examiner* — Peter D McLoone
(74) *Attorney, Agent, or Firm* — Garlick & Markison

(57) ABSTRACT

A method for execution by one or more processing modules to configure a programmable drive-sense unit (DSU) includes determining one or more load sensing objectives based on sensing a load using the DSU that is configured to drive and simultaneously to sense the load via a single line. The method further includes determining one or more data processing objectives associated with sensing the load. The method further includes determining desired characteristics for the output data associated with sensing the load. The method further includes determining operational parameters for the DSU based on one or more of the load sensing objectives, the data processing objectives, and the desired characteristics for the output data. The method further includes configuring the DSU based on the operational parameters to achieve the one or more load sensing objectives.

20 Claims, 55 Drawing Sheets

Related U.S. Application Data application No. 17/217,822, filed on Mar. 30, 2021, now Pat. No. 11,294,420, which is a continuation of application No. 16/266,953, filed on Feb. 4, 2019, now Pat. No. 11,003,205, application No. 17/814,165 is a continuation-in-part of application No. 17/561,438, filed on Dec. 23, 2021, which is a continuation of application No. 17/168,962, filed on Feb. 5, 2021, now Pat. No. 11,265,002, which is a continuation of application No. 16/780,133, filed on Feb. 3, 2020, now Pat. No. 10,917,101, which is a continuation of application No. 16/365,169, filed on Mar. 26, 2019, now Pat. No. 10,554,215, application No. 17/814,165 is a continuation-in-part of application No. 17/317,734, filed on May 11, 2021, now Pat. No. 11,429,226, which is a continuation-in-part of application No. 16/113,379, filed on Aug. 27, 2018, now Pat. No. 11,099,032.

(51) Int. Cl.
*H03K 19/17784* (2020.01)
*H04B 1/00* (2006.01)

(52) U.S. Cl.
CPC ......... *H04B 1/0007* (2013.01); *H04B 1/0017* (2013.01); *H04B 1/0042* (2013.01)

(56) References Cited

U.S. PATENT DOCUMENTS

| | | |
|---|---|---|
| 7,528,755 B2 | 5/2009 | Hammerschmidt |
| 8,031,094 B2 | 10/2011 | Hotelling et al. |
| 8,089,289 B1 | 1/2012 | Kremin et al. |
| 8,279,180 B2 | 10/2012 | Hotelling et al. |
| 8,547,114 B2 | 10/2013 | Kremin |
| 8,587,535 B2 | 11/2013 | Oda et al. |
| 8,625,726 B2 | 1/2014 | Kuan |
| 8,982,097 B1 | 3/2015 | Kuzo et al. |
| 9,081,437 B2 | 7/2015 | Oda |
| 9,201,547 B2 | 12/2015 | Elias |
| 2003/0222720 A1* | 12/2003 | Sumita ............... H03L 7/0891 331/16 |
| 2011/0063154 A1 | 3/2011 | Hotelling et al. |
| 2011/0298745 A1 | 12/2011 | Souchkov |
| 2012/0278031 A1 | 11/2012 | Oda |
| 2013/0278447 A1 | 10/2013 | Kremin |
| 2014/0327644 A1 | 11/2014 | Mohindra |
| 2015/0091847 A1 | 4/2015 | Chang |
| 2015/0346889 A1 | 12/2015 | Chen |
| 2016/0188049 A1 | 6/2016 | Yang et al. |
| 2018/0275824 A1 | 9/2018 | Li |

OTHER PUBLICATIONS

Brian Pisani, Digital Filter Types in Delta-Sigma ADCs, Application Report SBAA230, May 2017, pp. 1-8, Texas Instruments Incorporated, Dallas, Texas.

* cited by examiner

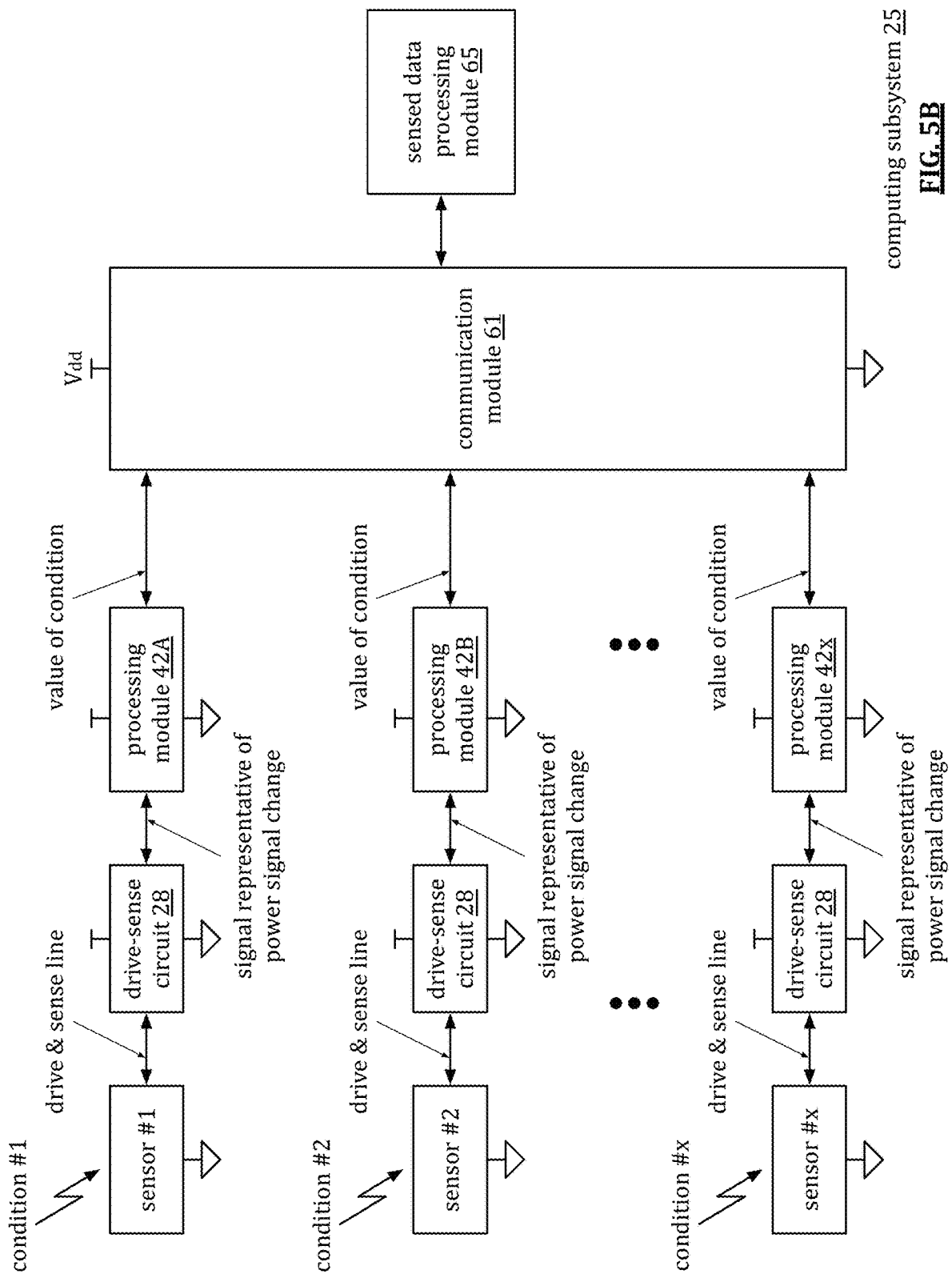

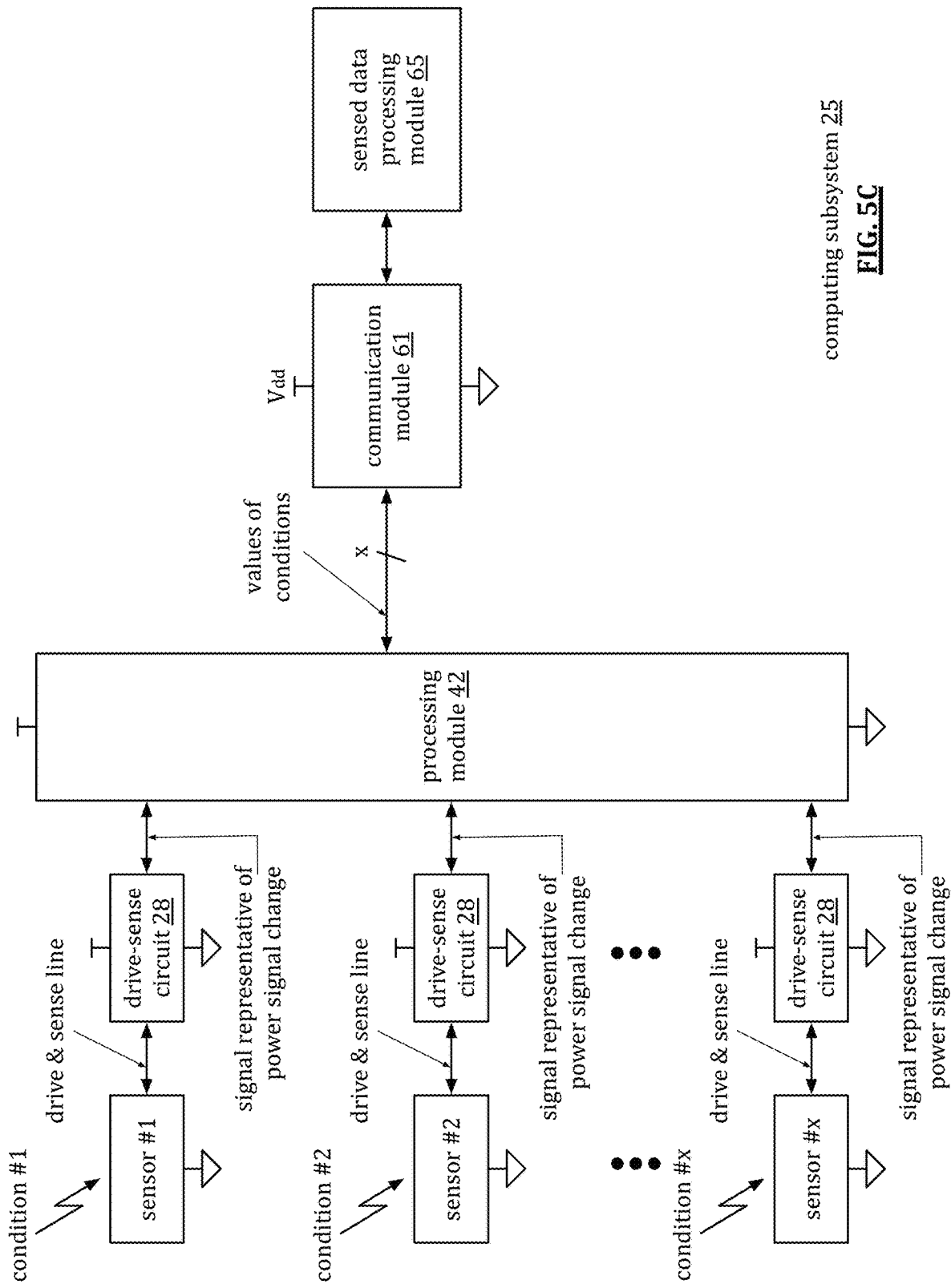

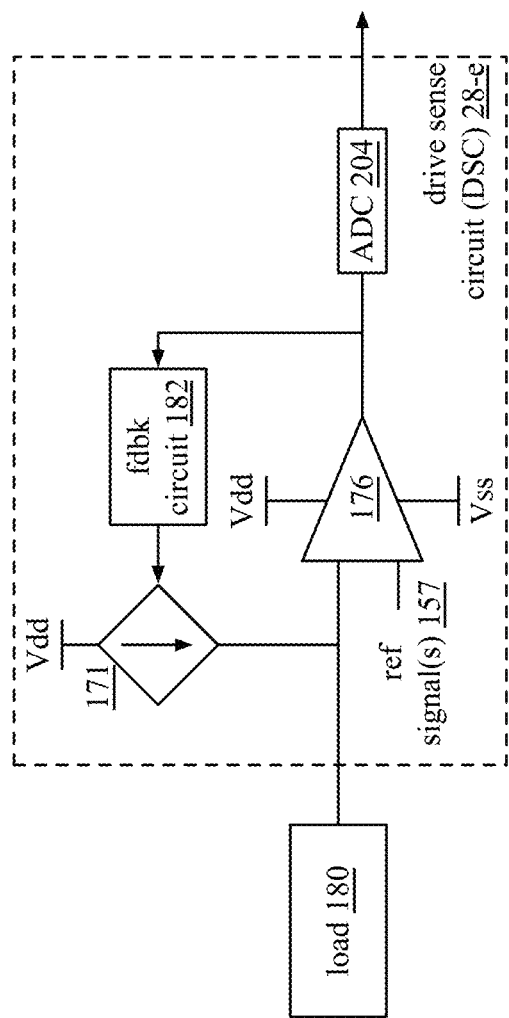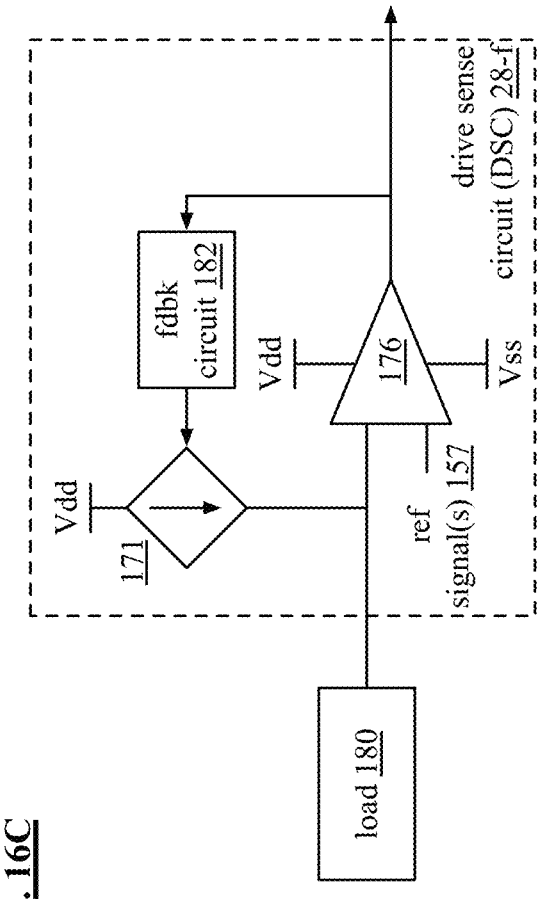

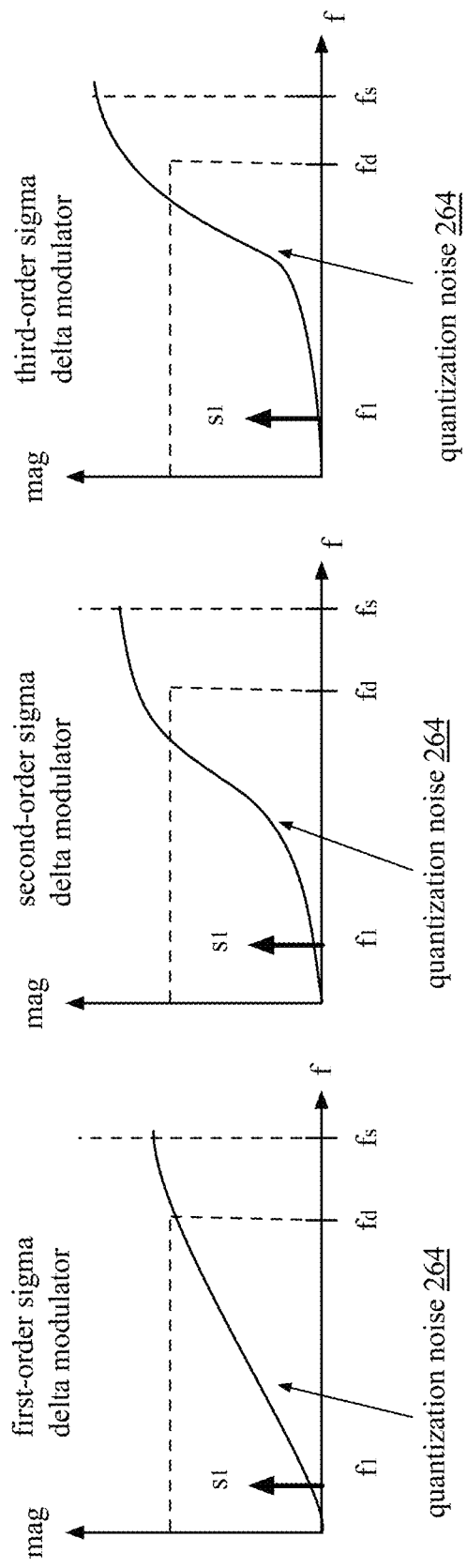
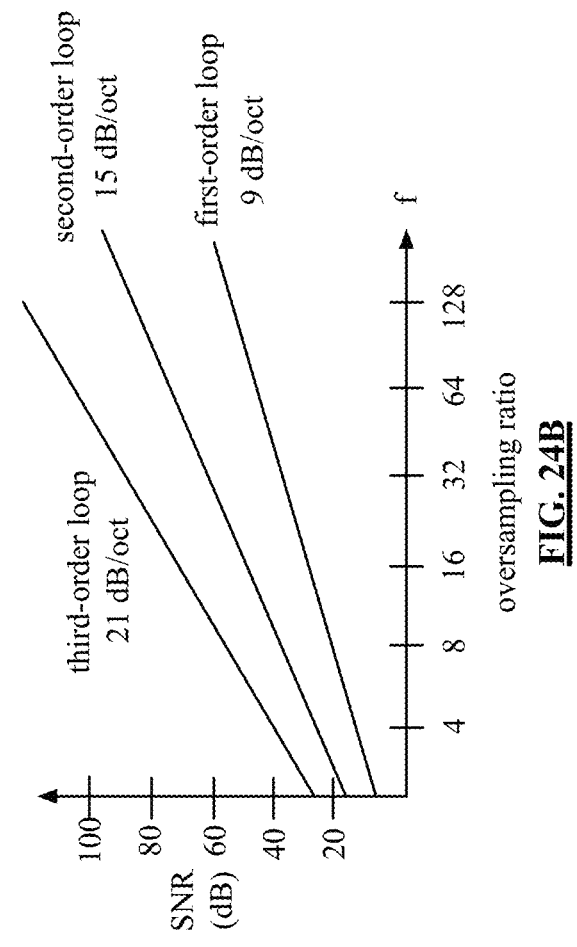
FIG. 24A
FIG. 24B

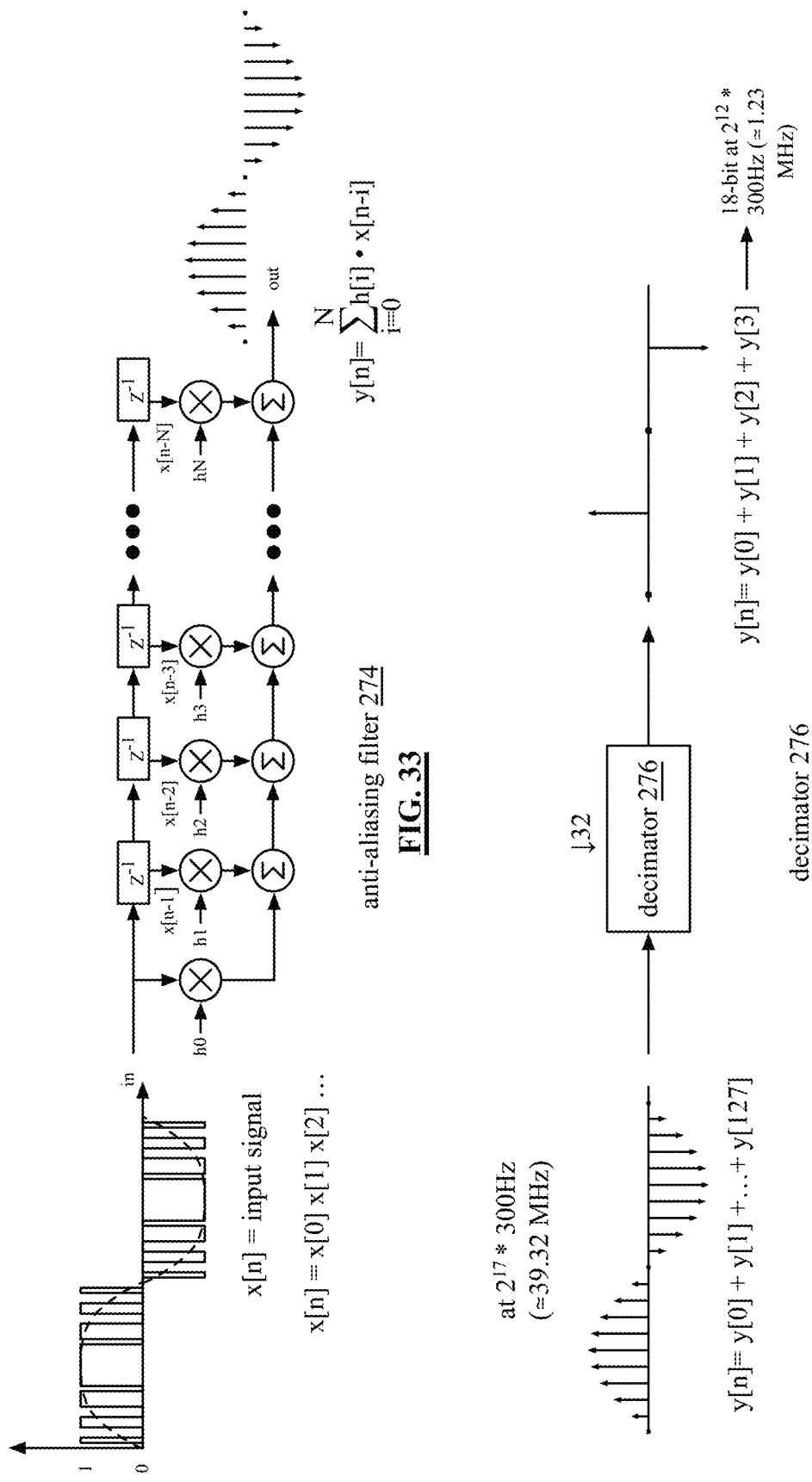

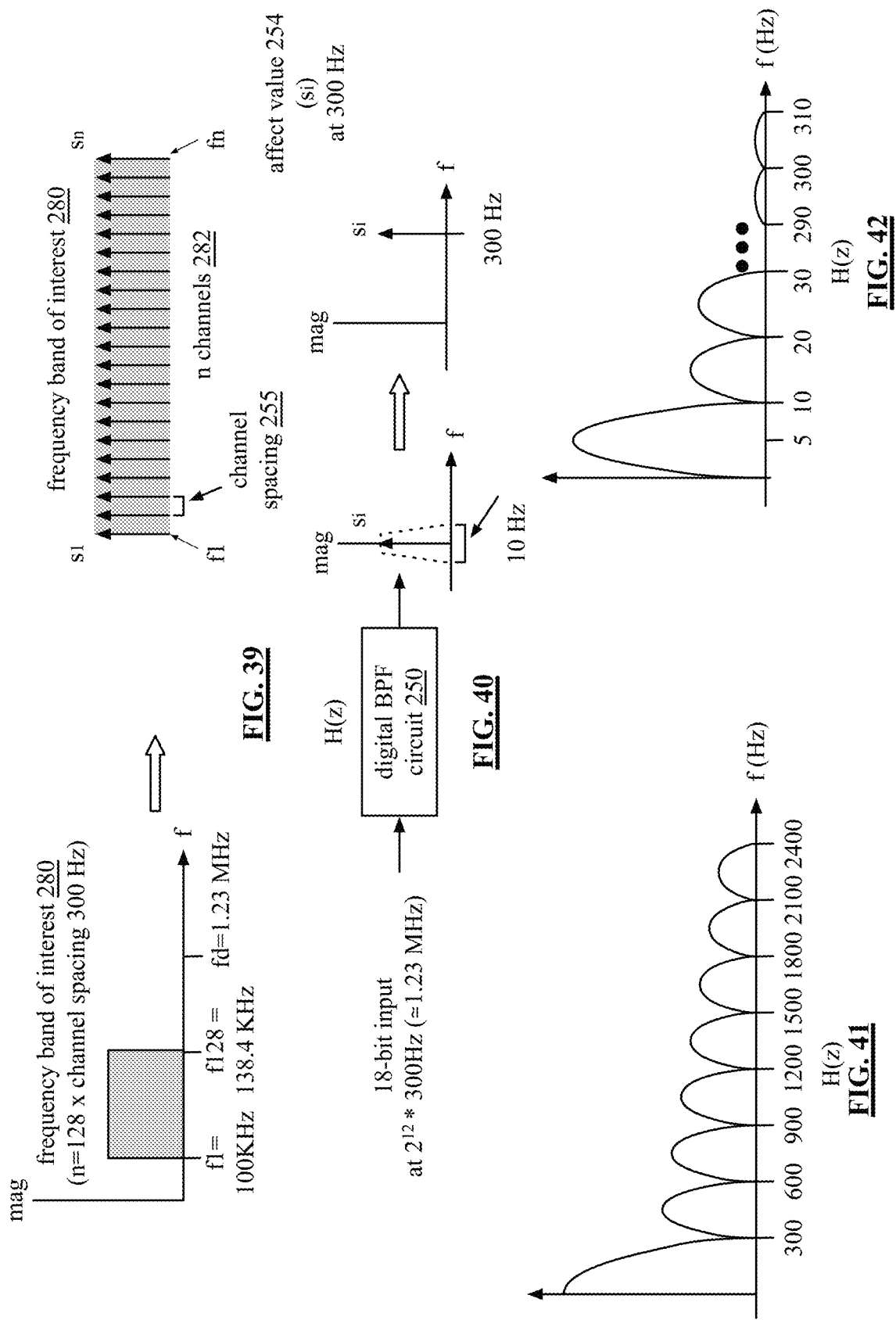

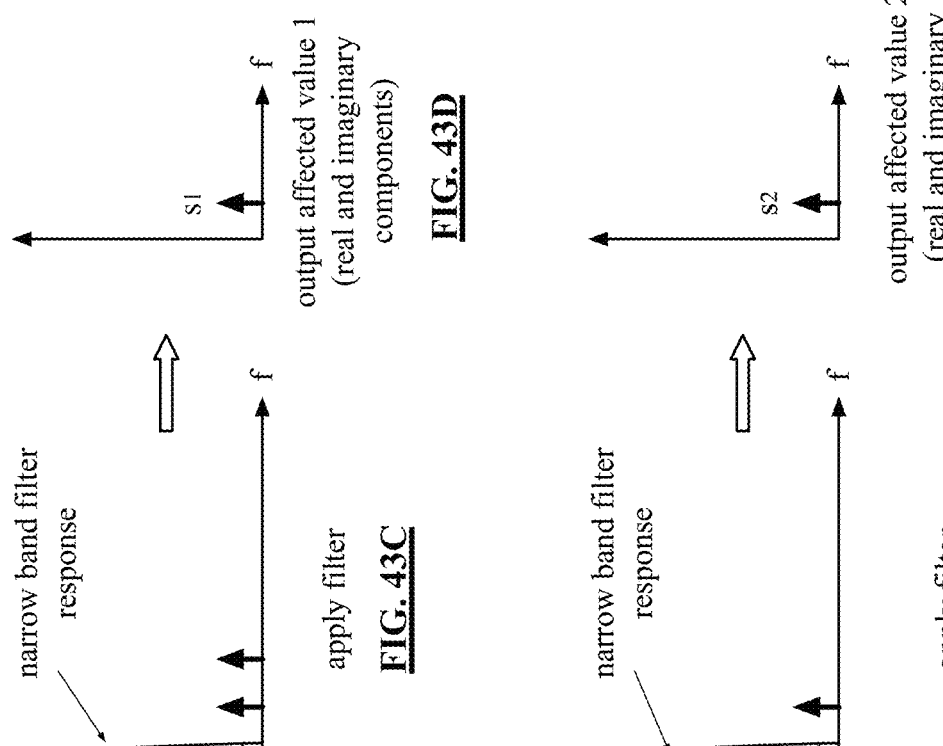
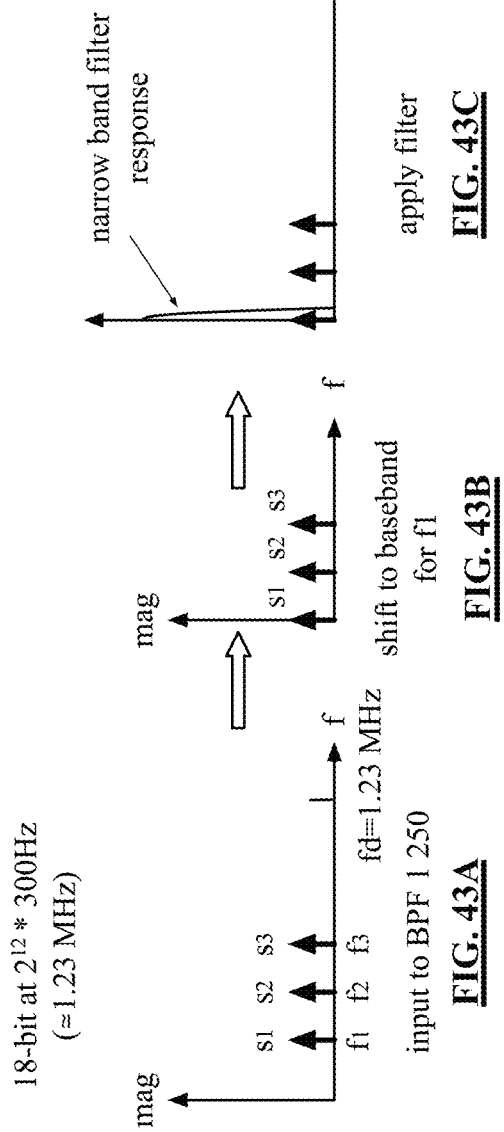
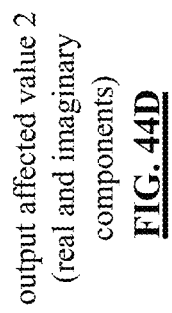
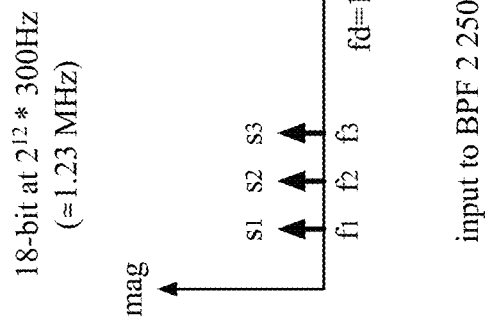

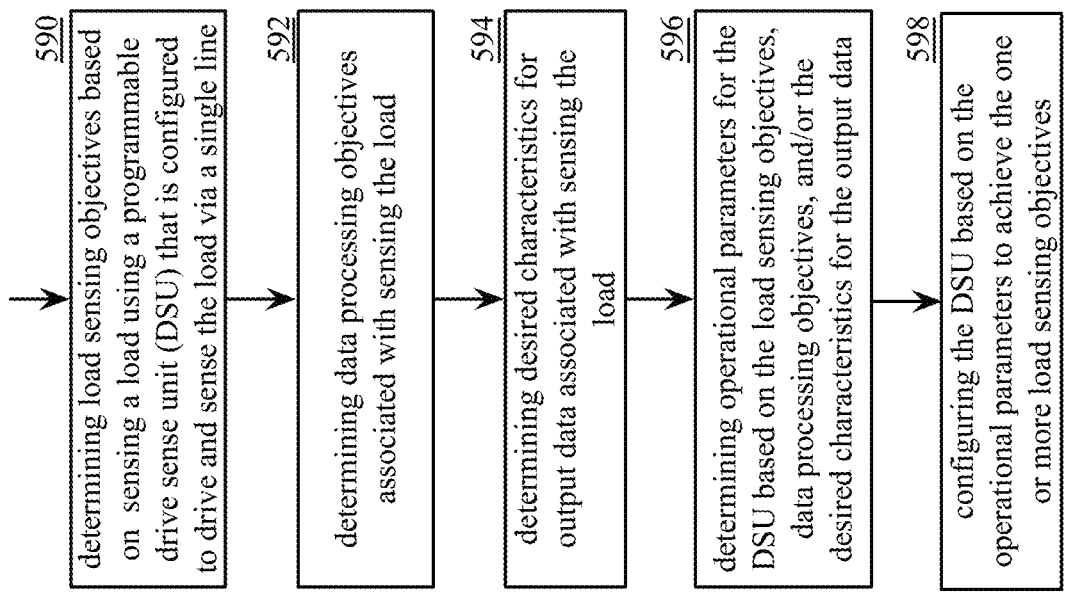

CONFIGURING A PROGRAMMABLE DRIVE SENSE UNIT

CROSS-REFERENCE TO RELATED APPLICATIONS

The present U.S. Utility patent application claims priority pursuant to 35 U.S.C. § 120 as a continuation of U.S. Utility application Ser. No. 17/653,398, entitled "DATA FORMATTING OF A LOW VOLTAGE DRIVE CIRCUIT DATA COMMUNICATION SYSTEM", filed Mar. 3, 2022, which is a continuation of U.S. Utility application Ser. No. 17/217,822, entitled "DATA FORMATTING CIRCUIT OF A LOW VOLTAGE DRIVE CIRCUIT DATA COMMUNICATION SYSTEM", filed Mar. 30, 2021, issued as U.S. Pat. No. 11,294,420 on Apr. 5, 2022, which is a continuation of U.S. Utility application Ser. No. 16/266,953, entitled "RECEIVE ANALOG TO DIGITAL CIRCUIT OF A LOW VOLTAGE DRIVE CIRCUIT DATA COMMUNICATION SYSTEM", filed Feb. 4, 2019, issued as U.S. Pat. No. 11,003,205 on May 11, 2021, all of which are hereby incorporated herein by reference in their entirety and made part of the present U.S. Utility patent application for all purposes.

The present U.S. Utility patent application also claims priority pursuant to 35 U.S.C. § 120 as a continuation-in-part of U.S. Utility application Ser. No. 17/561,438, entitled "ANALOG TO DIGITAL CONVERSION CIRCUIT INCLUDING A DIGITAL DECIMATION FILTERING CIRCUIT", filed Dec. 23, 2021, which is a continuation of U.S. Utility application Ser. No. 17/168,962, entitled "PARALLEL PROCESSING OF MULTIPLE CHANNELS WITH VERY NARROW BANDPASS DIGITAL FILTERING", filed Feb. 5, 2021, issued as U.S. Pat. No. 11,265,002 on Mar. 1, 2022, which is a continuation of U.S. Utility application Ser. No. 16/780,133, entitled "ANALOG TO DIGITAL CONVERSION CIRCUIT WITH VERY NARROW BANDPASS DIGITAL FILTERING," filed Feb. 3, 2020, issued as U.S. Pat. No. 10,917,101 on Feb. 9, 2021, which is a continuation of U.S. Utility patent application Ser. No. 16/365,169 entitled "ANALOG TO DIGITAL CONVERSION CIRCUIT WITH VERY NARROW BANDPASS DIGITAL FILTERING," filed Mar. 26, 2019, issued as U.S. Pat. No. 10,554,215 on Feb. 4, 2020, all of which are hereby incorporated herein by reference in their entirety and made part of the present U.S. Utility patent application for all purposes.

The present U.S. Utility patent application also claims priority pursuant to 35 U.S.C. § 120 as a continuation-in-part of U.S. Utility application Ser. No. 17/317,734, entitled "ANALOG-DIGITAL DRIVE SENSE CIRCUIT", filed May 11, 2021, which is a continuation-in-part of U.S. Utility application Ser. No. 16/113,379, entitled "DRIVE SENSE CIRCUIT WITH DRIVE-SENSE LINE", filed Aug. 27, 2018, issued as U.S. Pat. No. 11,099,032 on Aug. 24, 2021, all of which are hereby incorporated herein by reference in their entirety and made part of the present U.S. Utility patent application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to data communication systems and more particularly to sensed data collection and/or communication.

Description of Related Art

Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touch-screens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touch screen. As yet another example, the computing device processes the sensor signals to determine various data points in a production line of a product.

BRIEF DESCRIPTION OF THE SEVERAL VIEWS OF THE DRAWING(S)

FIG. 5B is a schematic block diagram of another embodiment of a computing subsystem;

FIG. 5C is a schematic block diagram of another embodiment of a computing subsystem;

FIG. 16C is a schematic block diagram of another embodiment of a drive sense circuit;

FIG. 16D is a schematic block diagram of another embodiment of a drive sense circuit;

FIG. 24A is an example of quantization noise of a sigma delta oversampling modulator;

FIG. 24B is a graphical illustration of an example of an oversampling ratio plotted versus a signal to noise ratio;

FIG. 33 is a schematic block diagram of an embodiment of an anti-aliasing filter;

FIG. 34 is a schematic block diagram of an embodiment of a decimator;

FIG. 39 is an example of a frequency band having n frequency channels;

FIG. 40 is a schematic block diagram of an embodiment of digital bandpass filter (BPF) circuit;

FIG. 41 is an example frequency response H(z) of a digital bandpass filter (BPF) circuit;

FIG. 42 is an example frequency response H(z) of a digital bandpass filter (BPF) circuit;

FIGS. 43A-43D are examples of processing a signal by a digital bandpass filter (BPF) circuit;

FIGS. 44A-44D are examples of processing a signal by a digital bandpass filter (BPF) circuit;

FIG. 59 is a flowchart of an example of a method of programming a drive sense unit;

DETAILED DESCRIPTION OF THE INVENTION

Figure 1:
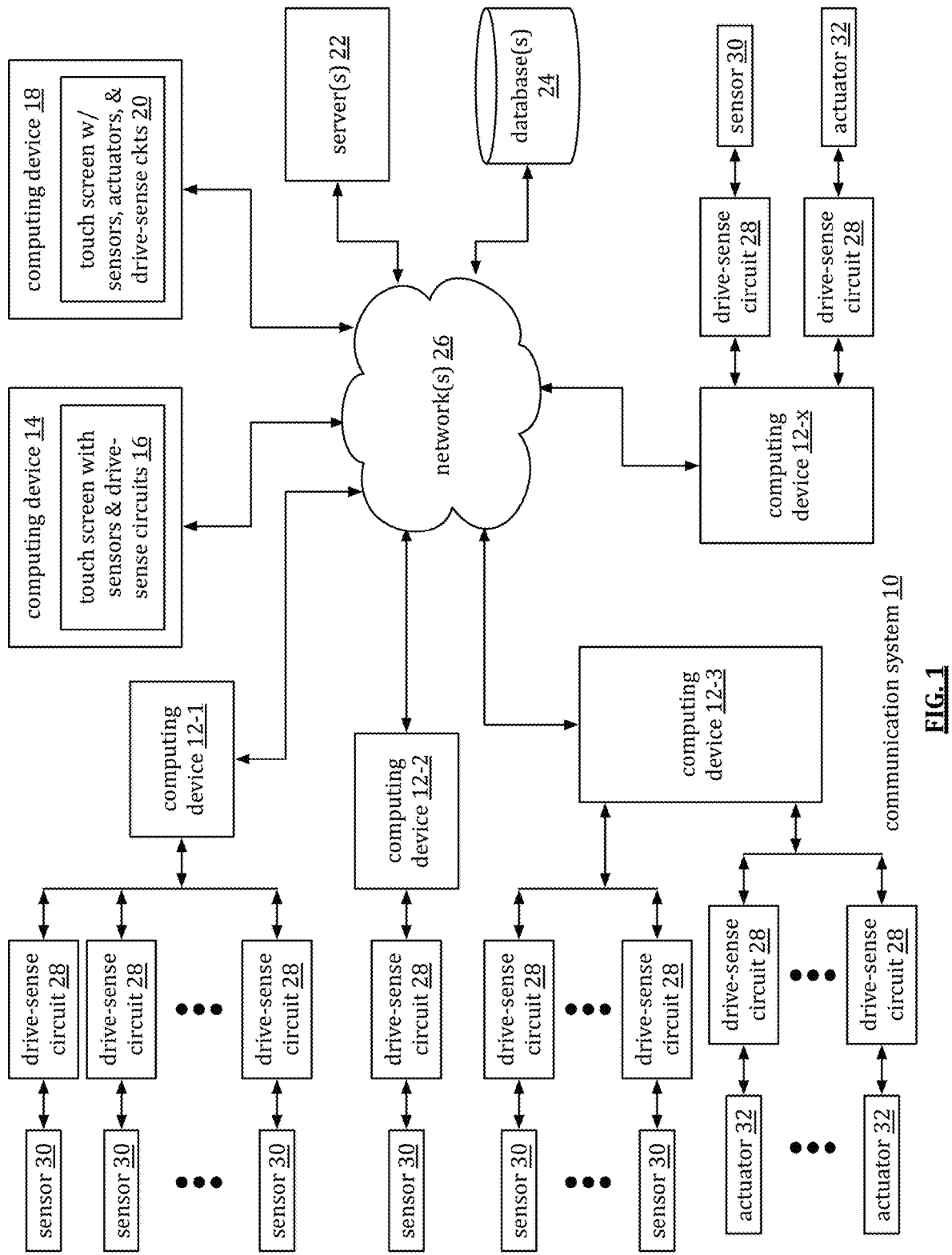
FIG. 1 is a schematic block diagram of an embodiment of a communication system.

FIG. 1 is a schematic block diagram of an embodiment of a communication system 10 that includes a plurality of computing. devices 12-10, one or more servers 22, one or more databases 24, one or more networks 26, a plurality of drive-sense circuits 28, a plurality of sensors 30, and a plurality of actuators 32. Computing devices 14 include a touch screen 16 with sensors and drive-sensor circuits and computing devices 18 include a touch & tactic screen 20 that includes sensors, actuators, and drive-sense circuits.

A sensor 30 functions to convert a physical input into an electrical output and/or an optical output. The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, eclectic field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an eclectic signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

An actuator 32 converts an electrical input into a physical output. The physical output of an actuator may be one of a variety of physical output conditions. For example, the physical output condition includes one or more of, but is not limited to, acoustic waves (e.g., amplitude, phase, polarization, spectrum, and/or wave velocity); a magnetic condition (e.g., flux, permeability, magnetic field, which amplitude, phase, and/or polarization); a thermal condition (e.g., temperature, flux, specific heat, thermal conductivity, etc.); and a mechanical condition (e.g., position, velocity, acceleration, force, strain, stress, pressure, torque, etc.). As an example, a piezoelectric actuator converts voltage into force or pressure. As another example, a speaker converts electrical signals into audible acoustic waves.

An actuator 32 may be one of a variety of actuators. For example, an actuator 32 is one of a comb drive, a digital micro-mirror device, an electric motor, an electroactive polymer, a hydraulic cylinder, a piezoelectric actuator, a pneumatic actuator, a screw jack, a servomechanism, a solenoid, a stepper motor, a shape-memory allow, a thermal bimorph, and a hydraulic actuator.

The various types of actuators have a variety of actuators characteristics that are factors in providing power to the actuator and sending signals to the actuators for desired performance. The actuator characteristics include resistance, reactance, power requirements, sensitivity, range, stability, repeatability, linearity, error, response time, and/or frequency response. For example, the resistance, reactance, and power requirements are factors in determining drive circuit requirements. As another example, sensitivity, stability, and/or linear are factors for generating the signaling to send to the actuator to obtain the desired physical output condition.

The computing devices 12, 14, and 18 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12, 14, and 18 will be discussed in greater detail with reference to one or more of FIGS. 2-4.

A server 22 is a special type of computing device that is optimized for processing large amounts of data requests in parallel. A server 22 includes similar components to that of the computing devices 12, 14, and/or 18 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12, 14, and/or 18 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a standalone separate computing device and/or may be a cloud computing device.

The network 26 includes one more local area networks (LAN) and/or one or more wide area networks WAN, which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12-1 communicates with a plurality of drive-sense circuits 28, which, in turn, communicate with a plurality of sensors 30. The sensors 30 and/or the drive-sense circuits 28 are within the computing device 12-1 and/or external to it. For example, the sensors 30 may be external to the computing device 12-1 and the drive-sense circuits are within the computing device 12-1. As another example, both the sensors 30 and the drive-sense circuits 28 are external to the computing device 12-1. When the drive-sense circuits 28 are external to the computing device, they are coupled to the computing device 12-1 via wired and/or wireless communication links as will be discussed in greater detail with reference to one or more of FIGS. 5A-5C.

The computing device 12-1 communicates with the drive-sense circuits 28 to; (a) turn them on, (b) obtain data from the sensors (individually and/or collectively), (c) instruct the drive sense circuit on how to communicate the sensed data to the computing device 12-1, (d) provide signaling attributes (e.g., DC level, AC level, frequency, power level, regulated current signal, regulated voltage signal, regulation of an impedance, frequency patterns for various sensors, different frequencies for different sensing applications, etc.) to use with the sensors, and/or (e) provide other commands and/or instructions.

As a specific example, the sensors 30 are distributed along a pipeline to measure flow rate and/or pressure within a section of the pipeline. The drive-sense circuits 28 have their own power source (e.g., battery, power supply, etc.) and are proximally located to their respective sensors 30. At desired time intervals (milliseconds, seconds, minutes, hours, etc.), the drive-sense circuits 28 provide a regulated source signal or a power signal to the sensors 30. An electrical characteristic of the sensor 30 affects the regulated source signal or power signal, which is reflective of the condition (e.g., the flow rate and/or the pressure) that sensor is sensing.

The drive-sense circuits 28 detect the effects on the regulated source signal or power signals as a result of the electrical characteristics of the sensors. The drive-sense circuits 28 then generate signals representative of change to the regulated source signal or power signal based on the detected effects on the power signals. The changes to the regulated source signals or power signals are representative of the conditions being sensed by the sensors 30.

The drive-sense circuits 28 provide the representative signals of the conditions to the computing device 12-1. A representative signal may be an analog signal or a digital signal. In either case, the computing device 12-1 interprets the representative signals to determine the pressure and/or flow rate at each sensor location along the pipeline. The computing device may then provide this information to the server 22, the database 24, and/or to another computing device for storing and/or further processing.

As another example of operation, computing device 12-2 is coupled to a drive-sense circuit 28, which is, in turn, coupled to a sensor 30. The sensor 30 and/or the drive-sense circuit 28 may be internal and/or external to the computing device 12-2. In this example, the sensor 30 is sensing a condition that is particular to the computing device 12-2. For example, the sensor 30 may be a temperature sensor, an ambient light sensor, an ambient noise sensor, etc. As described above, when instructed by the computing device 12-2 (which may be a default setting for continuous sensing or at regular intervals), the drive-sense circuit 28 provides the regulated source signal or power signal to the sensor 30 and detects an effect to the regulated source signal or power signal based on an electrical characteristic of the sensor. The drive-sense circuit generates a representative signal of the affect and sends it to the computing device 12-2.

In another example of operation, computing device 12-3 is coupled to a plurality of drive-sense circuits 28 that are coupled to a plurality of sensors 30 and is coupled to a plurality of drive-sense circuits 28 that are coupled to a plurality of actuators 32. The generally functionality of the drive-sense circuits 28 coupled to the sensors 30 in accordance with the above description.

Since an actuator 32 is essentially an inverse of a sensor in that an actuator converts an electrical signal into a physical condition, while a sensor converts a physical condition into an electrical signal, the drive-sense circuits 28 can be used to power actuators 32. Thus, in this example, the computing device 12-3 provides actuation signals to the drive-sense circuits 28 for the actuators 32. The drive-sense circuits modulate the actuation signals on to power signals or regulated control signals, which are provided to the actuators 32. The actuators 32 are powered from the power signals or regulated control signals and produce the desired physical condition from the modulated actuation signals.

As another example of operation, computing device 12-$x$ is coupled to a drive-sense circuit 28 that is coupled to a sensor 30 and is coupled to a drive-sense circuit 28 that is coupled to an actuator 32. In this example, the sensor 30 and the actuator 32 are for use by the computing device 12-$x$. For example, the sensor 30 may be a piezoelectric microphone and the actuator 32 may be a piezoelectric speaker.

Figure 2:
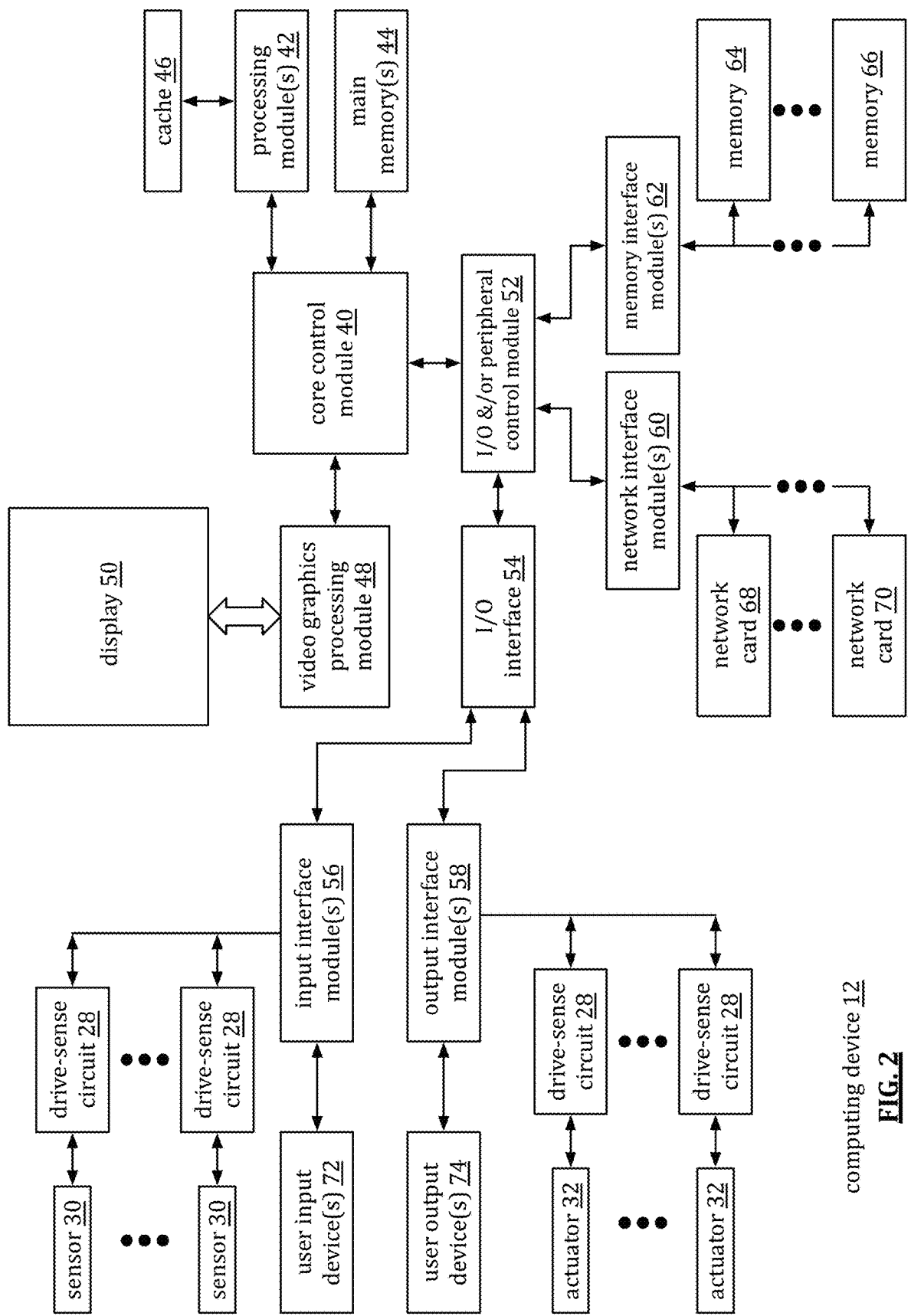
FIG. 2 is a schematic block diagram of an embodiment of a computing device.

FIG. 2 is a schematic block diagram of an embodiment of a computing device 12 (e.g., any one of 12-1 through 12-$x$). The computing device 12 includes a core control module 40, one or more processing modules 42, one or more main memories 44, cache memory 46, a video graphics processing module 48, a display 50, an Input-Output (I/O) peripheral control module 52, one or more input interface modules 56, one or more output interface modules 58, one or more network interface modules 60, and one or more memory interface modules 62. A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 (4th generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50.

FIG. 2 further illustrates sensors 30 and actuators 32 coupled to drive-sense circuits 28, which are coupled to the input interface module 56 (e.g., USB port). Alternatively, one or more of the drive-sense circuits 28 is coupled to the computing device via a wireless network card (e.g., WLAN) or a wired network card (e.g., Gigabit LAN). While not shown, the computing device 12 further includes a BIOS (Basic Input Output System) memory coupled to the core control module 40.

Figure 3:
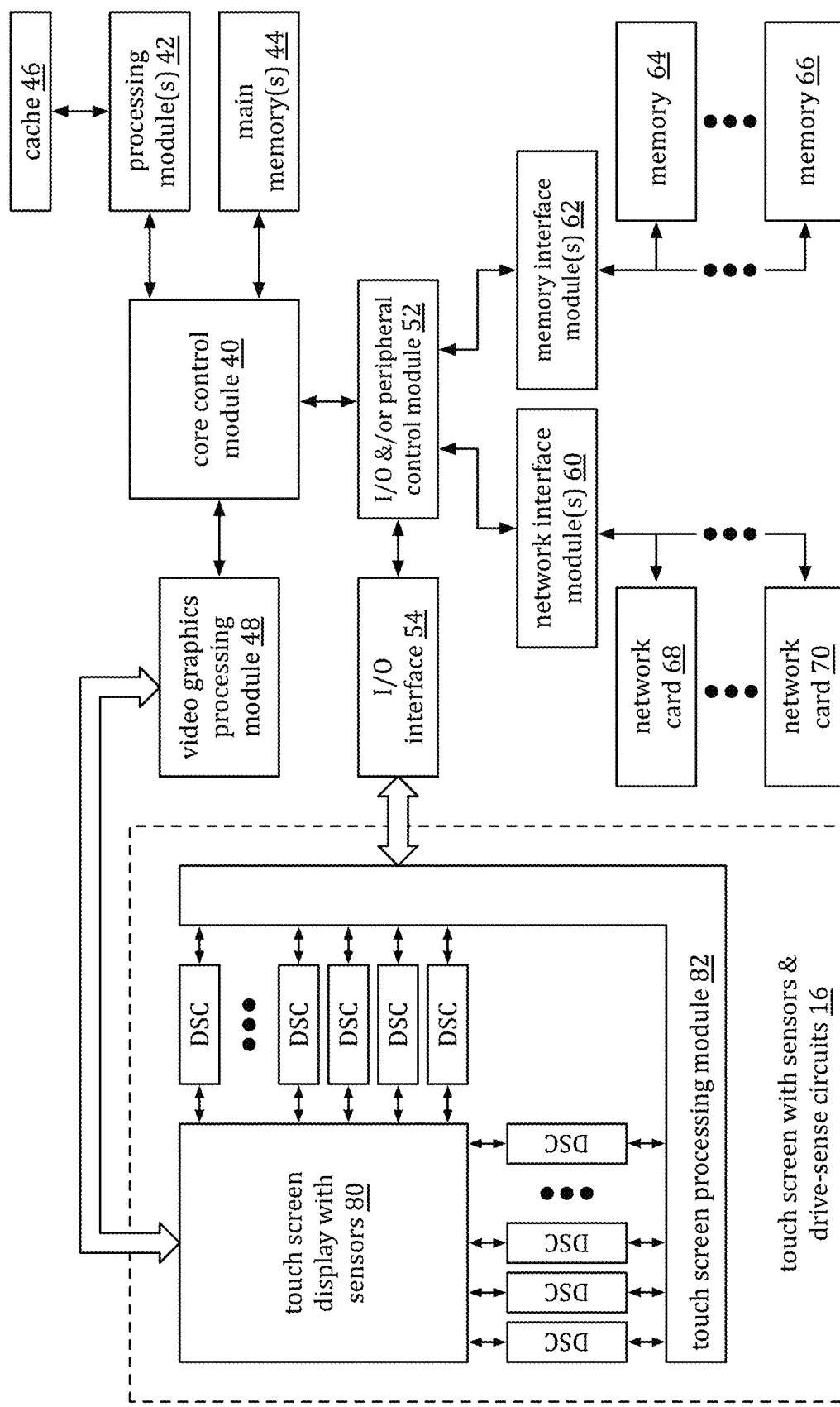
FIG. 3 is a schematic block diagram of another embodiment of a computing device.

FIG. 3 is a schematic block diagram of another embodiment of a computing device 14 that includes a core control module 40, one or more processing modules 42, one or more main memories 44, cache memory 46, a video graphics processing module 48, a touch screen 16, an Input-Output (I/O) peripheral control module 52, one or more input interface modules 56, one or more output interface modules 58, one or more network interface modules 60, and one or more memory interface modules 62. The touch screen 16 includes a touch screen display 80, a plurality of sensors 30, a plurality of drive-sense circuits (DSC), and a touch screen processing module 82.

Computing device 14 operates similarly to computing device 12 of FIG. 2 with the addition of a touch screen as an input device. The touch screen includes a plurality of sensors (e.g., electrodes, capacitor sensing cells, capacitor sensors, inductive sensor, etc.) to detect a proximal touch of the screen. For example, when one or more fingers touches the screen, capacitance of sensors proximal to the touch(es) are affected (e.g., impedance changes). The drive-sense circuits (DSC) coupled to the affected sensors detect the change and provide a representation of the change to the touch screen processing module 82, which may be a separate processing module or integrated into the processing module 42.

The touch screen processing module 82 processes the representative signals from the drive-sense circuits (DSC) to determine the location of the touch(es). This information is inputted to the processing module 42 for processing as an input. For example, a touch represents a selection of a button on screen, a scroll function, a zoom in-out function, etc.

Figure 4:
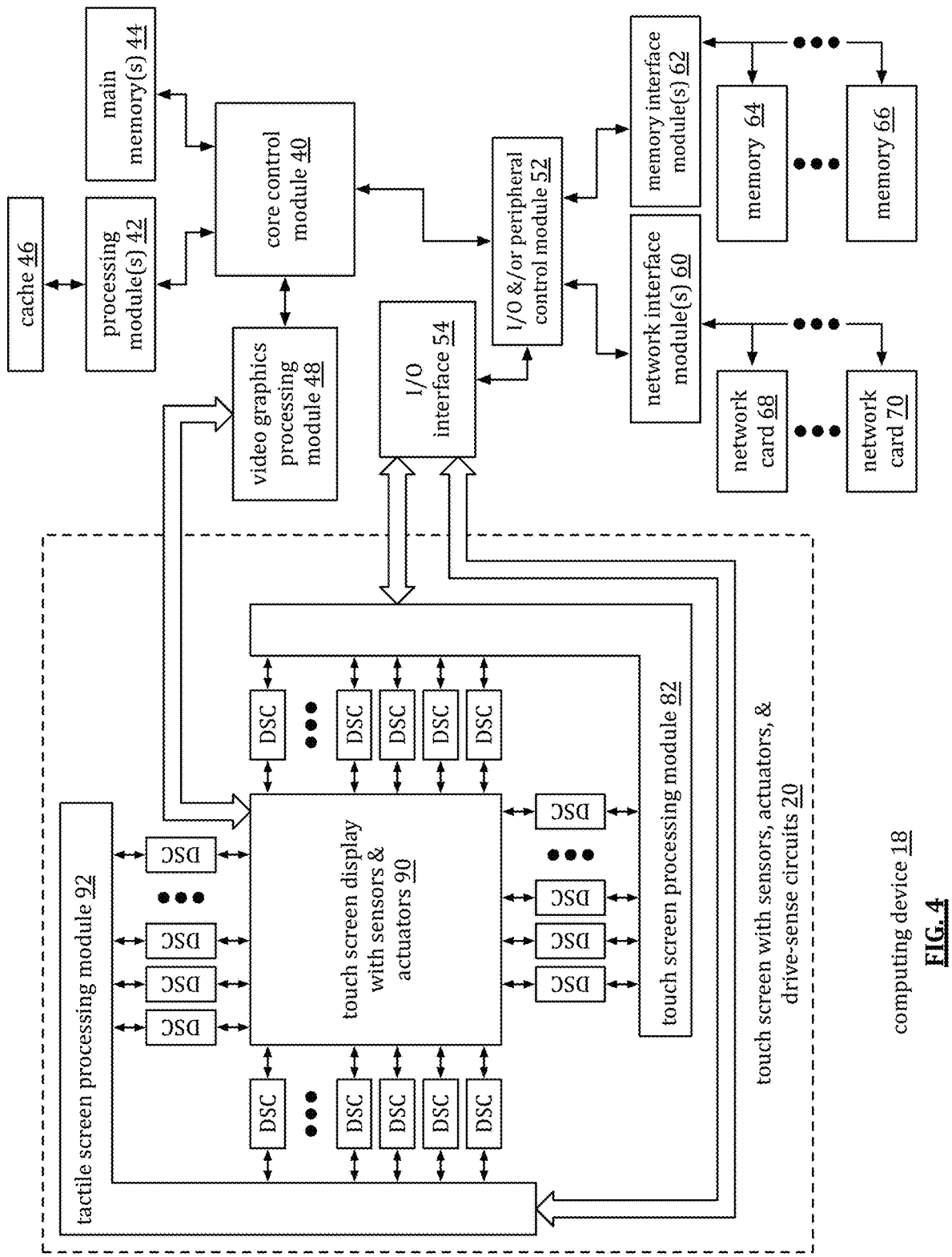
FIG. 4 is a schematic block diagram of another embodiment of a computing device.

FIG. 4 is a schematic block diagram of another embodiment of a computing device 18 that includes a core control module 40, one or more processing modules 42, one or more main memories 44, cache memory 46, a video graphics processing module 48, a touch and tactile screen 20, an Input-Output (I/O) peripheral control module 52, one or more input interface modules 56, one or more output interface modules 58, one or more network interface modules 60, and one or more memory interface modules 62. The touch and tactile screen 20 includes a touch and tactile screen display 90, a plurality of sensors 30, a plurality of actuators 32, a plurality of drive-sense circuits (DSC), a touch screen processing module 82, and a tactile screen processing module 92.

Computing device 18 operates similarly to computing device 14 of FIG. 3 with the addition of a tactile aspect to the screen 20 as an output device. The tactile portion of the screen 20 includes the plurality of actuators (e.g., piezoelectric transducers to create vibrations, solenoids to create movement, etc.) to provide a tactile feel to the screen 20. To do so, the processing module creates tactile data, which is provided to the appropriate drive-sense circuits (DSC) via the tactile screen processing module 92, which may be a stand-alone processing module or integrated into processing module 42. The drive-sense circuits (DSC) convert the tactile data into drive-actuate signals and provide them to the appropriate actuators to create the desired tactile feel on the screen 20.

Figure 5A:
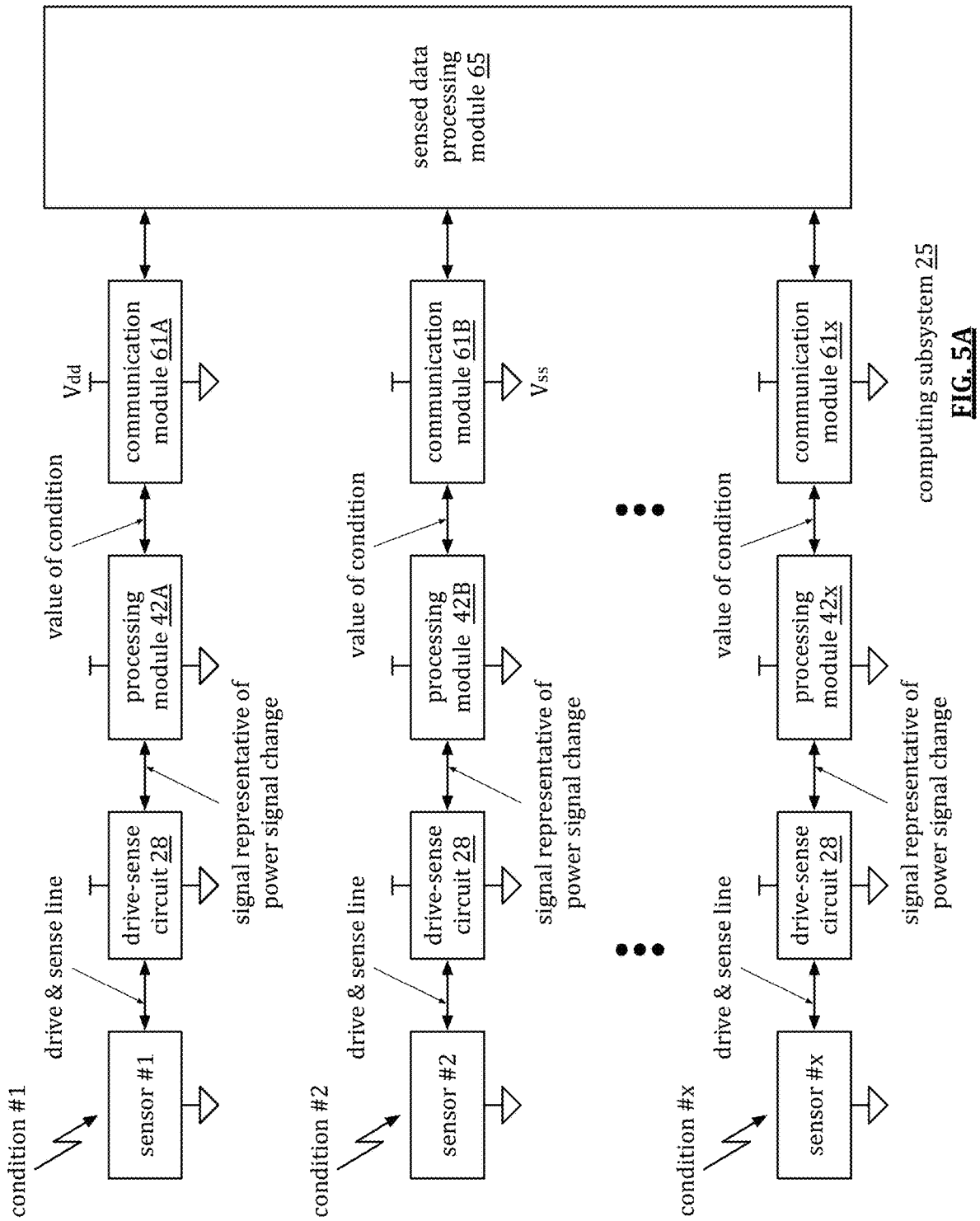
FIG. 5A is a schematic plot diagram of a computing subsystem.

FIG. 5A is a schematic plot diagram of a computing subsystem 25 that includes a sensed data processing module 65, a plurality of communication modules 61A-x, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing devices in which processing modules 42A-x reside.

A drive-sense circuit 28 (or multiple drive-sense circuits), a processing module (e.g., 41A), and a communication module (e.g., 61A) are within a common computing device. Each grouping of a drive-sense circuit(s), processing module, and communication module is in a separate computing device. A communication module 61A-x is constructed in accordance with one or more wired communication protocol and/or one or more wireless communication protocols that is/are in accordance with the one or more of the Open System Interconnection (OSI) model, the Transmission Control Protocol/Internet Protocol (TCP/IP) model, and other communication protocol module.

In an example of operation, a processing module (e.g., 42A) provides a control signal to its corresponding drive-sense circuit 28. The processing module 42 A may generate the control signal, receive it from the sensed data processing module 65, or receive an indication from the sensed data processing module 65 to generate the control signal. The control signal enables the drive-sense circuit 28 to provide a drive signal to its corresponding sensor. The control signal may further include a reference signal having one or more frequency components to facilitate creation of the drive signal and/or interpreting a sensed signal received from the sensor.

Based on the control signal, the drive-sense circuit 28 provides the drive signal to its corresponding sensor (e.g., 1) on a drive & sense line. While receiving the drive signal (e.g., a power signal, a regulated source signal, etc.), the sensor senses a physical condition 1-x (e.g., acoustic waves, a biological condition, a chemical condition, an electric condition, a magnetic condition, an optical condition, a thermal condition, and/or a mechanical condition). As a result of the physical condition, an electrical characteristic (e.g., impedance, voltage, current, capacitance, inductance, resistance, reactance, etc.) of the sensor changes, which affects the drive signal. Note that if the sensor is an optical sensor, it converts a sensed optical condition into an electrical characteristic.

The drive-sense circuit 28 detects the effect on the drive signal via the drive & sense line and processes the affect to produce a signal representative of power change, which may be an analog or digital signal. The processing module 42A receives the signal representative of power change, interprets it, and generates a value representing the sensed physical condition. For example, if the sensor is sensing pressure, the value representing the sensed physical condition is a measure of pressure (e.g., x PSI (pounds per square inch)).

In accordance with a sensed data process function (e.g., algorithm, application, etc.), the sensed data processing module 65 gathers the values representing the sensed physical conditions from the processing modules. Since the sensors 1-x may be the same type of sensor (e.g., a pressure sensor), may each be different sensors, or a combination thereof, the sensed physical conditions may be the same, may each be different, or a combination thereof. The sensed data processing module 65 processes the gathered values to produce one or more desired results. For example, if the computing subsystem 25 is monitoring pressure along a pipeline, the processing of the gathered values indicates that the pressures are all within normal limits or that one or more of the sensed pressures is not within normal limits.

As another example, if the computing subsystem 25 is used in a manufacturing facility, the sensors are sensing a variety of physical conditions, such as acoustic waves (e.g., for sound proofing, sound generation, ultrasound monitoring, etc.), a biological condition (e.g., a bacterial contamination, etc.) a chemical condition (e.g., composition, gas concentration, etc.), an electric condition (e.g., current levels, voltage levels, electro-magnetic interference, etc.), a magnetic condition (e.g., induced current, magnetic field strength, magnetic field orientation, etc.), an optical condition (e.g., ambient light, infrared, etc.), a thermal condition (e.g., temperature, etc.), and/or a mechanical condition (e.g., physical position, force, pressure, acceleration, etc.).

The computing subsystem 25 may further include one or more actuators in place of one or more of the sensors and/or in addition to the sensors. When the computing subsystem 25 includes an actuator, the corresponding processing module provides an actuation control signal to the corresponding drive-sense circuit 28. The actuation control signal enables the drive-sense circuit 28 to provide a drive signal to the actuator via a drive & actuate line (e.g., similar to the drive & sense line, but for the actuator). The drive signal includes one or more frequency components and/or amplitude components to facilitate a desired actuation of the actuator.

In addition, the computing subsystem 25 may include an actuator and sensor working in concert. For example, the sensor is sensing the physical condition of the actuator. In this example, a drive-sense circuit provides a drive signal to the actuator and another drive sense signal provides the same drive signal, or a scaled version of it, to the sensor. This allows the sensor to provide near immediate and continuous sensing of the actuator's physical condition. This further allows for the sensor to operate at a first frequency and the actuator to operate at a second frequency.

In an embodiment, the computing subsystem is a stand-alone system for a wide variety of applications (e.g., manufacturing, pipelines, testing, monitoring, security, etc.). In another embodiment, the computing subsystem 25 is one subsystem of a plurality of subsystems forming a larger system. For example, different subsystems are employed based on geographic location. As a specific example, the computing subsystem 25 is deployed in one section of a factory and another computing subsystem is deployed in another part of the factory. As another example, different subsystems are employed based function of the subsystems. As a specific example, one subsystem monitors a city's traffic light operation and another subsystem monitors the city's sewage treatment plants.

Regardless of the use and/or deployment of the computing system, the physical conditions it is sensing, and/or the physical conditions it is actuating, each sensor and each actuator (if included) is driven and sensed by a single line as opposed to separate drive and sense lines. This provides many advantages including, but not limited to, lower power requirements, better ability to drive high impedance sensors, lower line to line interference, and/or concurrent sensing functions.

FIG. 5B is a schematic block diagram of another embodiment of a computing subsystem 25 that includes a sensed data processing module 65, a communication module 61, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing device, devices, in which processing modules 42A-x reside.

In an embodiment, the drive-sense circuits 28, the processing modules, and the communication module are within a common computing device. For example, the computing device includes a central processing unit that includes a plurality of processing modules. The functionality and operation of the sensed data processing module 65, the communication module 61, the processing modules 42A-x, the drive sense circuits 28, and the sensors 1-x are as discussed with reference to FIG. 5A.

FIG. 5C is a schematic block diagram of another embodiment of a computing subsystem 25 that includes a sensed data processing module 65, a communication module 61, a processing module 42, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing device in which the processing module 42 resides.

In an embodiment, the drive-sense circuits 28, the processing module, and the communication module are within a common computing device. The functionality and operation of the sensed data processing module 65, the communication module 61, the processing module 42, the drive sense circuits 28, and the sensors 1-x are as discussed with reference to FIG. 5A.

Figure 5D:
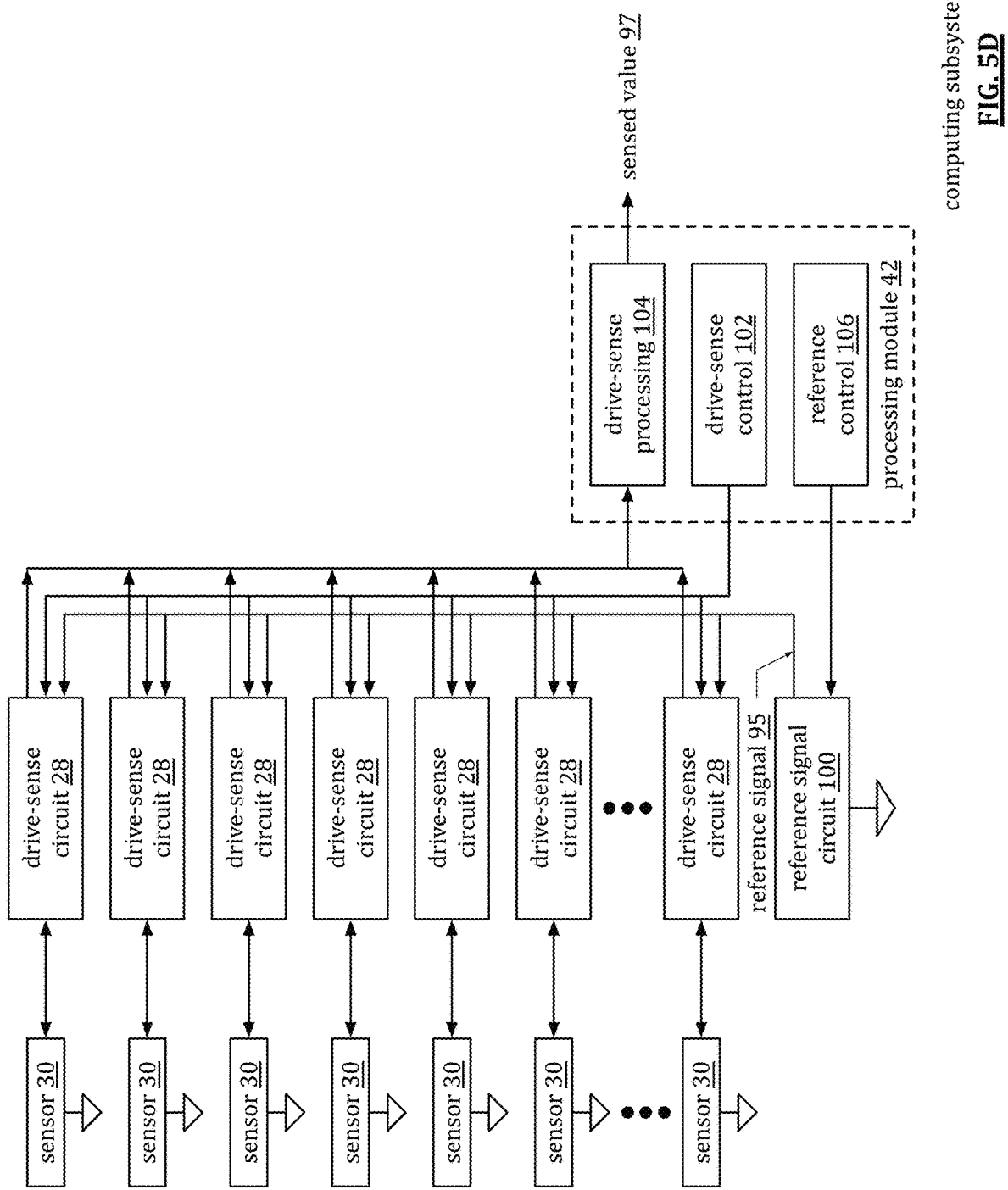
FIG. 5D is a schematic block diagram of another embodiment of a computing subsystem.

FIG. 5D is a schematic block diagram of another embodiment of a computing subsystem 25 that includes a processing module 42, a reference signal circuit 100, a plurality of drive sense circuits 28, and a plurality of sensors 30. The processing module 42 includes a drive-sense processing block 104, a drive-sense control block 102, and a reference control block 106. Each block 102-106 of the processing module 42 may be implemented via separate modules of the processing module, may be a combination of software and hardware within the processing module, and/or may be field programmable modules within the processing module 42.

In an example of operation, the drive-sense control block 104 generates one or more control signals to activate one or more of the drive-sense circuits 28. For example, the drive-sense control block 102 generates a control signal that enables of the drive-sense circuits 28 for a given period of time (e.g., 1 second, 1 minute, etc.). As another example, the drive-sense control block 102 generates control signals to sequentially enable the drive-sense circuits 28. As yet another example, the drive-sense control block 102 generates a series of control signals to periodically enable the drive-sense circuits 28 (e.g., enabled once every second, every minute, every hour, etc.).

Continuing with the example of operation, the reference control block 106 generates a reference control signal that it provides to the reference signal circuit 100. The reference signal circuit 100 generates, in accordance with the control signal, one or more reference signals for the drive-sense circuits 28. For example, the control signal is an enable signal, which, in response, the reference signal circuit 100 generates a pre-programmed reference signal that it provides to the drive-sense circuits 28. In another example, the reference signal circuit 100 generates a unique reference signal for each of the drive-sense circuits 28. In yet another example, the reference signal circuit 100 generates a first unique reference signal for each of the drive-sense circuits 28 in a first group and generates a second unique reference signal for each of the drive-sense circuits 28 in a second group.

The reference signal circuit 100 may be implemented in a variety of ways. For example, the reference signal circuit 100 includes a DC (direct current) voltage generator, an AC voltage generator, and a voltage combining circuit. The DC voltage generator generates a DC voltage at a first level and the AC voltage generator generates an AC voltage at a second level, which is less than or equal to the first level. The voltage combining circuit combines the DC and AC voltages to produce the reference signal. As examples, the reference signal circuit 100 generates a reference signal similar to the signals shown in FIG. 7, which will be subsequently discussed.

As another example, the reference signal circuit 100 includes a DC current generator, an AC current generator, and a current combining circuit. The DC current generator generates a DC current a first current level and the AC current generator generates an AC current at a second current level, which is less than or equal to the first current level. The current combining circuit combines the DC and AC currents to produce the reference signal.

Returning to the example of operation, the reference signal circuit 100 provides the reference signal, or signals, to the drive-sense circuits 28. When a drive-sense circuit 28 is enabled via a control signal from the drive sense control block 102, it provides a drive signal to its corresponding sensor 30. As a result of a physical condition, an electrical characteristic of the sensor is changed, which affects the drive signal. Based on the detected effect on the drive signal and the reference signal, the drive-sense circuit 28 generates a signal representative of the effect on the drive signal.

The drive-sense circuit provides the signal representative of the effect on the drive signal to the drive-sense processing block 104. The drive-sense processing block 104 processes the representative signal to produce a sensed value 97 of the physical condition (e.g., a digital value that represents a specific temperature, a specific pressure level, etc.). The processing module 42 provides the sensed value 97 to another application running on the computing device, to another computing device, and/or to a server 22.

Figure 5E:
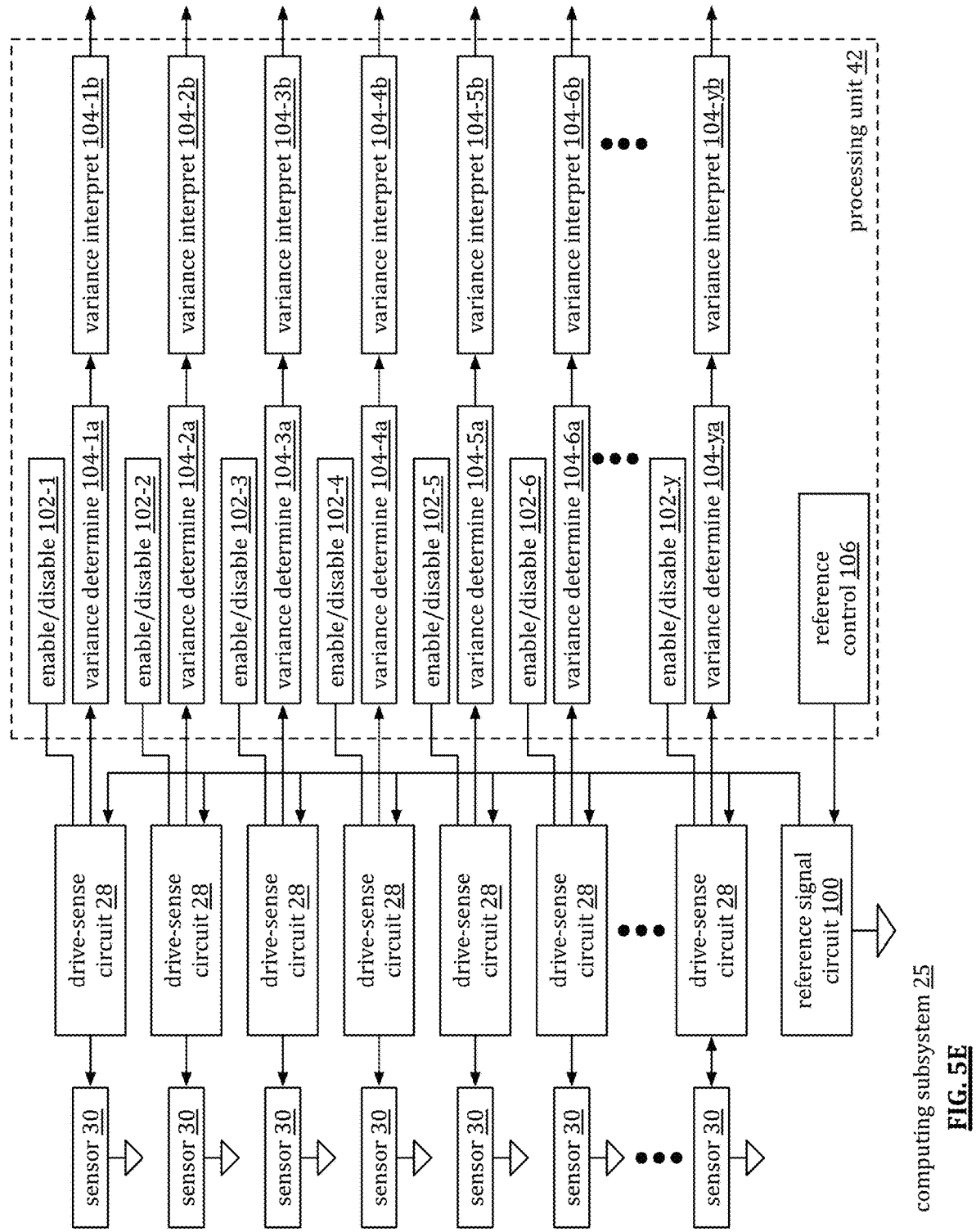
FIG. 5E is a schematic block diagram of another embodiment of a computing subsystem.

FIG. 5E is a schematic block diagram of another embodiment of a computing subsystem 25 that includes a processing module 42, a plurality of drive sense circuits 28, and a plurality of sensors 30. This embodiment is similar to the embodiment of FIG. 5D with the functionality of the drive-sense processing block 104, a drive-sense control block 102, and a reference control block 106 shown in greater detail. For instance, the drive-sense control block 102 includes individual enable/disable blocks 102-1 through 102-y. An enable/disable block functions to enable or disable a corresponding drive-sense circuit in a manner as discussed above with reference to FIG. 5D.

The drive-sense processing block 104 includes variance determining modules 104-1a through y and variance interpreting modules 104-2a through y. For example, variance determining module 104-1a receives, from the corresponding drive-sense circuit 28, a signal representative of a physical condition sensed by a sensor. The variance determining module 104-1a functions to determine a difference from the signal representing the sensed physical condition with a signal representing a known, or reference, physical condition. The variance interpreting module 104-1b interprets the difference to determine a specific value for the sensed physical condition.

As a specific example, the variance determining module 104-1a receives a digital signal of 1001 0110 (150 in decimal) that is representative of a sensed physical condition (e.g., temperature) sensed by a sensor from the corresponding drive-sense circuit 28. With 8-bits, there are 28 (256) possible signals representing the sensed physical condition. Assume that the units for temperature is Celsius and a digital value of 0100 0000 (64 in decimal) represents the known value for 25 degree Celsius. The variance determining module 104-b1 determines the difference between the digital signal representing the sensed value (e.g., 1001 0110, 150 in decimal) and the known signal value of (e.g., 0100 0000, 64 in decimal), which is 0011 0000 (86 in decimal). The variance determining module 104-b1 then determines the sensed value based on the difference and the known value. In this example, the sensed value equals 25+86*(100/256) =25+33.6=58.6 degrees Celsius.

Figure 6A:
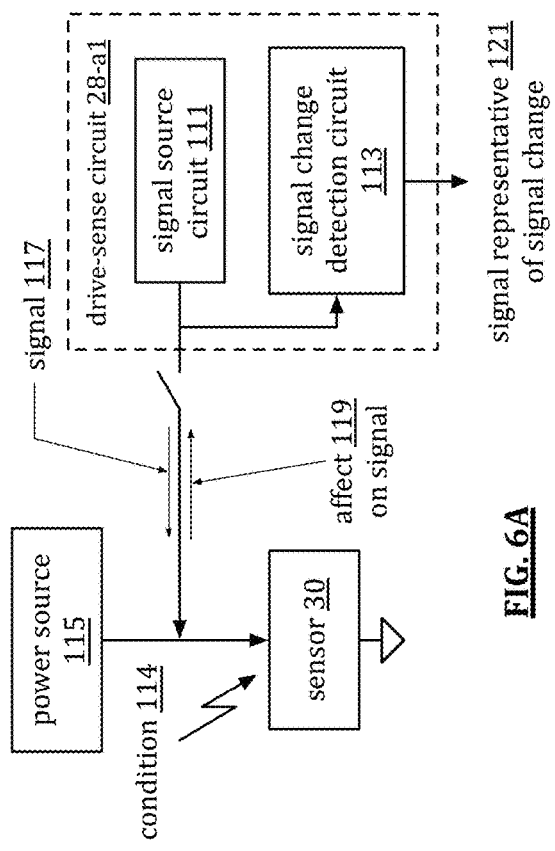
FIG. 6A is a schematic block diagram of another embodiment of a drive sense circuit.
Figure 6:
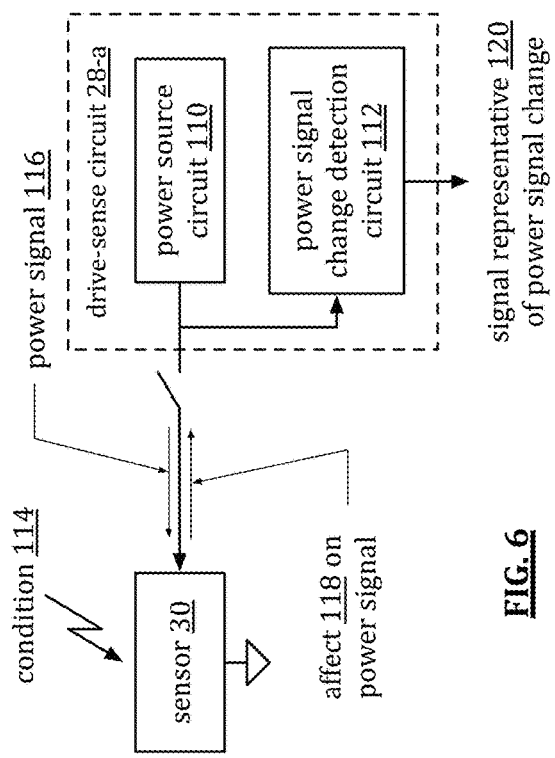
FIG. 6 is a schematic block diagram of an embodiment of a drive sense circuit.

FIG. 6 is a schematic block diagram of a drive center circuit 28-a coupled to a sensor 30. The drive sense-sense circuit 28 includes a power source circuit 110 and a power signal change detection circuit 112. The sensor 30 includes one or more transducers that have varying electrical characteristics (e.g., capacitance, inductance, impedance, current, voltage, etc.) based on varying physical conditions 114 (e.g., pressure, temperature, biological, chemical, etc.), or vice versa (e.g., an actuator).

The power source circuit 110 is operably coupled to the sensor 30 and, when enabled (e.g., from a control signal from the processing module 42, power is applied, a switch is closed, a reference signal is received, etc.) provides a power signal 116 to the sensor 30. The power source circuit 110 may be a voltage supply circuit (e.g., a battery, a linear regulator, an unregulated DC-to-DC converter, etc.) to produce a voltage-based power signal, a current supply circuit (e.g., a current source circuit, a current mirror circuit, etc.) to produce a current-based power signal, or a circuit that provides a desired power level to the sensor and substantially matches impedance of the sensor. The power source circuit 110 generates the power signal 116 to include a DC (direct current) component and/or an oscillating component.

When receiving the power signal 116 and when exposed to a condition 114, an electrical characteristic of the sensor affects 118 the power signal. When the power signal change detection circuit 112 is enabled, it detects the affect 118 on the power signal as a result of the electrical characteristic of the sensor. For example, the power signal is a 1.5 voltage signal, and, under a first condition, the sensor draws 1 milliamp of current, which corresponds to an impedance of 1.5 K Ohms. Under a second condition, the power signal remains at 1.5 volts and the current increases to 1.5 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

As another example, the power signal is a 1.5 voltage signal, and, under a first condition, the sensor draws 1 milliamp of current, which corresponds to an impedance of 1.5 K Ohms. Under a second condition, the power signal drops to 1.3 volts and the current increases to 1.3 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

Figure 7:
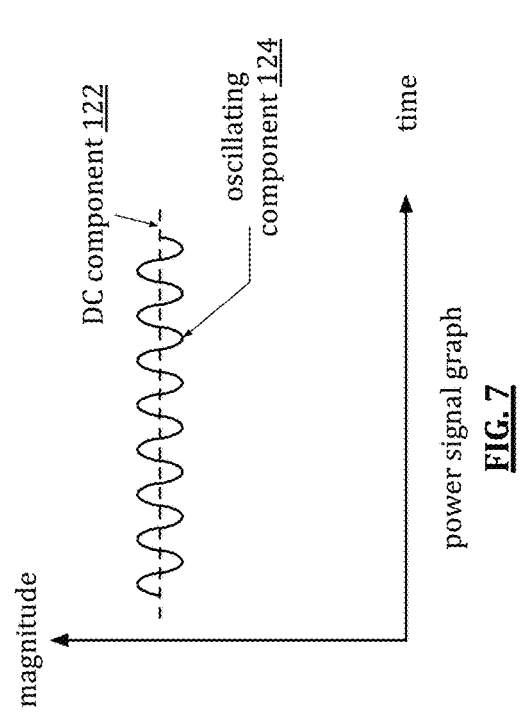
FIG. 7 is an example of a power signal graph.

The power signal 116 includes a DC component 122 and/or an oscillating component 124 as shown in FIG. 7. The oscillating component 124 includes a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component). Note that the power signal is shown without affect from the sensor as the result of a condition or changing condition.

In an embodiment, power generating circuit 110 varies frequency of the oscillating component 124 of the power signal 116 so that it can be tuned to the impedance of the sensor and/or to be off-set in frequency from other power signals in a system. For example, a capacitance sensor's impedance decreases with frequency. As such, if the frequency of the oscillating component is too high with respect to the capacitance, the capacitor looks like a short and variances in capacitances will be missed. Similarly, if the frequency of the oscillating component is too low with respect to the capacitance, the capacitor looks like an open and variances in capacitances will be missed.

In an embodiment, the power generating circuit 110 varies magnitude of the DC component 122 and/or the oscillating component 124 to improve resolution of sensing and/or to adjust power consumption of sensing. In addition, the power generating circuit 110 generates the drive signal 110 such that the magnitude of the oscillating component 124 is less than magnitude of the DC component 122.

FIG. 6A is a schematic block diagram of a drive center circuit 28-al coupled to a sensor 30. The drive sense-sense circuit 28-al includes a signal source circuit 111, a signal change detection circuit 113, and a power source 115. The power source 115 (e.g., a battery, a power supply, a current source, etc.) generates a voltage and/or current that is combined with a signal 117, which is produced by the signal source circuit 111. The combined signal is supplied to the sensor 30.

The signal source circuit 111 may be a voltage supply circuit (e.g., a battery, a linear regulator, an unregulated DC-to-DC converter, etc.) to produce a voltage-based signal 117, a current supply circuit (e.g., a current source circuit, a current mirror circuit, etc.) to produce a current-based signal 117, or a circuit that provide a desired power level to the sensor and substantially matches impedance of the sensor. The signal source circuit 111 generates the signal 117 to include a DC (direct current) component and/or an oscillating component.

When receiving the combined signal (e.g., signal 117 and power from the power source) and when exposed to a condition 114, an electrical characteristic of the sensor affects 119 the signal. When the signal change detection circuit 113 is enabled, it detects the affect 119 on the signal as a result of the electrical characteristic of the sensor.

Figure 8:
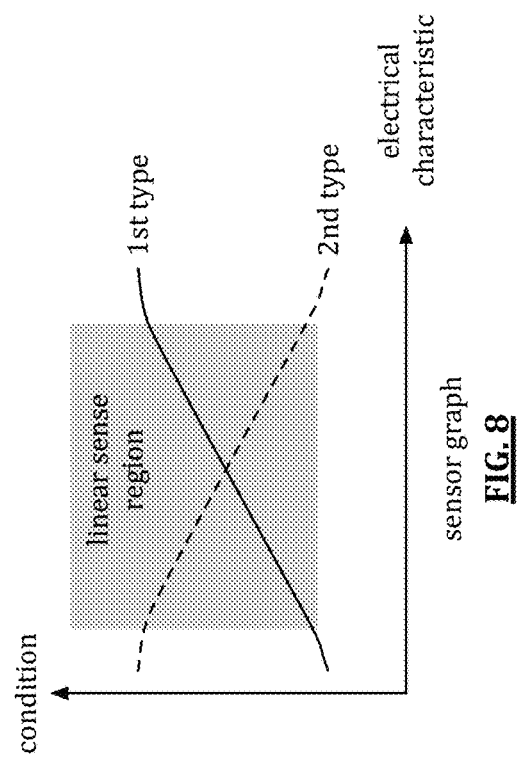
FIG. 8 is an example of a sensor graph.

FIG. 8 is an example of a sensor graph that plots an electrical characteristic versus a condition. The sensor has a substantially linear region in which an incremental change in a condition produces a corresponding incremental change in the electrical characteristic. The graph shows two types of electrical characteristics: one that increases as the condition increases and the other that decreases and the condition increases. As an example of the first type, impedance of a temperature sensor increases and the temperature increases. As an example of a second type, a capacitance touch sensor decreases in capacitance as a touch is sensed.

Figure 9:
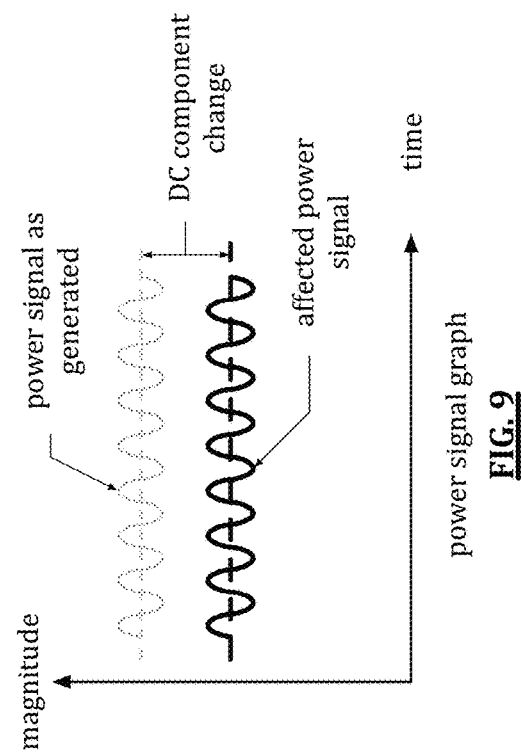
FIG. 9 is a schematic block diagram of another example of a power signal.

FIG. 9 is a schematic block diagram of another example of a power signal graph in which the electrical characteristic or change in electrical characteristic of the sensor is affecting the power signal. In this example, the effect of the electrical characteristic or change in electrical characteristic of the sensor reduced the DC component but had little to no effect on the oscillating component. For example, the electrical characteristic is resistance. In this example, the resistance or change in resistance of the sensor decreased the power signal, inferring an increase in resistance for a relatively constant current.

Figure 10:
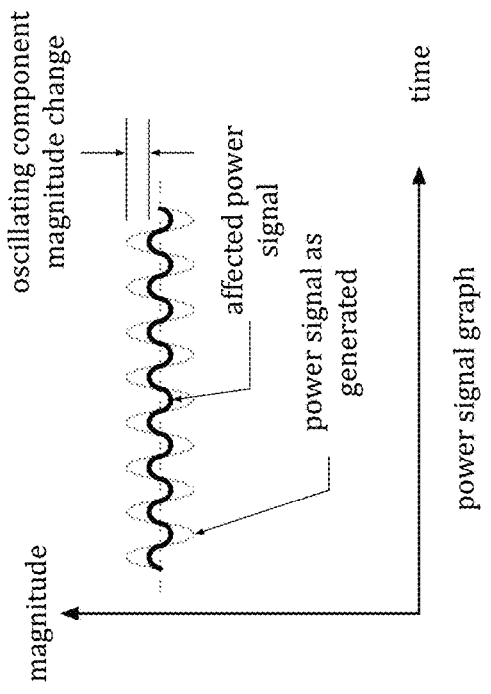
FIG. 10 is a schematic block diagram of another example of a power signal graph.

FIG. 10 is a schematic block diagram of another example of a power signal graph in which the electrical characteristic or change in electrical characteristic of the sensor is affecting the power signal. In this example, the effect of the electrical characteristic or change in electrical characteristic of the sensor reduced magnitude of the oscillating component but had little to no effect on the DC component. For example, the electrical characteristic is impedance of a capacitor and/or an inductor. In this example, the impedance or change in impedance of the sensor decreased the magnitude of the oscillating signal component, inferring an increase in impedance for a relatively constant current.

Figure 11A:
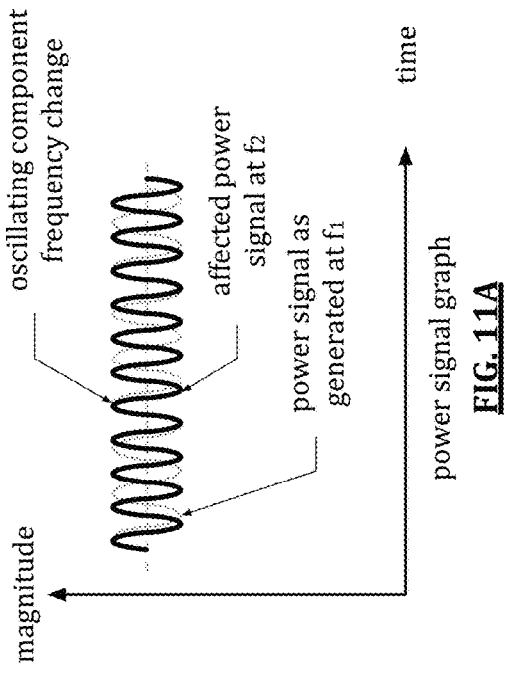
FIG. 11A is a schematic block diagram of another example of a power signal graph.
Figure 11:
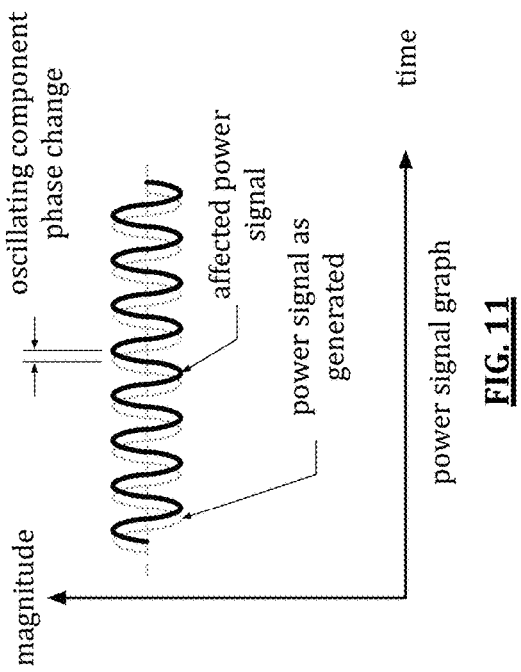
FIG. 11 is a schematic block diagram of another example of a power signal graph.

FIG. 11 is a schematic block diagram of another example of a power signal graph in which the electrical characteristic or change in electrical characteristic of the sensor is affecting the power signal. In this example, the effect of the electrical characteristic or change in electrical characteristic of the sensor shifted phase of the oscillating component but had little to no effect on the magnitude of the power signal. For example, the electrical characteristic is reactance of a capacitor and/or an inductor. In this example, the reactance or change in reactance of the sensor shifted phase of the oscillating signal component, inferring an increase in reactance (e.g., sensor is functioning as an integrator or phase shift circuit).

FIG. 11A is a schematic block diagram of another example of a power signal graph in which the electrical characteristic or change in electrical characteristic of the sensor is affecting the power signal. In this example, the effect of the electrical characteristic or change in electrical characteristic of the sensor changes the frequency of the oscillating component but had little to no effect on the DC component. For example, the sensor includes two transducers that oscillate at different frequencies. The first transducer receives the power signal at a frequency of f1 and converts it into a first physical condition. The second transducer is stimulated by the first physical condition to create an electrical signal at a different frequency f2. In this example, the first and second transducers of the sensor change the frequency of the oscillating signal component, which allows for more granular sensing and/or a broader range of sensing.

Figure 12:
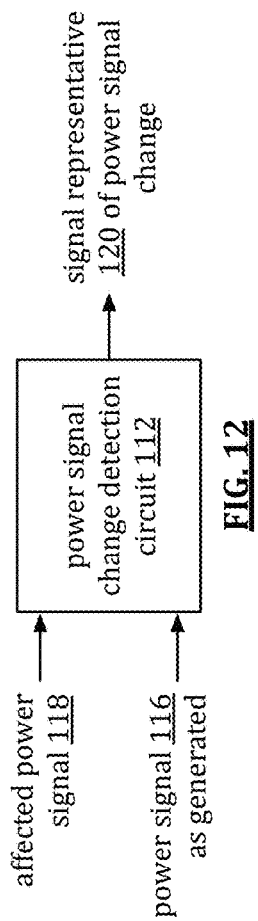
FIG. 12 is a schematic block diagram of an embodiment of a power signal change detection circuit.

FIG. 12 is a schematic block diagram of an embodiment of a power signal change detection circuit 112 receiving the affected power signal 118 and the power signal 116 as generated to produce, therefrom, the signal representative 120 of the power signal change. The affect 118 on the power signal is the result of an electrical characteristic and/or change in the electrical characteristic of a sensor; a few examples of the affects are shown in FIGS. 8-11A.

In an embodiment, the power signal change detection circuit 112 detects a change in the DC component 122 and/or the oscillating component 124 of the power signal 116. The power signal change detection circuit 112 then generates the signal representative 120 of the change to the power signal based on the change to the power signal. For example, the change to the power signal results from the impedance of the sensor and/or a change in impedance of the sensor. The representative signal 120 is reflective of the change in the power signal and/or in the change in the sensor's impedance.

In an embodiment, the power signal change detection circuit 112 is operable to detect a change to the oscillating component at a frequency, which may be a phase shift, frequency change, and/or change in magnitude of the oscillating component. The power signal change detection circuit 112 is also operable to generate the signal representative of the change to the power signal based on the change to the oscillating component at the frequency. The power signal change detection circuit 112 is further operable to provide feedback to the power source circuit 110 regarding the oscillating component. The feedback allows the power source circuit 110 to regulate the oscillating component at the desired frequency, phase, and/or magnitude.

Figure 13:
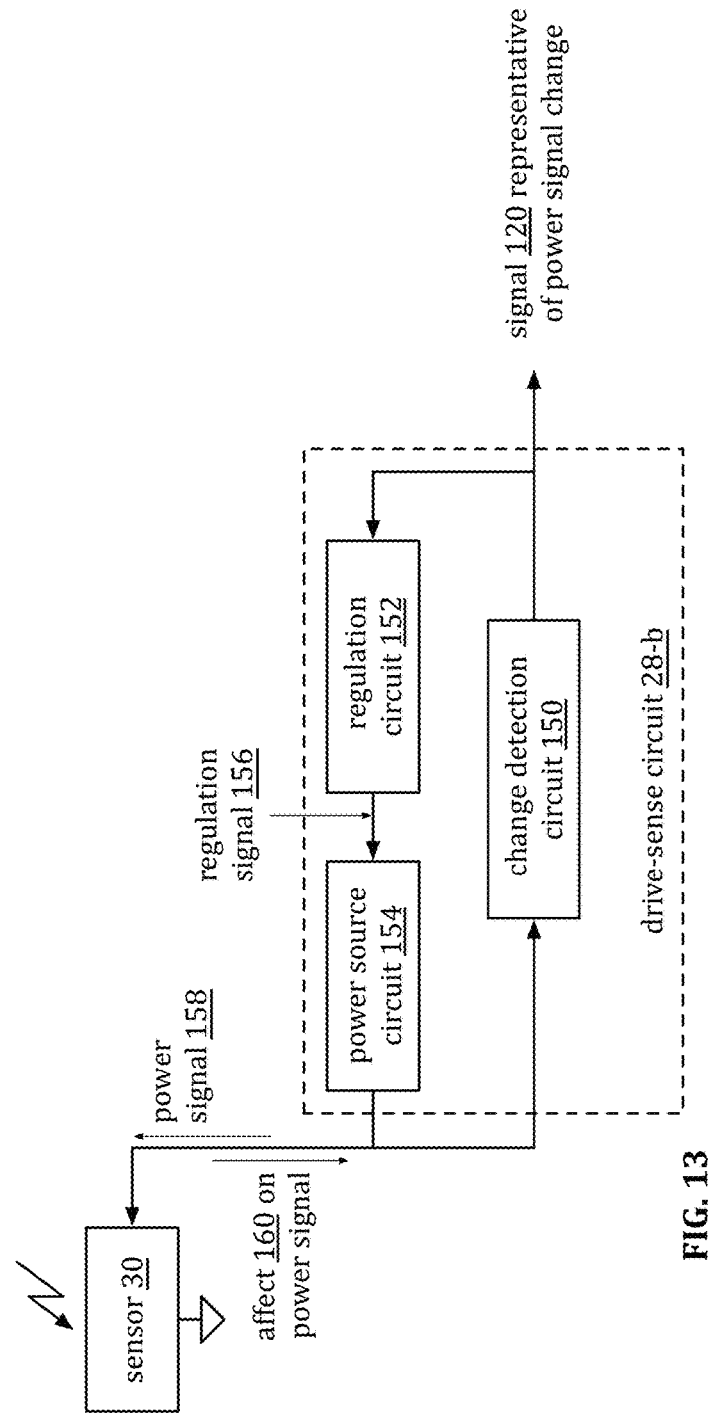
FIG. 13 is a schematic block diagram of another embodiment of a drive sense circuit.

FIG. 13 is a schematic block diagram of another embodiment of a drive sense circuit 28-*b* includes a change detection circuit 150, a regulation circuit 152, and a power source circuit 154. The drive-sense circuit 28-*b* is coupled to the sensor 30, which includes a transducer that has varying electrical characteristics (e.g., capacitance, inductance, impedance, current, voltage, etc.) based on varying physical conditions 114 (e.g., pressure, temperature, biological, chemical, etc.).

The power source circuit 154 is operably coupled to the sensor 30 and, when enabled (e.g., from a control signal from the processing module 42, power is applied, a switch is closed, a reference signal is received, etc.) provides a power signal 158 to the sensor 30. The power source circuit 154 may be a voltage supply circuit (e.g., a battery, a linear regulator, an unregulated DC-to-DC converter, etc.) to produce a voltage-based power signal or a current supply circuit (e.g., a current source circuit, a current mirror circuit, etc.) to produce a current-based power signal. The power source circuit 154 generates the power signal 158 to include a DC (direct current) component and an oscillating component.

When receiving the power signal 158 and when exposed to a condition 114, an electrical characteristic of the sensor affects 160 the power signal. When the change detection circuit 150 is enabled, it detects the affect 160 on the power signal as a result of the electrical characteristic of the sensor 30. The change detection circuit 150 is further operable to generate a signal 120 that is representative of change to the power signal based on the detected effect on the power signal.

The regulation circuit 152, when its enabled, generates regulation signal 156 to regulate the DC component to a desired DC level and/or regulate the oscillating component to a desired oscillating level (e.g., magnitude, phase, and/or frequency) based on the signal 120 that is representative of the change to the power signal. The power source circuit 154 utilizes the regulation signal 156 to keep the power signal at a desired setting 158 regardless of the electrical characteristic of the sensor. In this manner, the amount of regulation is indicative of the affect the electrical characteristic had on the power signal.

In an example, the power source circuit 154 is a DC-DC converter operable to provide a regulated power signal 158 having DC and AC components. The change detection circuit 150 is a comparator and the regulation circuit 152 is a pulse width modulator to produce the regulation signal 156. The comparator compares the power signal 158, which is affected by the sensor, with a reference signal that includes DC and AC components. When the electrical characteristic is at a first level (e.g., a first impedance), the power signal is regulated to provide a voltage and current such that the power signal substantially resembles the reference signal.

When the electrical characteristic changes to a second level (e.g., a second impedance), the change detection circuit 150 detects a change in the DC and/or AC component of the power signal 158 and generates the representative signal 120, which indicates the changes. The regulation circuit 152 detects the change in the representative signal 120 and creates the regulation signal to substantially remove the effect on the power signal. The regulation of the power signal 158 may be done by regulating the magnitude of the DC and/or AC components, by adjusting the frequency of AC component, and/or by adjusting the phase of the AC component.

Figure 14A:
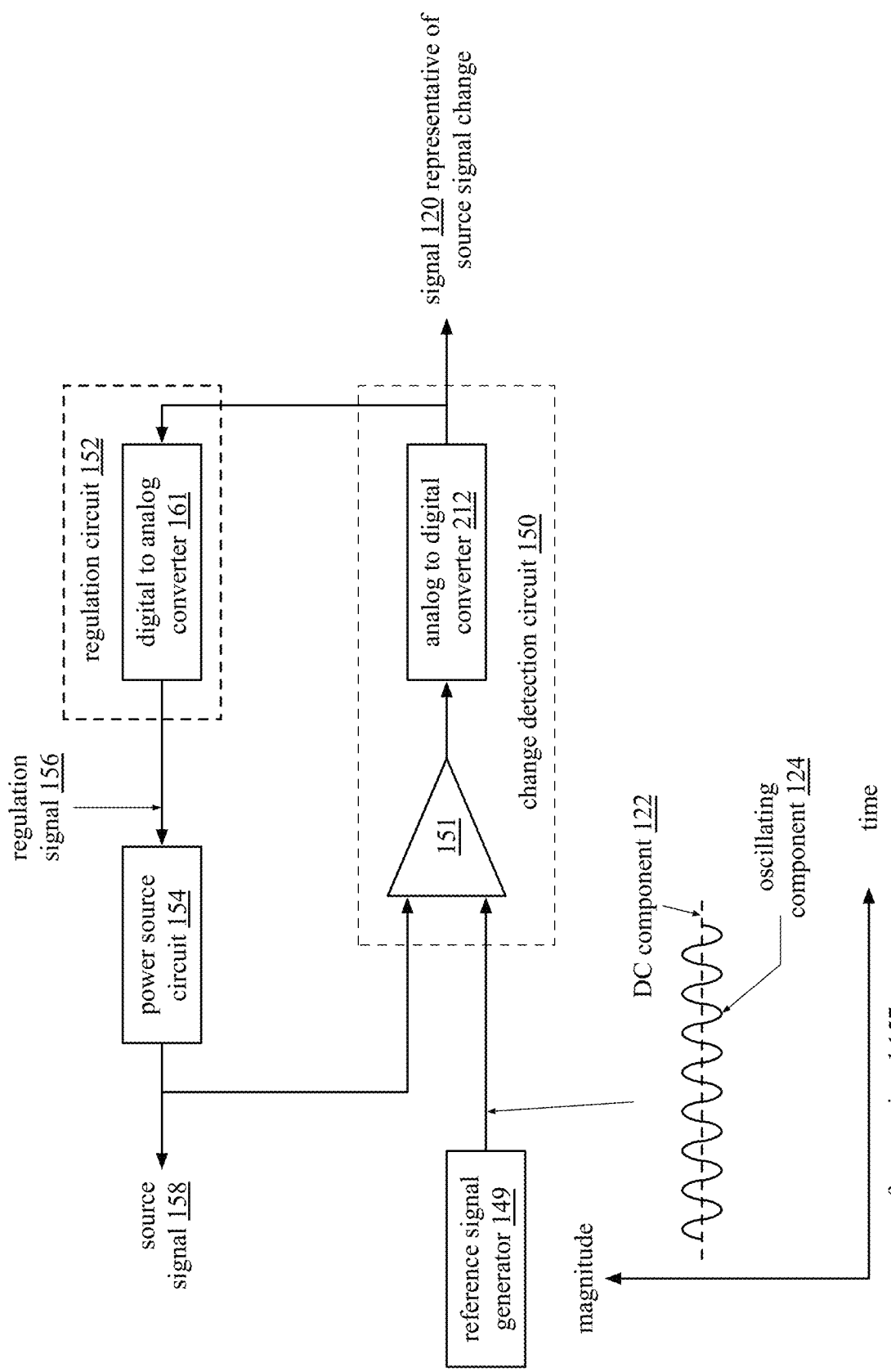
FIG. 14A is a schematic block diagram of an embodiment of a drive sense circuit with a programmable reference signal generator.

FIG. 14A is a schematic block diagram of an embodiment for providing a reference signal waveform for a drive-sense circuit. In an example, a sinusoidal waveform, such as oscillating component 124 is generated by reference signal generator 149, which is coupled to change detection circuit 150. Reference signal generator 149 can be a phase-locked loop (PLL), a crystal oscillator, a digital frequency synthesizer, and/or any other signal source that can provide a sinusoidal signal of desired frequency, phase shift, and/or magnitude.

In general, a power source circuit 154 produces a source signal 158 that is regulated to substantially match the sinusoidal reference signal 157. For example, the sinusoidal signal generated by reference signal generator 149 is useful when sensor 30 is one of a plurality of sensors sensing capacitance changes of a touch screen display. In such an environment, the use of a sinusoidal reference signal is readily generated and also does not introduce harmonics that may adversely affect the operation of the drive sense circuit, the touch screen operation of the display, and/or the display operation of the display.

The output of power source circuit 154 (source signal 158) and reference signal generator output (such as reference signal 157) are coupled to the inputs of Op-amp 151, the output of which is coupled to analog to digital converter (ADC) 212. Signal 120, which represents the source signal change, is output by ADC 212, which output is also input to regulation circuit 152 and converted by digital to analog converter (DAC) 214; the output of regulation circuit 152 is coupled to power source circuit 154 to provide regulation signal 156 to power source circuit 154. The sinusoidal signal generated by reference signal generator 149 is a non-linear signal and therefore has non-linear resolution.

Figure 14B:
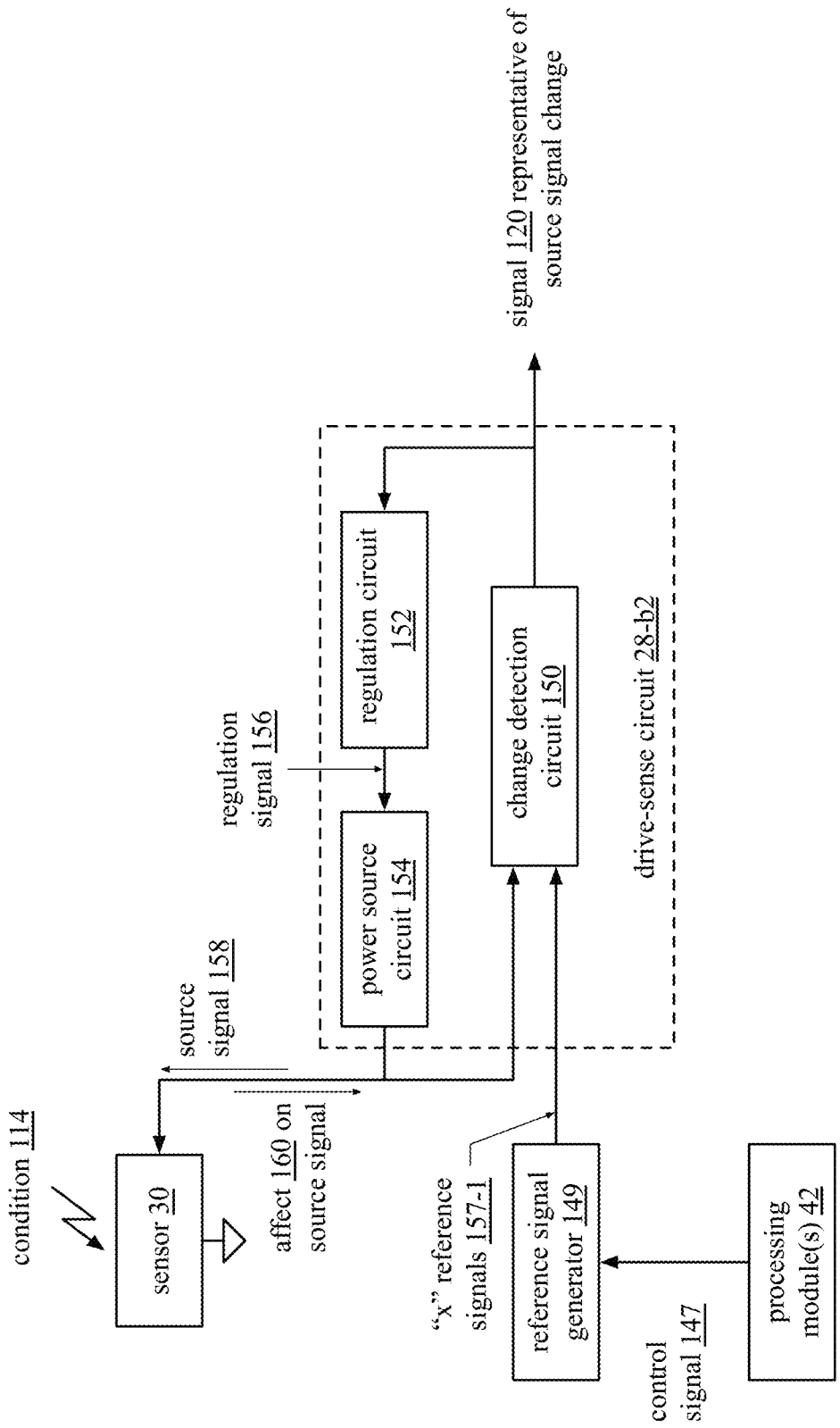
FIG. 14B is a schematic block diagram of an embodiment of a drive sense circuit connected to a programmed reference signal generator.

FIG. 14B is a schematic block diagram of an embodiment of a drive sense circuit similar to FIG. 14A, with a difference being that reference signal generator 149 produces an "x" number of reference signals 157-1 based on a control signal 147 received from processing module 42. The control signal is based on one or more of sensing objectives for sensor 30 and one or more drive sense circuit output objectives. For example, the sensing objectives include a number of sensors in a system, a type of sensing (e.g., self-capacitance, mutual capacitance) and a nature of sensing (e.g., looking for a touch or a gesture). The control signal includes information regarding an "x" number of reference signals to generate and one or more of a frequency, a phase, a magnitude, and a power level for each of the "x" number of reference signals. As such, the reference signal generator 149 generates the reference signal 157 based on the control signal. The drive-sense circuit senses an affect 160 on the source signal as a result of sensor 30 being exposed to condition 114 and produces signal 120 representative of the affect 160.

In a specific example, sensor 30 is an electrode of a touch screen. The reference signal generator 149 produces two references signals based on control signal 147, where a first reference signal oscillates at a first frequency for sensing a self-capacitance and a second reference signal oscillates at a second frequency for sensing a mutual capacitance. In this example, a touch (condition 114) on the touch screen affects the source signal by increasing the self-capacitance of the electrode. Thus, when the source signal is a regulated voltage signal, the increase in impedance changes the current in accordance with V=IZ. The drive sense circuit 28-b2 outputs signal 120 representing the affect 160 the touch had on source signal 158.

Figure 15A:
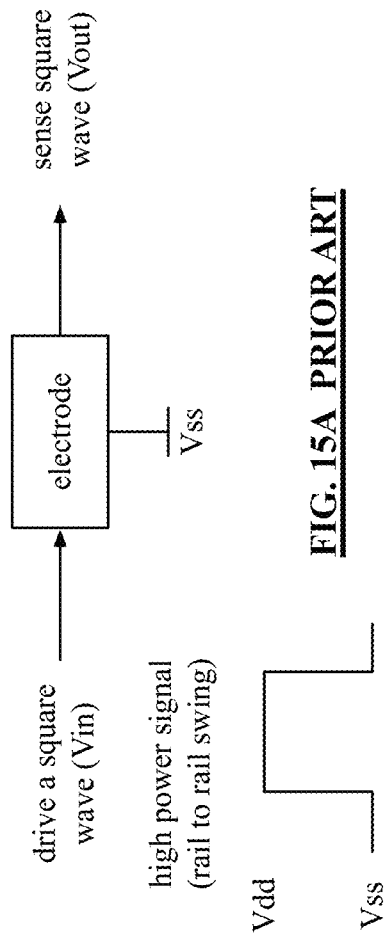
FIG. 15A is a schematic block diagram of a prior art sensing of an electrode.

FIG. 15A is a block diagram illustrating a typical prior art system that uses a high power square wave voltage signal that swings from 10-90% of the rail to rail voltage. The high power square wave voltage signal is input to the electrode, which is connected to power supply Vss. The high power square wave voltage signal is measured on the output of the electrode. One issue with this implementation is that noise is added due to the high power switching (e.g., capacitor dumping) and/or the combination of sidebands used to produce the high power square wave voltage signal. Another issue with this implementation is the high power square wave voltage signal uses substantial power as the signal swings from about 10-90% of the rail to rail voltage.

Figure 15B:
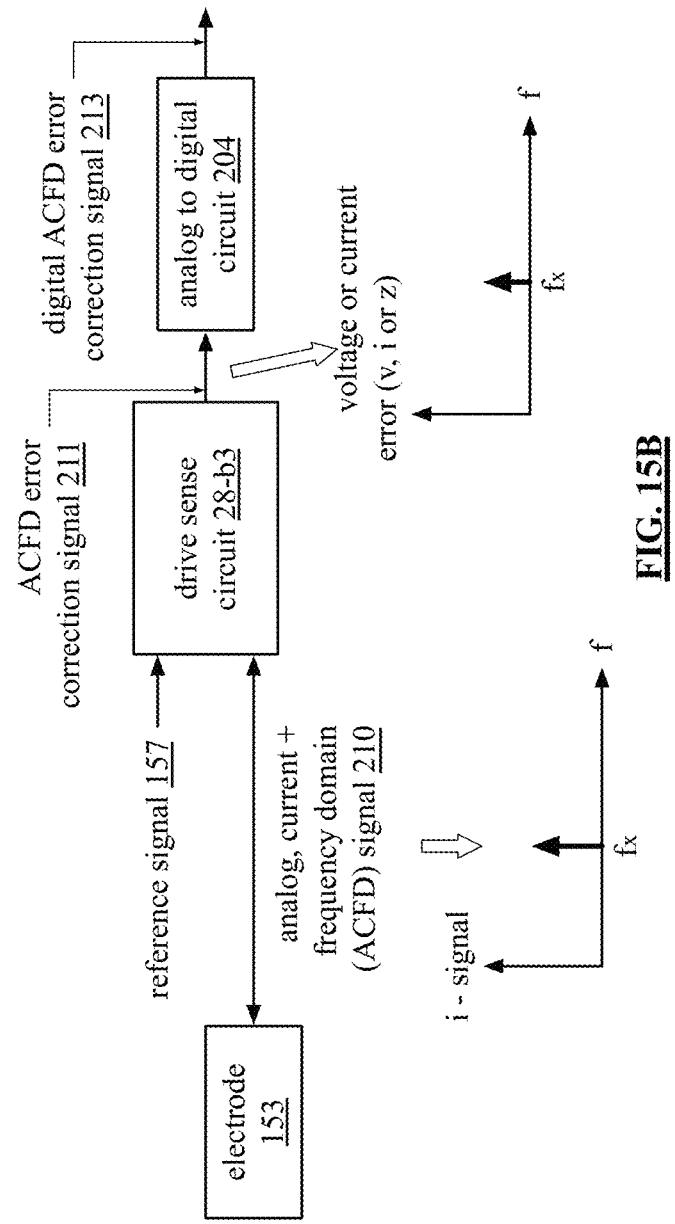
FIG. 15B is a schematic block diagram of another embodiment of a drive sense circuit sensing an electrode.

FIG. 15B is a schematic block diagram of an embodiment of a drive sense circuit 28 that is coupled to an electrode 153. The drive sense circuit 28-b3 may be implemented by another drive sense circuit discussed in one or more other figures (e.g., drive sense circuit 28-a, 28-b, 28-c, etc.). In an example, the drive sense circuit 28-b3 is operably coupled to the electrode 153 via a single line.

In general, the drive sense circuit 28-b3 drives a low power analog, current and frequency domain (ACFD) signal 210 on to electrode 153 based on reference signal 157. In an example, the low power ACFD signal 210 is a true tone (e.g., a sinusoid). The reference signal 157 is a regulated current signal that includes an oscillating component that oscillates at a first frequency. The drive sense circuit 28-b3 generates the low power ACFD signal 210 to substantially match the reference signal 157. For example, the low power ACFD signal 210 includes an oscillating component that oscillates at the first frequency. In contrast to prior art systems, the low power ACFD signal 210 is a low power signal (e.g., 5 to 75% of rail to rail voltage), and is in the frequency domain. Further, the drive sense circuit is driving and sensing the low power ACFD signal on a signal line. Still further, with only a true tone used to sense the electrode 153, much less noise is introduced as there are no sidebands in the frequency domain. Thus, the drive sense circuit is using much less power and noise than the prior art signaling as discussed in FIG. 15A.

Continuing with the example, drive sense circuit 28-*b*3 outputs an ACFD error correction signal 211 that represents a change in the low power ACFD signal 210 in comparison to the reference signal 157. As an example, the ACFD error correction signal 211 represents a change to an electrical characteristic (e.g., impendence, inductance, voltage, etc.) of the electrode 153. For instance, the impedance of the electrode changes due to a touch. Analog to digital circuit 204 generates a digital ACFD error correction signal 213 based on the ACFD error correction signal 211.

Figure 16A:
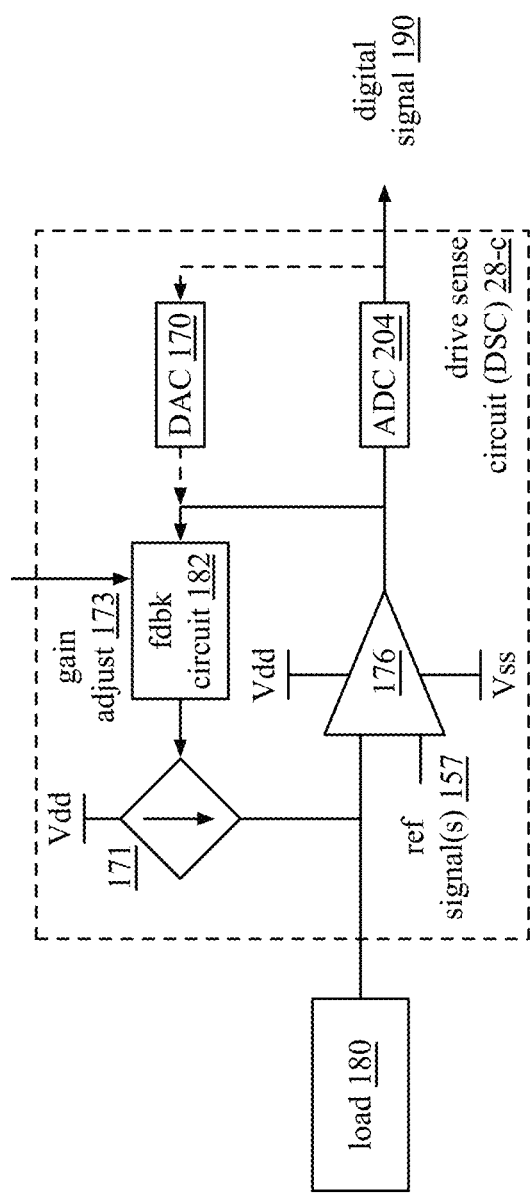
FIG. 16A is a schematic block diagram of another embodiment of a drive sense circuit.

FIG. 16A is a schematic block diagram of another embodiment of a drive sense circuit (DSC) 28-*c* that includes an op-amp 176, a dependent current source 171, a feedback circuit 182, an analog to digital converter (ADC) 204, and a digital to analog converter (DAC) 170. The DSC 28-*c*, when enabled, senses changes to electrical characteristics of the load 180. Feedback circuit 182 generates an output based on an error signal output from op-amp 176 and gain adjust 173. For example, feedback circuit generates a 0.25 mA current signal when the error signal is 0.05 mA and the gain adjust is 5.

Figure 16B:
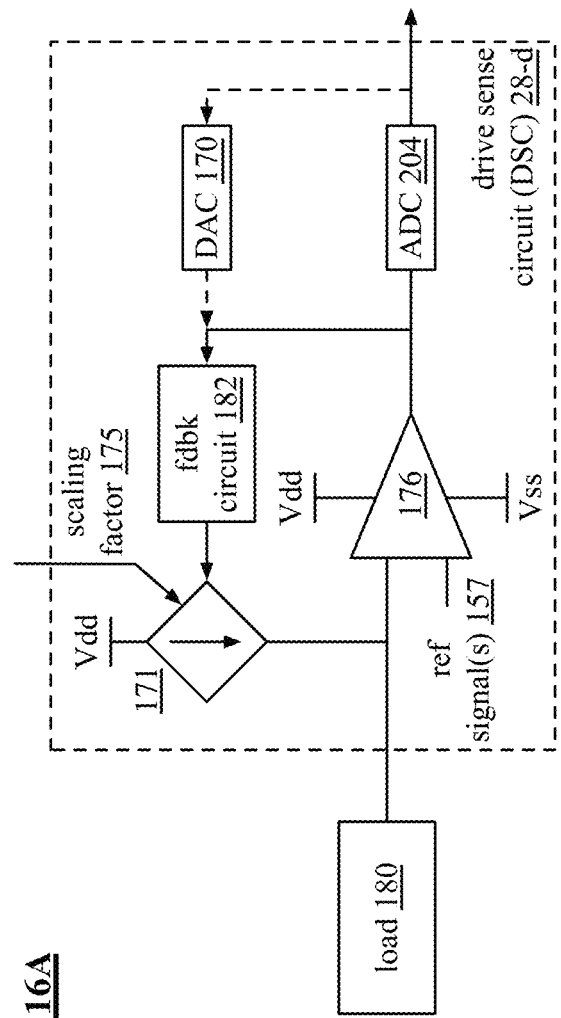
FIG. 16B is a schematic block diagram of another embodiment of a drive sense circuit.

FIG. 16B is a schematic block diagram of another embodiment of a drive sense circuit (DSC) 28-*d*, which is similar to FIG. 16A, with a difference being the dependent current source generating a signal based on the output of the feedback circuit and a scaling factor 175. For example, a condition effects the load, which causes signal to decrease its current by 0.05 mA. Feedback circuit 182 generates a current signal of 0.1 milliamps (mA) based on receiving an error signal output from op-amp 176. and the scaling factor is 0.5. Thus, dependent current source 171 generates a current of 0.05 mA which keeps the current on the line coupled to the load 180 substantially constant.

FIG. 16C is a schematic block diagram of another embodiment of a drive sense circuit 28-*e*. This example is similar to FIG. 16B, with a difference being DSC 28-*e* does not include a digital to analog converter.

FIG. 16D is a schematic block diagram of another embodiment of a drive sense circuit 28-*f*. This example is similar to FIG. 16C, with a difference being DSC 28-*f* does not include an analog to digital converter.

Figure 17:
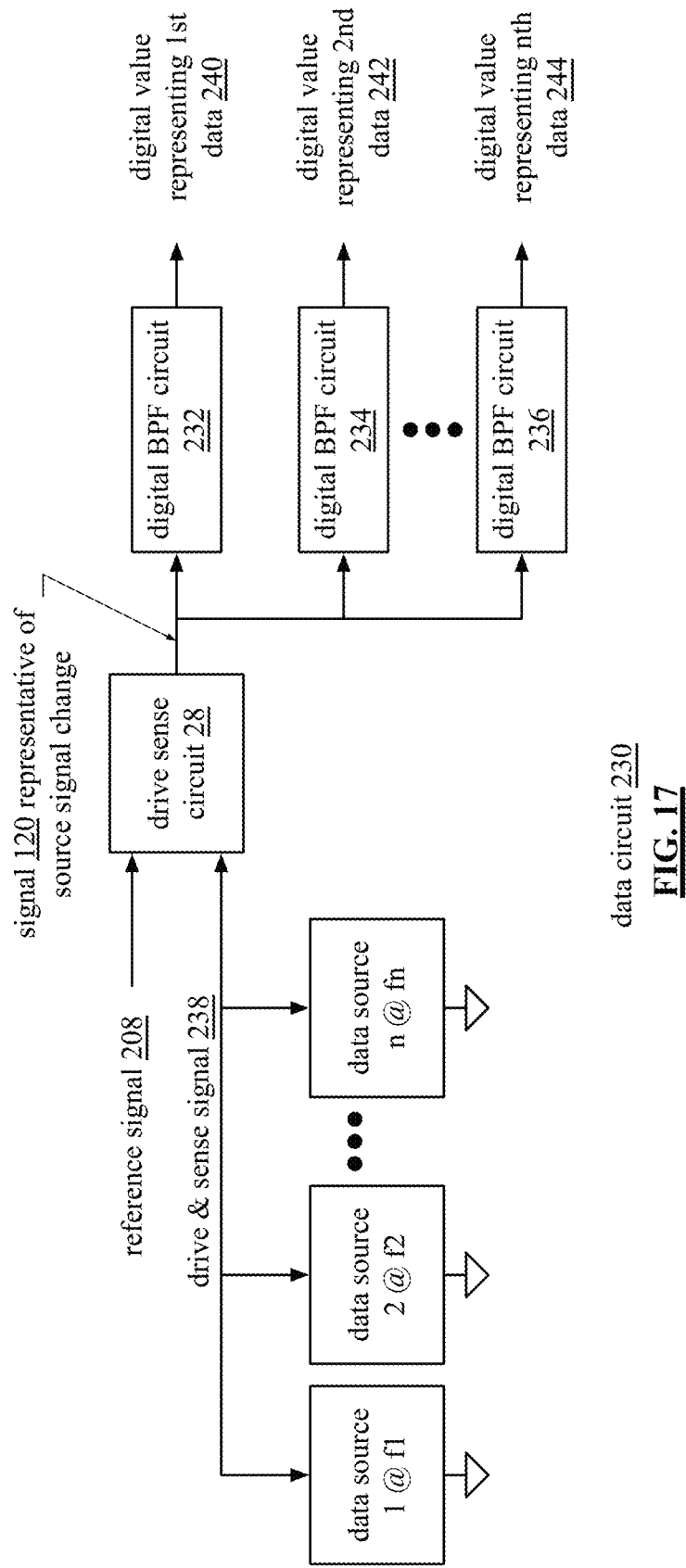
FIG. 17 is a schematic block diagram of an embodiment of a data circuit.

FIG. 17 is a schematic block diagram of an embodiment of a data circuit 230 that includes a drive sense circuit 28, a plurality of digital bandpass filters (BPF) circuits 232-236, and a plurality of data sources (1 through n). In an embodiment, a data source of the data sources is implemented by a load 180. The drive sense circuit 28 produces a drive signal component of a drive & sense signal 238 (e.g., the drive part of signal 238) based on the reference signal 208 as previously discussed. The data sources operate at different frequencies to embed frequency domain data into the drive & sense signal 238 (e.g., the sense part of signal 238).

In an example of operation, data source 1 alters the drive signal component of the drive & sense signal 238 at a first frequency f1; data source 2 alters the drive signal component of the drive & sense signal 238 at a second frequency f2; and data source n alters the drive signal component of the drive & sense signal 238 at an "nth" frequency fn. The drive sense circuit 28 regulates the drive & sense signal 238 to substantially match the reference signal 208, which may be similar to reference signal 157 of FIG. 14A.

The drive sense circuit 28 outputs a signal 120 that is representative of changes to the drive & sense signal 238 based on the regulation of the drive & sense signal 238. Each of the digital BPF circuits 232 receives the signal 120 and is tuned to extract data therefrom corresponding to one of the data sources. For example, digital BPF circuit 232 is tuned to extract the data at frequency f1 of the data source 1 to produce one or more digital values representing the first data 240. The second digital BPF circuit 234 is tuned to extract the data at frequency f2 of the data source 2 to produce one or more digital values representing the second data 242. The nth digital BPF circuit 236 is tuned to extract the data at frequency fn of the data source n to produce one or more digital values representing the nth data 244. Each of the digital BPF circuits 232-236 includes one or more finite impulse response (FIR) filters, one or more cascaded integrated comb (CIC) filters, one or more infinite impulse response (IIR) filters, one or more decimation stages, one or more fast Fourier transform (FFT) filters, and/or one or more discrete Fourier transform (DFT) filters.

Figure 18:
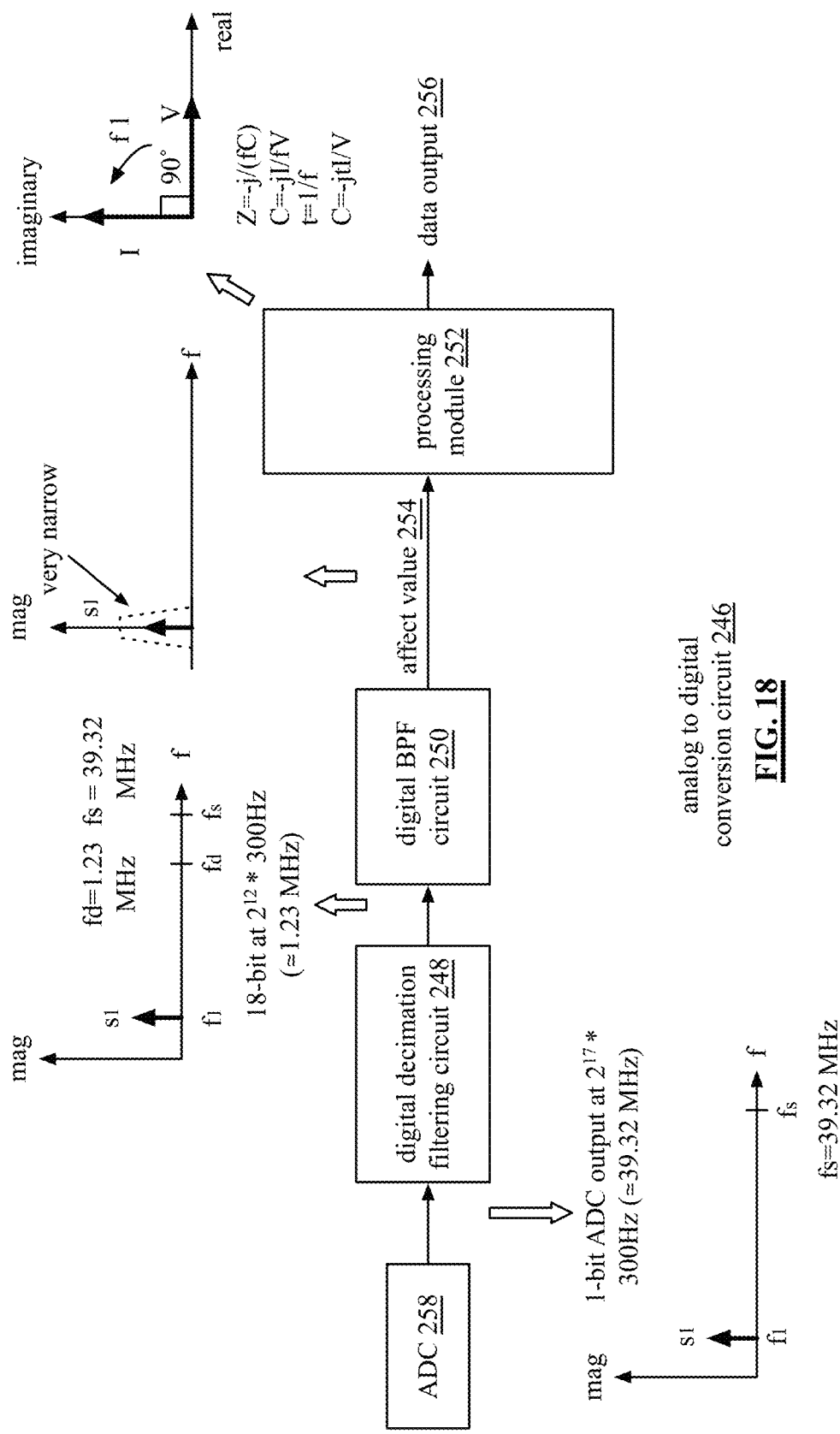
FIG. 18 is a schematic block diagram of an embodiment of an analog to digital conversion circuit.

FIG. 18 is a schematic block diagram of an embodiment of an analog to digital conversion circuit 246 that includes an analog to digital converter (ADC) 258, a digital decimation filtering circuit 248, a digital bandpass filter (BPF) circuit 250, and a processing module 252. The ADC 258 may be implemented in a variety of ways. For example, the ADC 258 is the ADC converter 212 of drive sense circuit 28 of previous Figures. As another example, the ADC 258 is implemented as a flash ADC, a successive approximation ADC, a ramp-compare ADC, a Wilkinson ADC, an integrating ADC, and/or a delta encoded ADC. As yet another example, the ADC 258 is implemented as a sigma-delta ADC.

The digital decimation filtering circuit 248 includes one or more finite impulse response (FIR) filters, one or more cascaded integrated comb (CIC) filters, one or more infinite impulse response (FIR) filters, one or more fast Fourier transform (FFT) filters, and/or one or more discrete Fourier transform (DFT) filters, one or more polyphase filters, and one or more decimation stages. The digital bandpass filter (BPF) circuit 250 includes one or more finite impulse response (FIR) filters, one or more cascaded integrated comb (CIC) filters, one or more infinite impulse response (FIR) filters, one or more decimation stages, one or more fast Fourier transform (FFT) filters, and/or one or more discrete Fourier transform (DFT) filters, and one or more polyphase filters. BPF 250 includes a plurality of taps having coefficients set to produce a bandpass region approximately centered at the oscillation frequency of the analog input signal and having a bandwidth tuned for filtering a pure tone (e.g., s1).

Sampling frequencies of the stages of the analog to digital conversion circuit 246 are set as multiples of the data output rate. For example, the data output 256 rate is 300 Hz thus sampling frequencies are multiples of 300 Hz. For example, ADC circuit 258 oversamples the analog input signal at a sampling frequency (fs) of $2^{17}$*300 Hz (approximately 39.32 MHz). The analog input signal is said to be oversampled when the sampling frequency is more than the Nyquist sampling frequency (e.g., 40 KHz-400 KHz when the oscillating frequency is 20 KHz-200 KHz). Setting the sampling frequency at a frequency much higher than the Nyquist sampling frequency results in a significantly oversampled analog signal. Oversampling of the analog signal allows for narrower bandpass filtering and improves signal to noise ratio (SNR).

In an example of operation, the ADC 258 converts an analog signal that includes a set of pure tone components (e.g., one or more pure tone components, each having an oscillation frequency) into a digital signal of the one or more pure tone components. For example, an input analog signal has a pure tone (e.g., a sinusoidal signal, a DC signal, a repetitive signal, and/or a combination thereof) having a DC component and/or an oscillation frequency at f1 (e.g., a frequency in the audio range, in the range 20 KHz-200 KHz, or more). As a specific example, the ADC is a sigma-delta ADC that oversamples the analog input signal at clock rate of approximately 39.32 MHz (e.g., $300*2^{17}$) and, as such, pushes low frequency noise up to higher frequencies outside the band of interest. An example of a sigma-delta ADC will be discussed in greater detail with reference to FIG. 23.

Continuing with the specific example, the ADC 258 produces a 1-bit digital output at approximately 39.32 MHz representative of the analog signal. In an embodiment, the analog signal includes an error correction signal s1 at frequency f1, which represents the frequency domain data embedded in the analog input signal and is substantially preserved in the digital domain.

The digital decimation filtering circuit 248 takes the output from ADC circuit 258 (e.g., 1-bit digital output at approximately 39.32 MHz) and converts it to another digital signal having another data rate frequency that is a multiple of the data output rate (e.g., 300 Hz). In this example, digital decimation filtering circuit 248 has an output rate (fd) of $2^{12}*300$ HZ (approximately 1.23 MHz).

As a more specific example, the digital decimation filtering circuit 248 converts the 1-bit digital output at approximately 39.32 MHz into an 18-bit output at $2^{12}*300$ HZ (approximately 1.23 MHz) representing error correction signal s1 at frequency f1. The ratio between the sampling rate (fs) and the digital decimation filtering circuit 248's output rate (fd) (e.g., fs/fd) is equal to the number of ADC 258 samples per output of digital decimation filtering circuit 248. For example, 39.32 MHz/1.23 MHz=32. Therefore, digital decimation filtering circuit 248 has a decimation rate of 32. In the time is takes ADC 258 to output 32 1-bit samples, 1 18-bit output is produced by digital decimation filtering circuit 248. The digital decimation filtering circuit 248 will be discussed in greater detail with reference to FIGS. 31-41.

The digital BPF circuit 250 takes the output of the digital decimation filtering circuit 248 (e.g., the 18-bit output at approximately 1.23 MHz) and bandpass filters it. The digital BPF circuit 250 applies a narrow bandpass filter, centered at f1, and outputs an affect value 254 having real and imaginary components. Because the data (e.g., error correction signal) is embedded in a sinusoid (e.g., a pure tone) the desired information is at frequency f1 and is based on magnitude and/or phase. Therefore, the bandpass filter can be very narrow (e.g., 1% to 20% of channel spacing and, as a specific example about 5% the channel spacing 255 (e.g., for a channel spacing of 300 Hz, a 10 Hz bandpass filter may be used)) to capture the desired signal. In an embodiment, the digital BPF circuit 250 has a tap-length of 4096 (e.g., in the time it takes digital decimation filtering circuit 248 to output 4096 18-bit outputs at approximately 1.23 MHz, digital BPF circuit outputs 1 48-bit affect value at the output rate of 300 Hz). The digital BPF circuit 250 will be discussed in greater detail with reference to FIGS. 42-53.

Processing module 252 interprets the imaginary and real components of the affect value 254 to produce data output 256. Affect value 254 is a vector (i.e., a phasor complex number) having a real component and an imaginary component representing a sinusoidal function that has a peak magnitude (i.e., amplitude) and direction (i.e., phase). For example, affect value 254 is one 48-bit value having a 24-bit real component and a 24-bit imaginary component. In the complex domain, voltages and currents are phasors and resistances, capacitances, and inductances are replaced with complex impedances (e.g., ZR=R, ZL=jfL, and ZC=1/(fC)=−j/(fC)). Since voltage (V)=current (I)*impedance (Z), the processing module 252 determines a capacitance or other impedance value from voltage and current vectors of the affect value 254 (e.g., a decrease in impedance increases the voltage for a constant current, increases the current for a constant voltage, or increases both voltage and current of the signal component). The increasing and decreasing of impedance at a particular rate is representative of the input data. The impedance value or change in impedance value determined is output as data output 256 at the example output rate of 300 Hz.

Figure 19:
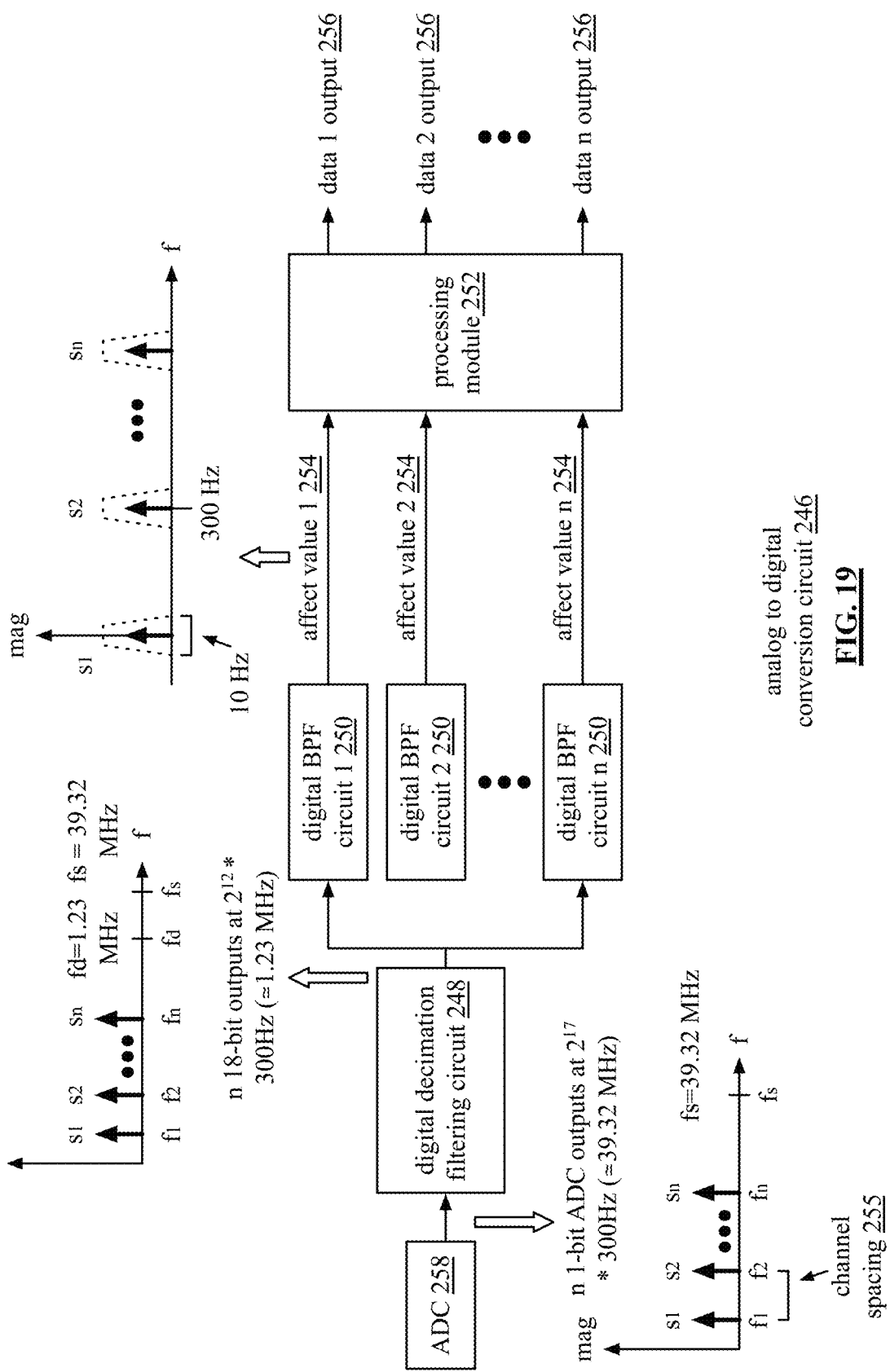
FIG. 19 is a schematic block diagram of another embodiment of an analog to digital conversion circuit.

FIG. 19 is a schematic block diagram of another embodiment of analog to digital conversion circuit 246 that includes analog to digital converter (ADC) 258, digital decimation filtering circuit 248, a plurality of digital bandpass filter (BPF) circuits 250, and processing module 252. Analog to digital conversion circuit 246 of FIG. 19 operates similarly to the example of FIG. 18 except a plurality of digital BPF circuits are included for filtering a plurality of pure tones.

In an example of operation, the ADC 258 converts an analog signal having a set of pure tone components (e.g., signals s1-sn) into a set of digital signals (s1-sn) at the oscillation frequencies (e.g., f1-fn). For example, a first tone of the input analog signal has an oscillation frequency of f1 (e.g., 100 KHz), which, for example, is used for a first self-capacitance measurement on a touch screen display, a second tone of the input analog signal has an oscillation frequency of f2 (e.g., 100.3 KHz), which, for example, is used for a first mutual-capacitance measurement on a touch screen display, and an nth tone of the input analog signal has an oscillation frequency of fn (e.g., 100 KHz+300 nHz), which, for example, is for an nth mutual-capacitance measurement on a touch screen display. Frequencies f1-fn span n channels and are equally separated by a channel spacing 255. For example, channel spacing 255 is equal to output data rate of 300 Hz.

The digital decimation filtering circuit 248 takes the output from the ADC 258 (e.g., via a n-line parallel bus) and converts the signals to other digital signals having another data rate frequency that is a multiple of the data output rate (e.g., 300 Hz). In this example, digital decimation filtering circuit 248 has an output rate (fd) of $2^{12}*300$ HZ (approximately 1.23 MHz). For example, the digital decimation filtering circuit 248 converts the 1-bit ADC output at approximately 39.32 MHz representing digital signals s1-sn at frequencies f1-fn to an 18-bit output at $2^{12}*300$ HZ (approximately 1.23 MHz) representing signals s1-sn at frequencies f1-fn.

Each of the digital BPF circuits 1-n 250 includes a plurality of taps having coefficients set to produce a bandpass region approximately centered at the oscillation frequency of the analog input signal and having a bandwidth tuned for filtering a pure tone. For example, digital BPF circuit 1 250 has a bandwidth tuned for filtering f1, digital BPF circuit 2 250 has a bandwidth tuned for filtering f2, and digital BPF circuit n 250 has a bandwidth tuned for filtering fn. Digital BPF circuits 1-n 250 take the output from the from the digital decimation filtering circuit 248 (e.g., n 18-bit outputs at approximately 1.23 MHz with error correction signals s1-sn at frequencies f1-fn via a bus) and shifts each signal to the bandpass for a frequencies f1-fn.

Digital BPF circuits 1-n 250 each apply a very narrow bandpass filter and output a corresponding affect value 1-n 254 having real and imaginary components. Because data is embedding in each sinusoid signal (s1-sn) (e.g., a pure tone) the desired information is at frequencies f1-fn and based on magnitude and/or phase. Therefore, the bandpass filters can be very narrow (e.g., less than 0.05 the channel spacing (e.g., 10 Hz)) to capture the desired signals.

Processing module 252 interprets the imaginary and real components of the affect values 1-n 254 to produce data outputs 1-n 256. Affect values 1-n 254 are vectors (i.e., a phasor complex numbers) each having a real component and an imaginary component representing a sinusoidal function that has a peak magnitude (i.e., amplitude) and direction (i.e., phase). For example, an affect value is one 48-bit value having a 24-bit real component and a 24-bit imaginary component. In the complex domain, voltages and currents are phasors and resistances, capacitances, and inductances are replaced with complex impedances (e.g., $ZR=R$, $ZL=jfL$, and $ZC=1/(fC)=-j/(fC)$). Since voltage (V)=current (I)*impedance (Z), the processing module 252 determines capacitance or other impedance values from voltage and/or current vectors represented by affect values 1-n 254. The impedance values or changes in impedance values determined are output as data outputs 1-n 256. Data output 256 is output separately or in parallel at the output data rate (e.g., 300 Hz).

Figure 20B:
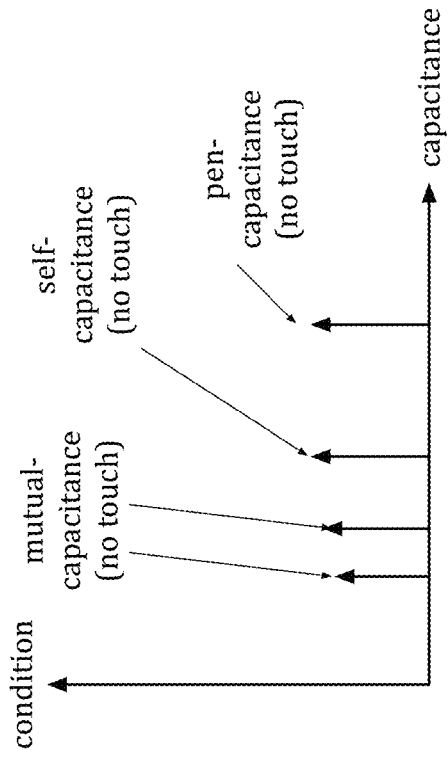
FIGS. 20A-20B are example graphs that plot condition verses capacitance.
Figure 20A:
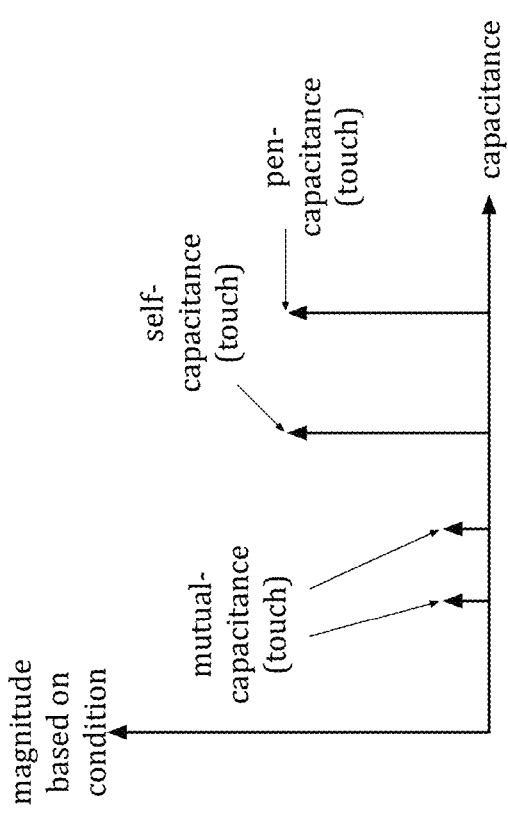

FIGS. 20A-20B are example graphs that plot condition verses capacitance (e.g., of an electrode of a touch screen display). In a touch screen display example, an electrode has a self-capacitance and mutual capacitance. A finger capacitance or a pen capacitance (e.g., a touch) raises self-capacitance of electrodes which decreases the impedance for a given frequency. As shown in FIG. 20A, the mutual capacitance decreases with a touch and the self-capacitance and pen-capacitance increases with a touch. As shown in FIG. 20B, the mutual capacitance, pen-capacitance, and self-capacitance for a no-touch condition are shown to be about the same magnitude but are different than when under a touch condition. For instance, the mutual capacitance decreases as a result of a touch, while self-capacitance and pen-capacitance each increases as a result of a touch.

Figure 21:
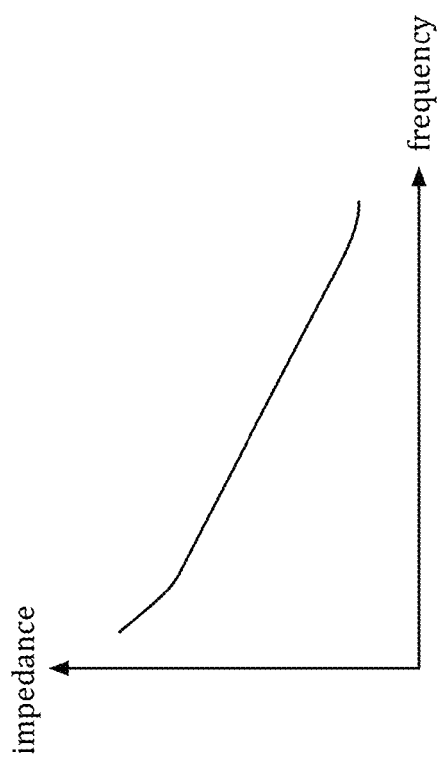
FIG. 21 is an example graph that plots impedance verses frequency for an input.

FIG. 21 is an example graph that plots impedance verses frequency for an input that has a primarily capacitive load. Being based on capacitance (self, pen, and/or mutual), as the frequency increases for a fixed capacitance, the impedance decreases based on $½πfC$, where f is the frequency and C is the capacitance.

Figure 22:
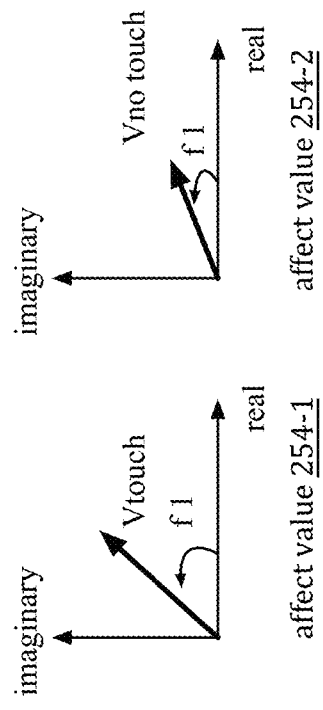
FIG. 22 is an example of affect values.

FIG. 22 is an example of affect values 254-1 and 254-2. When the DC component embedded in the analog input signal represents a voltage at a constant current, an affect value represents a voltage vector having an imaginary component and a real component. The processing module 252 determines capacitance changes (e.g., self, pen, mutual, etc.) from voltage vectors (e.g., impedance (Z)=voltage (V)/current (I) and $ZC=1/(fC)=-j/(fC)$) and interprets whether the change represents a touch or no touch condition.

Figure 23:
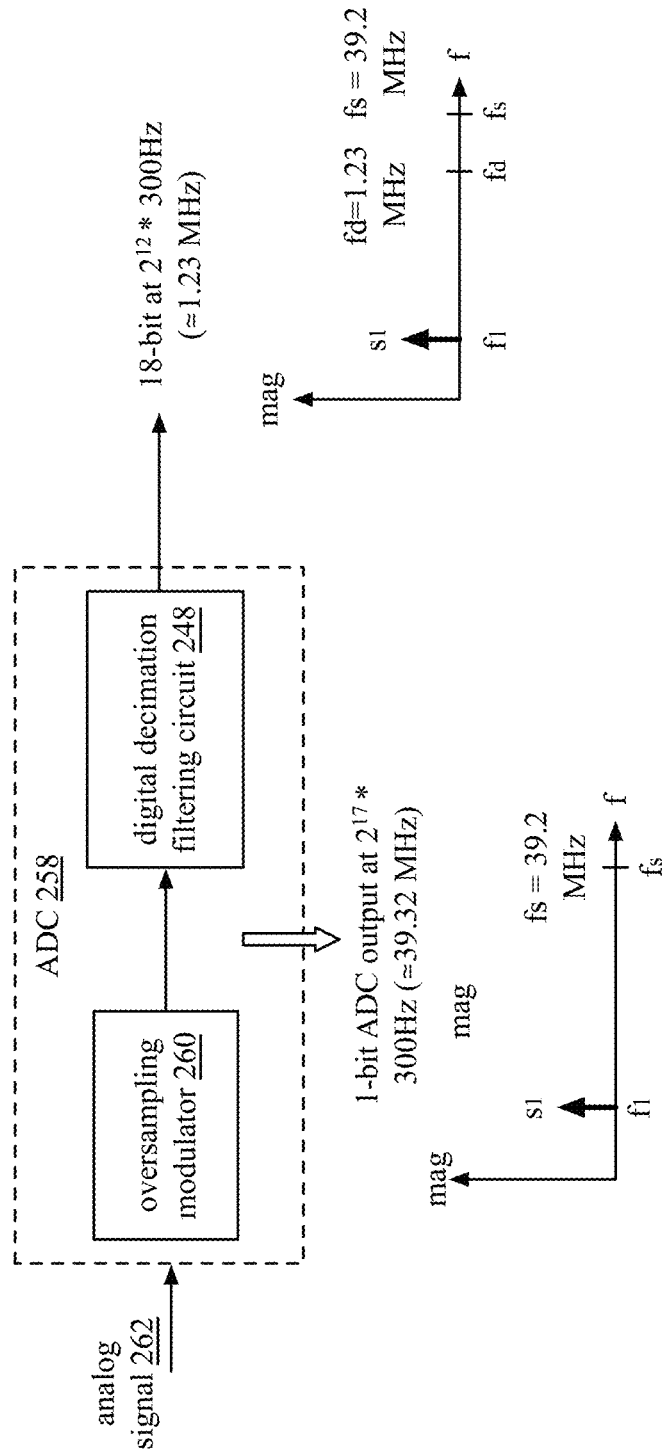
FIG. 23 is a schematic block diagram of an embodiment of a sigma delta analog to digital (ADC) circuit.

FIG. 23 is a schematic block diagram of an embodiment of a sigma delta analog to digital (ADC) circuit. Sigma delta (ADC) circuit 258 is an example of ADC 258 of FIGS. 18 and 19 and includes oversampling modulator 260 and digital decimation filtering circuit 248. In an example of operation, the ADC circuit 258 converts an analog input signal 262 having an oscillation frequency and a set of pure tone components into an 18-bit output at a rate of approximately 1.23 MHz. For example, an input analog signal 262 has an oscillation frequency of fi (e.g., 20 KHz-200 KHz) and a pure tone component s1.

In this example, oversampling modulator 260 is a 1-bit ADC sigma-delta modulator. Oversampling modulator 260 oversamples the analog input signal 262 at a sampling frequency (fs) of $2^{17}*300$ Hz (approximately 39.32 MHz) in this example. Oversampling modulator 260 produces a 1-bit ADC output at 39.32 MHz representing error correction signal s1 embedded in the sinusoidal signal at frequency f1. Error correction signal s1 is representative of the frequency domain data embedded in the analog input signal and is substantially preserved in the digital domain.

Digital decimation filtering circuit 248 includes one or more finite impulse response (FIR) filters, one or more cascaded integrated comb (CIC) filters, one or more infinite impulse response (FIR) filters, one or more decimation stages, one or more fast Fourier transform (FFT) filters, and/or one or more discrete Fourier transform (DFT) filters, one or more polyphase filters, and one or more decimation stages. Digital decimation filtering circuit 248 takes the output from oversampling modulator 260 (e.g., 1-bit ADC output at approximately 39.32 MHz representing error correction signal s1 at frequency f1) and filters and down converts it to another digital signal having another data rate frequency. In this example, digital decimation filtering circuit 248 has an output rate (fd) of $2^{12}*300$ HZ (approximately 1.23 MHz).

For example, the digital decimation filtering circuit 248 converts the 1-bit ADC output at approximately 39.32 MHz representing error correction signal s1 at frequency f1 to an 18-bit output at $2^{12}*300$ HZ (approximately 1.23 MHz) representing error correction signal s1 at frequency f1. The ratio between the sampling rate (fs) and the digital decimation filtering circuit 248's output rate (fd) (e.g., fs/fd) is equal to the number of samples taken by the oversampling modulator 260 per output of the digital decimation filtering circuit 248. For example, 39.32 MHz/1.23 MHz=32. Therefore, digital decimation filtering circuit 248 has a decimation rate of 32.

FIG. 24A is an example of quantization noise of a sigma delta oversampling modulator 260 of FIG. 23. Sigma-delta ADCs implement noise shaping (i.e., a function that effectively pushes low frequency noise up to higher frequencies outside the band of interest) making it suitable for high precision, high resolution applications. Oversampling modulator 260 of FIG. 23 moves quantization noise 264 to higher frequencies. The order of the sigma delta oversampling modulator varies the noise shaping.

As shown, quantization noise 264 starts low at zero Hz, rises and then levels off at the oversampling modulator's sampling frequency (fs). Multi-order sigma delta modulators shape the quantization noise 264 to higher frequencies than lower-order sigma delta modulators. For example, the third-order sigma delta modulator example shows much more noise near frequency fs in comparison to the first-order sigma delta modulator but noise near lower frequencies is much less. The output of digital decimation filtering circuit 248 of FIG. 23 includes frequencies from 0 to frequency fd and thus a good portion of the quantization noise 264 exists in the output of all three examples. However, very narrow bandpass filtering (e.g., by digital BPF circuit 250 as discussed in previous Figures) isolates the signals of interest at the lower frequencies such that noise near fd is also removed.

FIG. 24B is an example of the relationship between an oversampling ratio (e.g., of a sigma delta oversampling modulator of a sigma-delta ADC) and a signal-to-noise ratio (SNR) in decibels (dBs). As illustrated, the order of the sigma delta oversampling modulator affects the slope (dB per octave) of the relationship (e.g., higher order increases the slope). In general, as the oversampling ratio is increased, a desired signal-to-noise ratio (SNR) in decibels (dBs) is also increased. Conversely, as the oversampling ratio is decreased, the SNR decreases.

Figure 25:
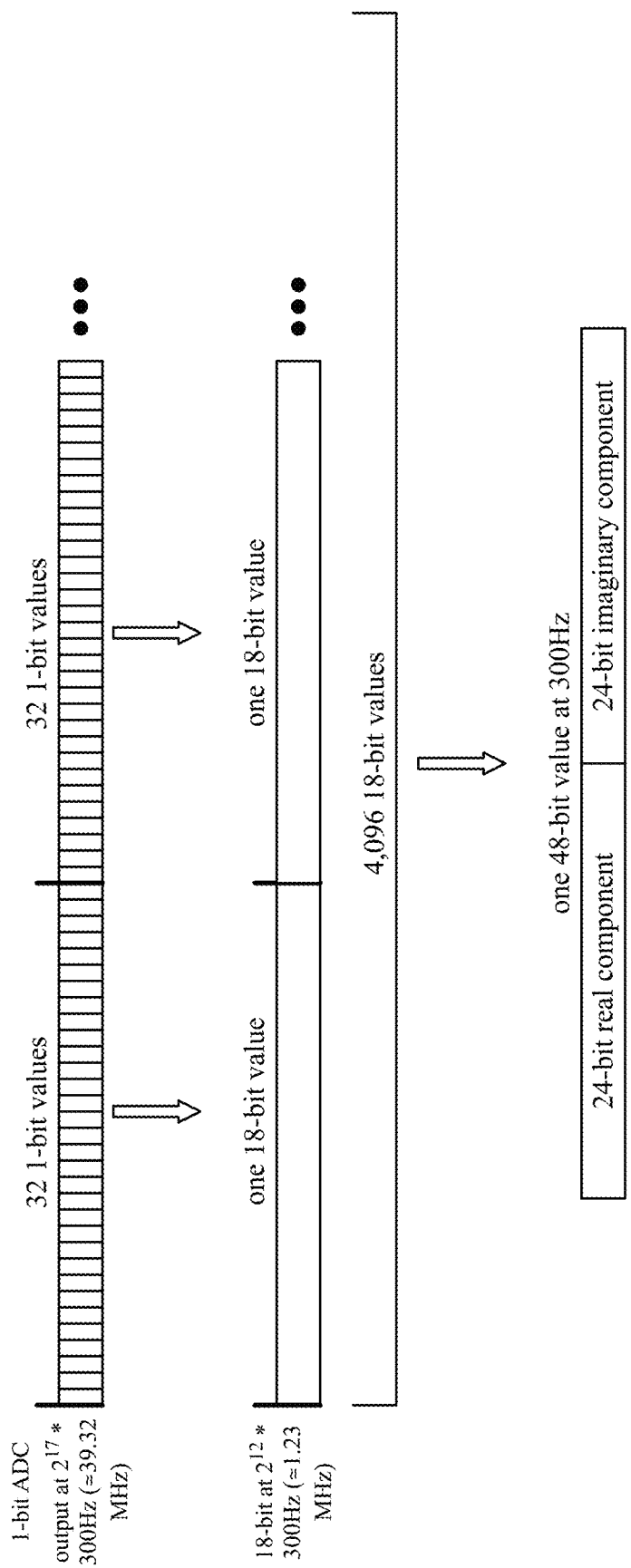
FIG. 25 is a schematic block diagram of example outputs of the different stages of an analog to digital conversion circuit.

FIG. 25 is a schematic block diagram of example outputs of the different stages of the analog to digital conversion circuit 246 of FIGS. 18 and 19. In this example, analog to digital (ADC) circuit 258 produces a 1-bit ADC output at $2^{17}*300$ Hz (approximately 39.32 MHz). Therefore, there are $2^{17}$ (or 131,072) 1-bit samples of the analog input signal per data output clock cycle (e.g., 300 Hz in this example). Digital decimation filtering circuit 248 produces an 18-bit output at $2^{12}*300$ Hz (approximately 1.23 MHz). $2^{17}/2^{12}$ is equal to $2^5$ or 32; therefore, in the time the ADC circuit 258 outputs 32 1-bit samples and the digital decimation filtering circuit 248 is able to output one 18-bit value as shown.

BPF circuits 250 output one 48-bit affect value having a 24-bit real component and a 24-bit imaginary component at the data output clock rate of 300 Hz. Therefore, there are $2^{12}$ (or 4096) 18-bit values per data output clock cycle (e.g., 300 Hz in this example). In other words, in the time it takes digital decimation filtering circuit 248 to output 4096 18-bit values, the one or more digital BPF circuits 250 output one 48-bit affect value having a 24-bit real component and a 24-bit imaginary component at the data output clock rate of 300 Hz.

Figure 26:
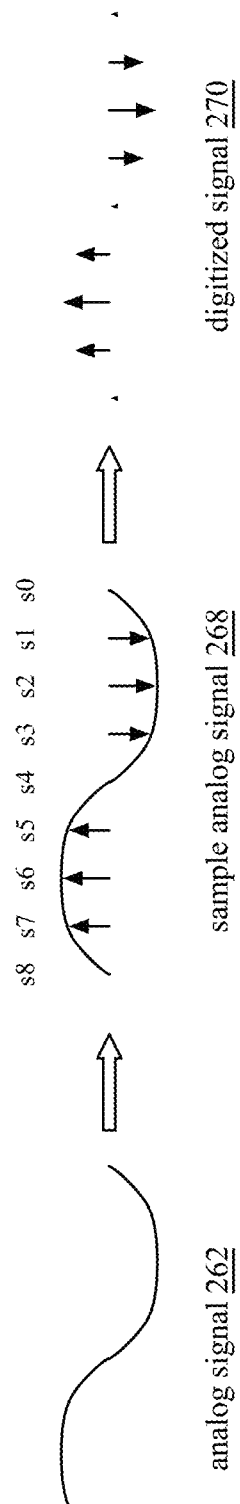
FIG. 26 is an example of sampling an analog signal to produce a digitized signal.

FIG. 26 is an example of sampling an analog signal 262 to produce a digitized signal 270. In this example, analog signal 262 is sampled at 8 points per cycle (s0-s7) to create a digitized signal of 8 discrete points representative of the analog signal 262.

Figure 27:
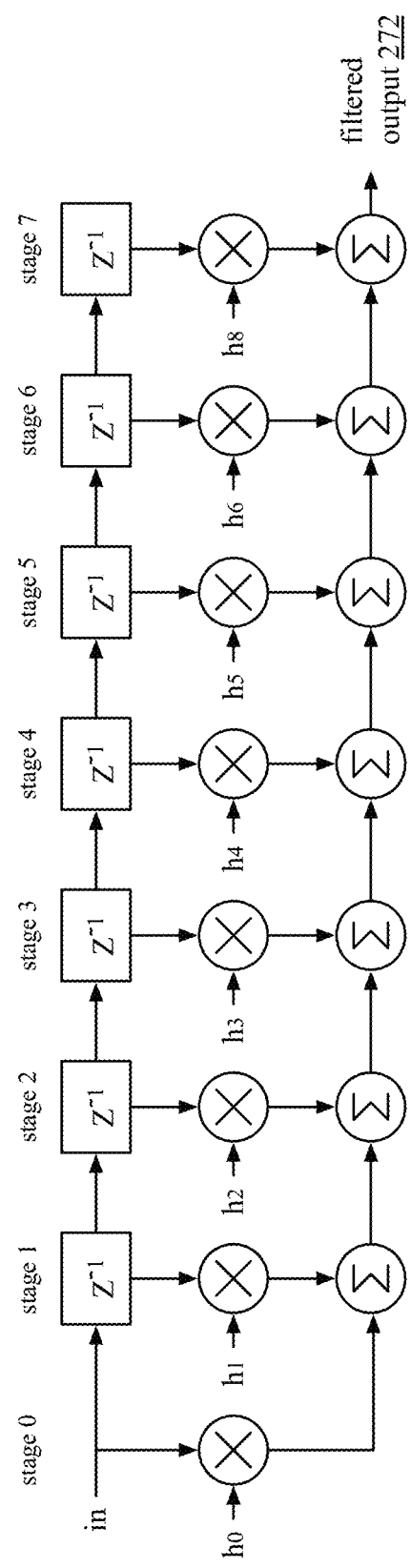
FIG. 27 is a schematic block diagram of a digital filter implementing a multiply-accumulate function.

FIG. 27 is a schematic block diagram of a digital filter implementing a multiply-accumulate function. The digital filter shown is designed with 8 stages (e.g., taps) in order to capture the 8 discrete points of the digitized signal of FIG. 26. When the 8 stages capture the points in the pattern shown in FIG. 26, the digital filter produces a filtered output 272 (e.g., a pulse representative of an n-bit digital logic value). The input signal (e.g., digitized signal 270) enters the digital filter at stage 0 where it is multiplied by coefficient h0 and also input into stage 1. Stages 1-7 each include a unit delay $Z^{-1}$ in Z-transform notation to provide delayed inputs (taps) to each stage's multiplication operation (i.e., the input signal is multiplied by the next coefficient (e.g., h1-h6) after a delay $Z^{-1}$). The results of the multiplication operation from each stage are added (i.e., accumulated) to create the filtered output. The series of multiply accumulate functions is also referred to as a moving average. The more taps the filter has, the more computationally extensive the output becomes.

Figure 28:
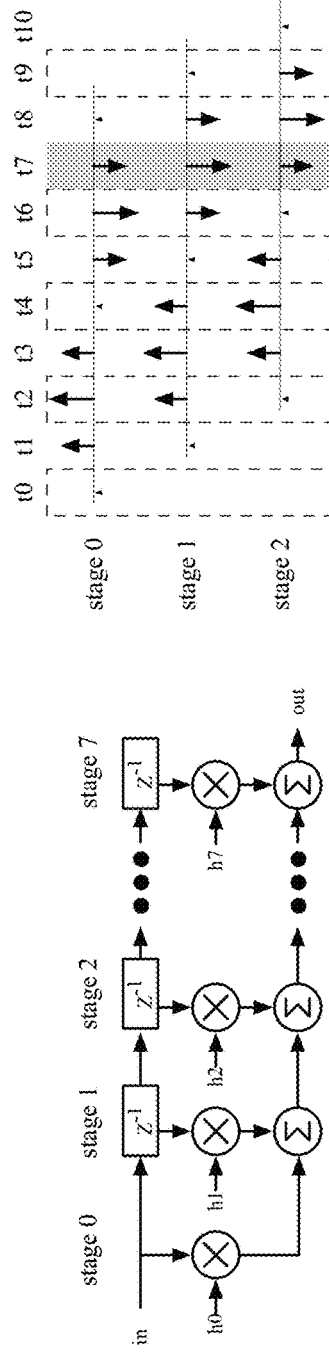
FIG. 28 is a schematic block diagram of a digital filter implementing a multiply-accumulate function.

FIG. 28 is a schematic block diagram of a digital filter implementing a multiply-accumulate function. The digital filter operates similarly to the digital filter of FIG. 27 and is shown here for convenience.

Figure 29:
FIG. 29 is an example of a digitized signal.

FIG. 29 is an example of a digitized signal 270. At a point in time, digitized signal 270 has a particular pattern. For example, the pattern shown is one cycle of a sinusoidal signal. Coefficients h0-h7 of the digital filter of FIG. 28 can be set so that only something close to the desired pattern produces a viable output.

Figure 30:
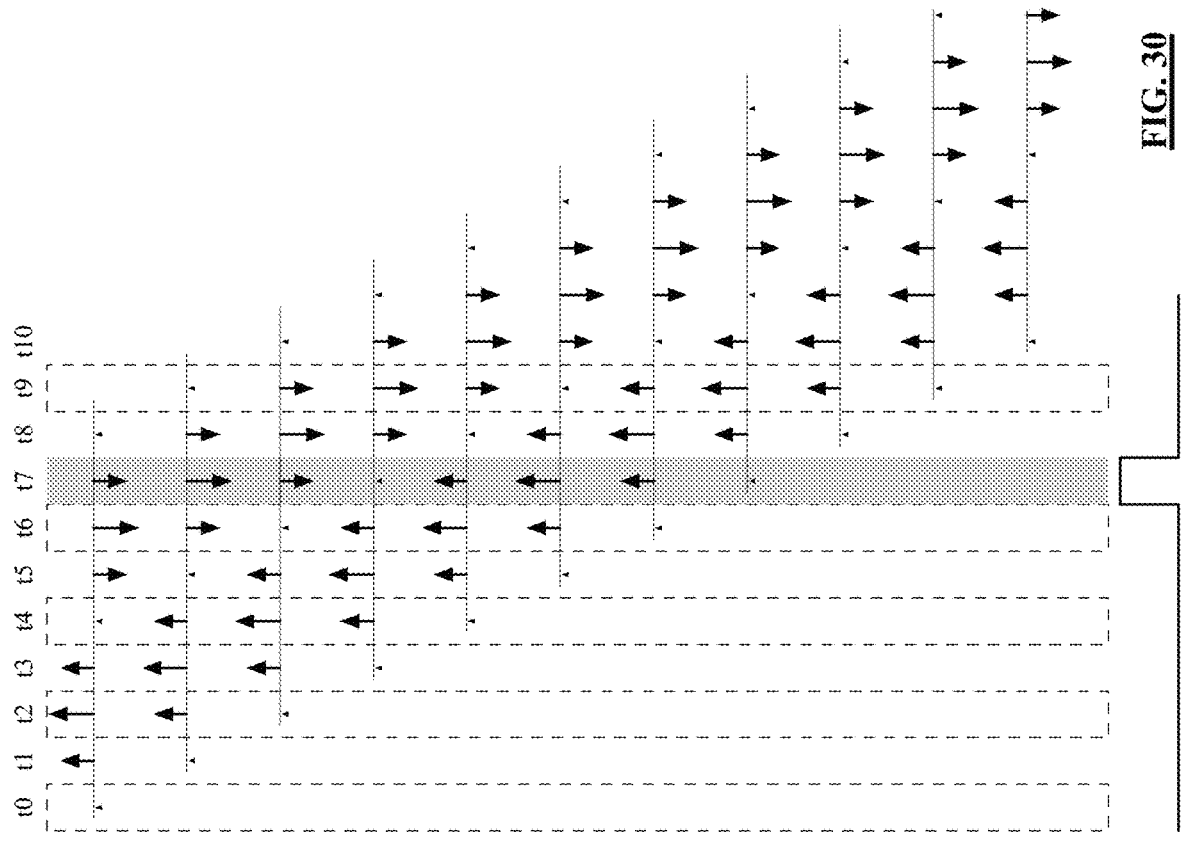
FIG. 30 is an example of producing a digital filtered output.

FIG. 30 is an example of producing a digital filtered output 272. As digitized signal 270 of FIG. 29 moves through the stages of the digital filter (e.g., of FIGS. 27 and 28), coefficients h0-h7 at stages 0-7 are set to look for the pattern shown in FIG. 29 (i.e., the coefficients set the center frequency of the bandpass filter, the bandwidth of the bandpass filter, and the roll-off of the bandpass filter). When the pattern shown in FIG. 29 (or something fairly close to the pattern) is recognized, the bandpass filter produces an output indicating the presence of the signal (e.g., a magnitude and/or phase of a sinusoidal signal). As shown, at stage 7 and at time t7, the filter recognizes that the pattern shown in FIG. 29 has moved through stages 0-7 and therefore produces a filtered output 272 at time t7.

The filtered output 272 may be a pulse representative of an n-bit digital logic value. For example, a digitized sinusoidal signal of a first amplitude may produce pulse representative of a 1-bit digital logic of zero and a digitized sinusoidal signal of a second amplitude may produce pulse representative of a 1-bit digital logic of one. Therefore, digital data (e.g., signal s1 of FIG. 18-19) can be embedded in an analog signal and extracted via digital filtering.

Figure 31:
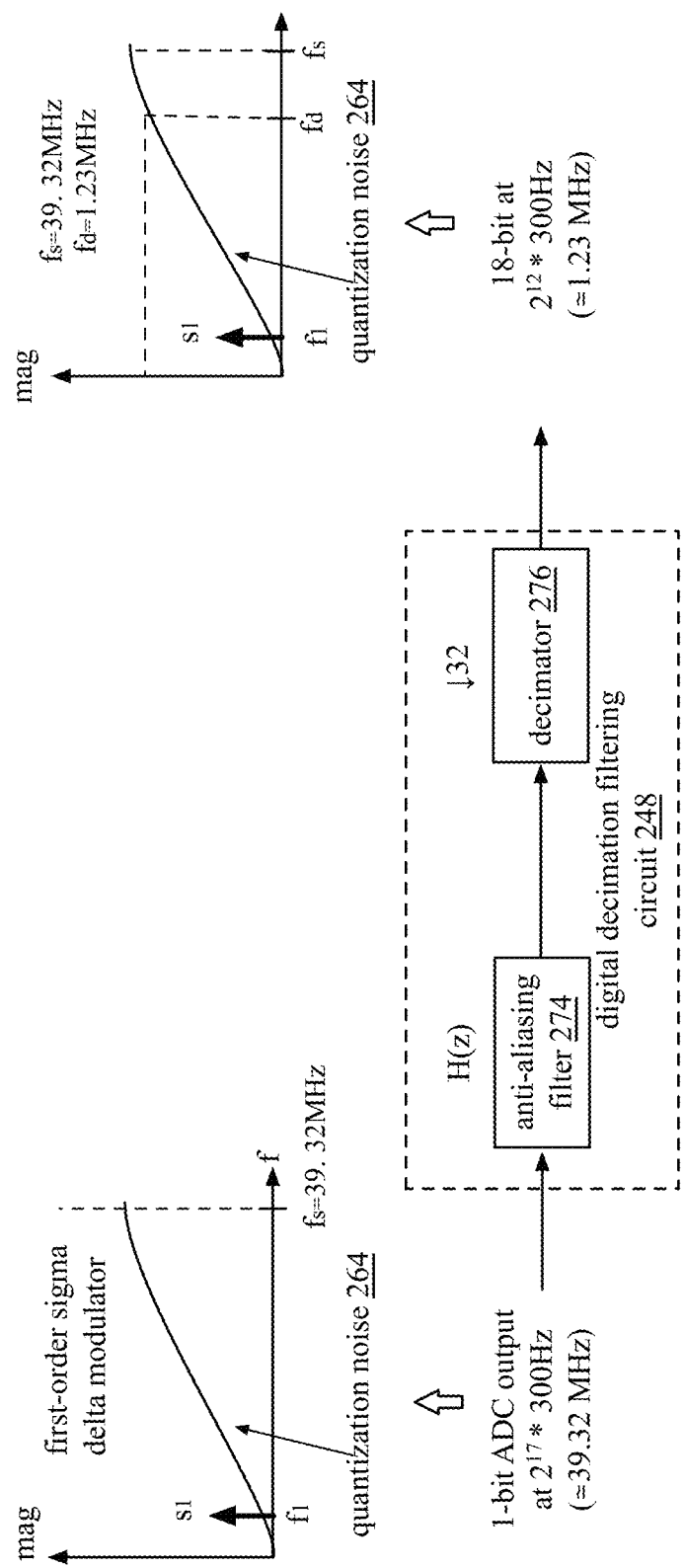
FIG. 31 is a schematic block diagram of an embodiment of a digital decimation filtering circuit.

FIG. 31 is a schematic block diagram of an embodiment of a digital decimation filtering circuit 248. Digital decimation filtering circuit 248 includes anti-aliasing filter 274 and decimator 276. In general, digital decimation filtering circuit 248 filters high frequency components of the input signal and reduces the sampling rate so that the next stage of analog to digital conversion circuit 246 can operate more efficiently.

Digital decimation filtering circuit 248 receives a 1-bit ADC output stream at approximately 39.32 MHz from ADC 258 or oversampling modulator 260 when ADC 258 is sigma delta ADC 258 of FIG. 23. By oversampling the analog input signal, quantization noise 264 is spread out over a wider bandwidth. When ADC 258 is a first order sigma delta ADC, the output from the oversampling modulator 260 includes quantization noise 264 that is noise shaped to be greatest at the sampling frequency (fs) of the oversampling modulator 260 (e.g., 39.32 MHz) as shown.

Anti-aliasing filter 274 is a lowpass filter averaging filter (e.g., one or more finite impulse response (FIR) filters, one or more comb filters, one or more raised cosine filters, one or more cascaded integrated comb (CIC) filters, one or more infinite impulse response (IIR) filters, one or more decimation stages, one or more fast Fourier transform (FFT) filters, and/or one or more discrete Fourier transform (DFT) filters, etc.) that samples the 1-bit ADC output and provides a cutoff frequency to remove or attenuate signals (e.g., quantization noise 264) at higher frequencies. Anti-aliasing filter 274 has a frequency response H(z).

Decimator 276 reduces the output rate of anti-aliasing filter 274 by throwing away portions of anti-aliasing filter 274's output data. In this example, decimator 276 reduces the output rate of anti-aliasing filter 274 (e.g., 39.32 MHz) by 32 to produce digital decimation filtering circuit 248 output rate of 18-bit at approximately 1.23 MHz (e.g., 39.32 MHz/32=1.23 MHz). As shown, applying a low pass anti-aliasing filter 274 with a cutoff frequency of fd and decimating the signal by 32 removes a portion of quantization noise between fd and fs.

Figure 32:
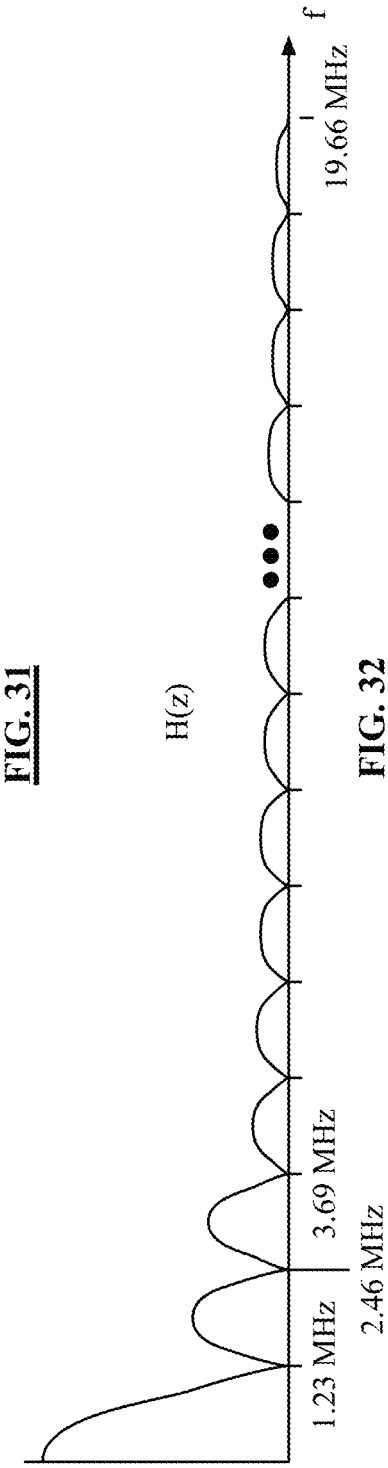
FIG. 32 is an example frequency response H(z) of an anti-aliasing filter.

FIG. 32 is an example frequency response H(z) of the anti-aliasing filter 274. For example, anti-aliasing filter 274 is a finite impulse response (FIR) filter that cuts off frequencies higher than 1.23 MHz (i.e., the output rate of digital decimation filtering circuit 248). The FIR filter has a sin x/x (e.g., or "sinc") frequency response as shown. The sinc frequency response has a "notch" response (e.g., it can reject the line frequency when set to that frequency). The notch position is also directly related to the output data rate. As shown, the first notch position in FIG. 32 is located at the output rate of the digital decimation filtering circuit 248 output rate of approximately 1.23 MHz (e.g., the cutoff frequency). The sinc frequency response is equal to zero at integer multiples of the data rate (e.g., 2.46 MHz, 3.69 MHz, and so on). With a sampling rate of 39.32 MHz, the signal can contain frequency content up to 39.32 MHz/2=19.66 MHz according to Nyquist sampling theorem.

FIG. 33 is a schematic block diagram of an embodiment of anti-aliasing filter 274. In this example, anti-aliasing filter 274 is implementing a multiply accumulate function as discussed in FIG. 27. For example, anti-aliasing filter 274 is a lowpass finite impulse response (FIR) filter having N number of taps. The number of taps selected in anti-aliasing filter 274 is related to the sampling frequency (e.g., 39.32 MHz), the desired cutoff or stopband frequency (e.g., 1.23 MHz), and several other desired filter properties. For example, increasing the number of taps in a FIR filter reduces noise, reduces transition bandwidth between stopband and passband frequencies, and increases attenuation in the stopband. However, the more taps a FIR filter has, the more computationally extensive it is (e.g., more multiply accumulates are required).

In a specific example, anti-aliasing filter 274 is a 128-tap FIR filter (e.g., the FIR filter has 128 frequency coefficients h0-h127) that cuts off frequencies higher than 1.23 MHz (i.e., the output rate of digital decimation filtering circuit 248) and runs at the 1-bit ADC output frequency of 39.32 MHz. The 1-bit ADC output at of 39.32 MHz is a stream of 1-bit code in the time domain shown here as input signal x[n], where x[n] includes n discrete points. The analog signal shown as a dotted line over the stream of 1-bit code shows a simplified example of how a stream of 1-bit inputs can represent an analog signal. As discussed in previous Figures, digital decimation filtering circuit 248 filters 32 samples of input at a time. To accommodate for the 128-taps, the 32-bit input can be padded with zeros.

The input signal enters the anti-aliasing filter 274 at stage 0 where it is multiplied by coefficient h0 and also input into stage 1. Stages 1-127 each include a unit delay $Z^{-1}$ in Z-transform notation to provide delayed inputs (taps) to each stage's multiplication operation (i.e., the input signal is multiplied by the next coefficient (e.g., h1-h127) after a delay $Z^{-1}$). The results of the multiplication operation from each stage are added (i.e., accumulated) to create the filtered output. The series of multiply accumulate functions is also referred to as a moving average. The more taps, the more computationally extensive the output becomes.

The output signal from the anti-aliasing filter 274 is equal to $y[n]=\Sigma_{i=0}^{N} h[i] \cdot x[n-i]$ where N is 128 in this example. The output equation is a summation of the convolution of the input signal with the filter's coefficients. In the time domain, the 128-bit code train resembles the original analog signal (here only 20 bits are shown for convenience) and is responsible for high resolution. However, in the frequency domain, anti-aliasing filter 274 only applies a low pass filter to the signal to attenuate the quantization noise. Therefore, the output signal is now a high-resolution digital version of the analog input signal.

FIG. 34 is a schematic block diagram of an embodiment of a decimator 276. Decimator 276 takes the output from the 128-tap anti-aliasing filter 274 represented here as y[n]=y[0]+y[1]+ . . . +y[127] (note that the illustration only shows 20 samples for convenience) and throws out every M calculation (e.g., where M is the decimation factor). For example, with a decimation factor of 32 and an input of 128 samples from the 128-tap anti-aliasing filter 274, decimator 276 outputs 4 outputs y[0]+y[1] (formerly y[31]), +y[2] (formerly y[63])+y[3](formerly y[95]). From the summation of the four outputs, one 18-bit output is produced at the output rate of approximately 1.23 MHz.

Figure 35:
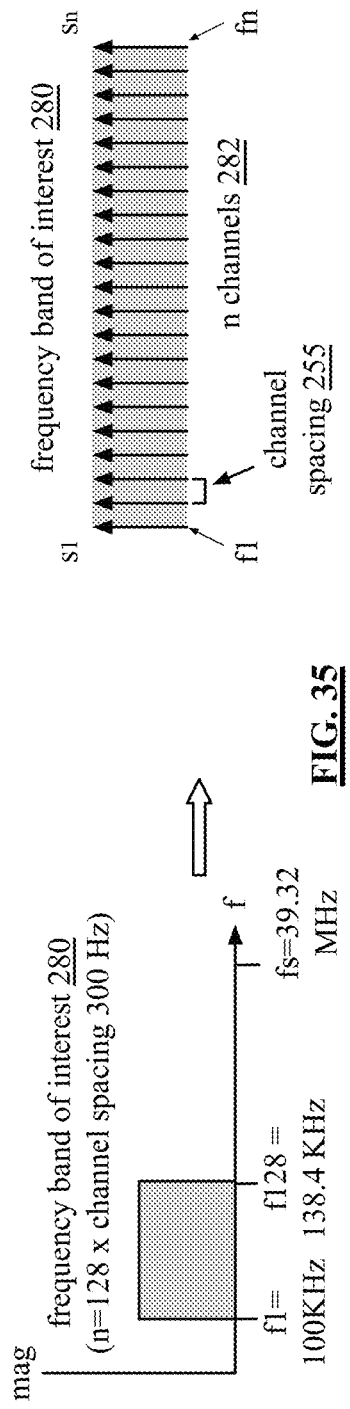
FIG. 35 is an example of a frequency band having frequency channels.

FIG. 35 is an example of a frequency band having frequency channels. The frequency band of interest 280 begins at f1 and ends at fn. Frequency band of interest 280 includes channels 282 f1-fn spaced out at a desired channel spacing 255 (e.g., the data output rate of 300 Hz or another frequency). As a specific example, frequency band of interest 280 includes 128 channels where each channels contains a pure tone component s1-s128 having frequencies f1-f128. With a channel spacing of 300 Hz (e.g., the data output rate), the frequency band of interest is 128×300 Hz=38.4 KHz wide (i.e., n×channel spacing 200 Hz). If f1 is at 100 KHz, the frequency band of interest 280 spans from 100 Khz to 138.4 KHz.

Figure 36:
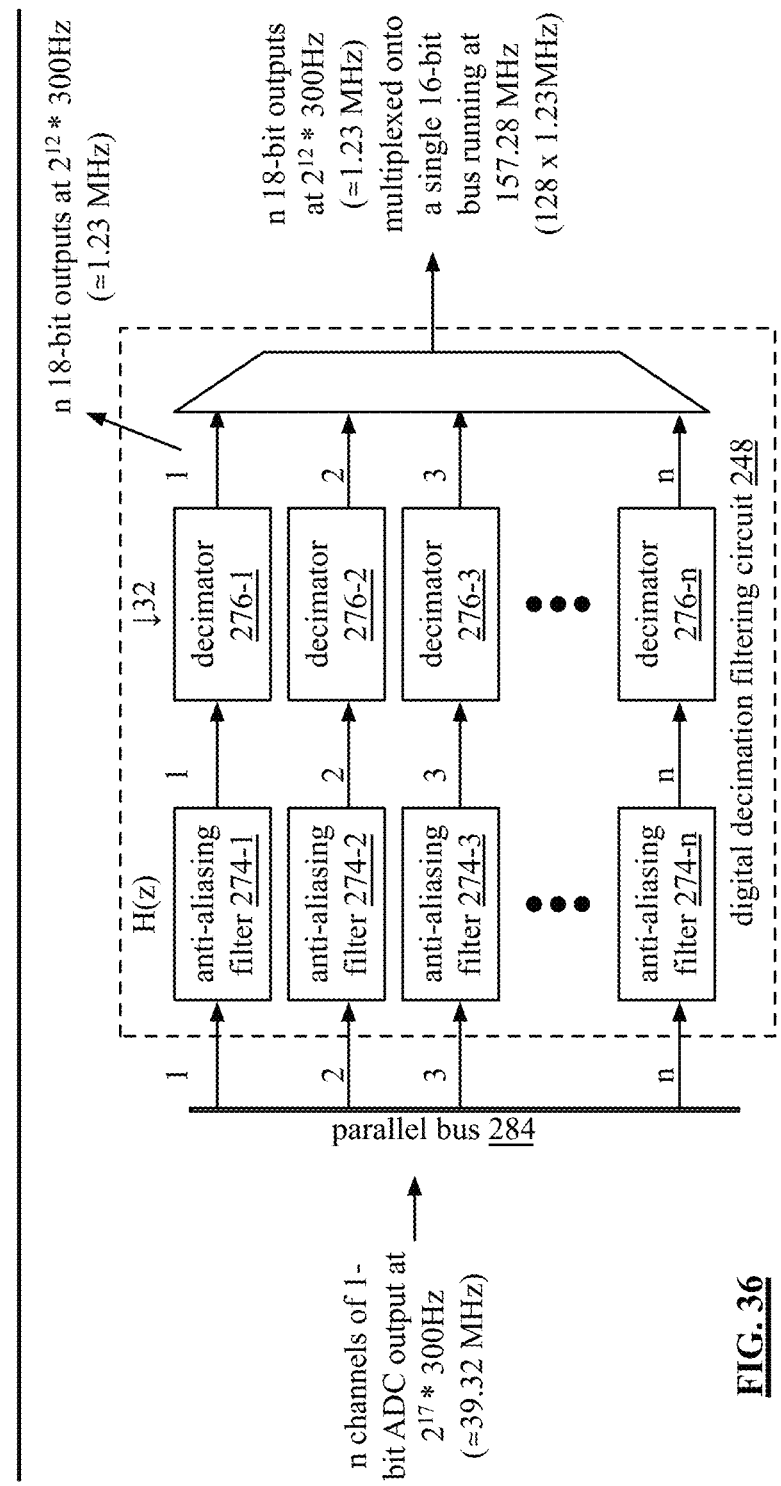
FIG. 36 is a schematic block diagram of another embodiment of digital decimation filtering circuit.

FIG. 36 is a schematic block diagram of another embodiment of digital decimation filtering circuit 248. The digital decimation filtering circuit 248 includes anti-aliasing filters 274-1 through 274-n and decimators 276-1 through 276-n where n corresponds to n channels of 1-bit ADC output. As an example, anti-aliasing filters 274-1 through 274-n are 128-tap finite impulse response (FIR) filters. The n channels of ADC output are delivered to digital decimation filtering circuit 248 via an n-line parallel bus 284. Each channel of 1-bit data from the ADC is filtered with a corresponding anti-aliasing filter 274-1 through 274-n and decimated by a factor of 32 by a corresponding decimator 276-1 through 276-n to produce n outputs at the digital decimation filtering circuit 248 output rate.

For example, digital decimation filtering circuit 248 takes 128 channels of 1-bit output at 39.32 MHz from the ADC and filters each channel with an anti-aliasing filter with a decimation factor of 32 producing 128 18-bit outputs at a sample rate of approximately 1.23 MHz. For example, the 128 18-bit outputs are multiplexed onto a single bus running at approximately 157.29 MHz (i.e., 128 ($2^7$) channels×the output rate 1.23 MHz ($2^{12}$×300 Hz) or 219×300 Hz=approximately 157.29 MHz). As a specific example, the output bus is a 16-bit bus with eight idle time slots (e.g., 8 bits are needed to multiplex the 128 channels which is an 8-bit binary number). The output bus runs at 128 times the output rate to allow for each channel to run through each anti-aliasing filter 274-1 through 274-n and be output onto a single bus. Alternatively, the 128 18-bit outputs may be output in parallel.

Figure 37:
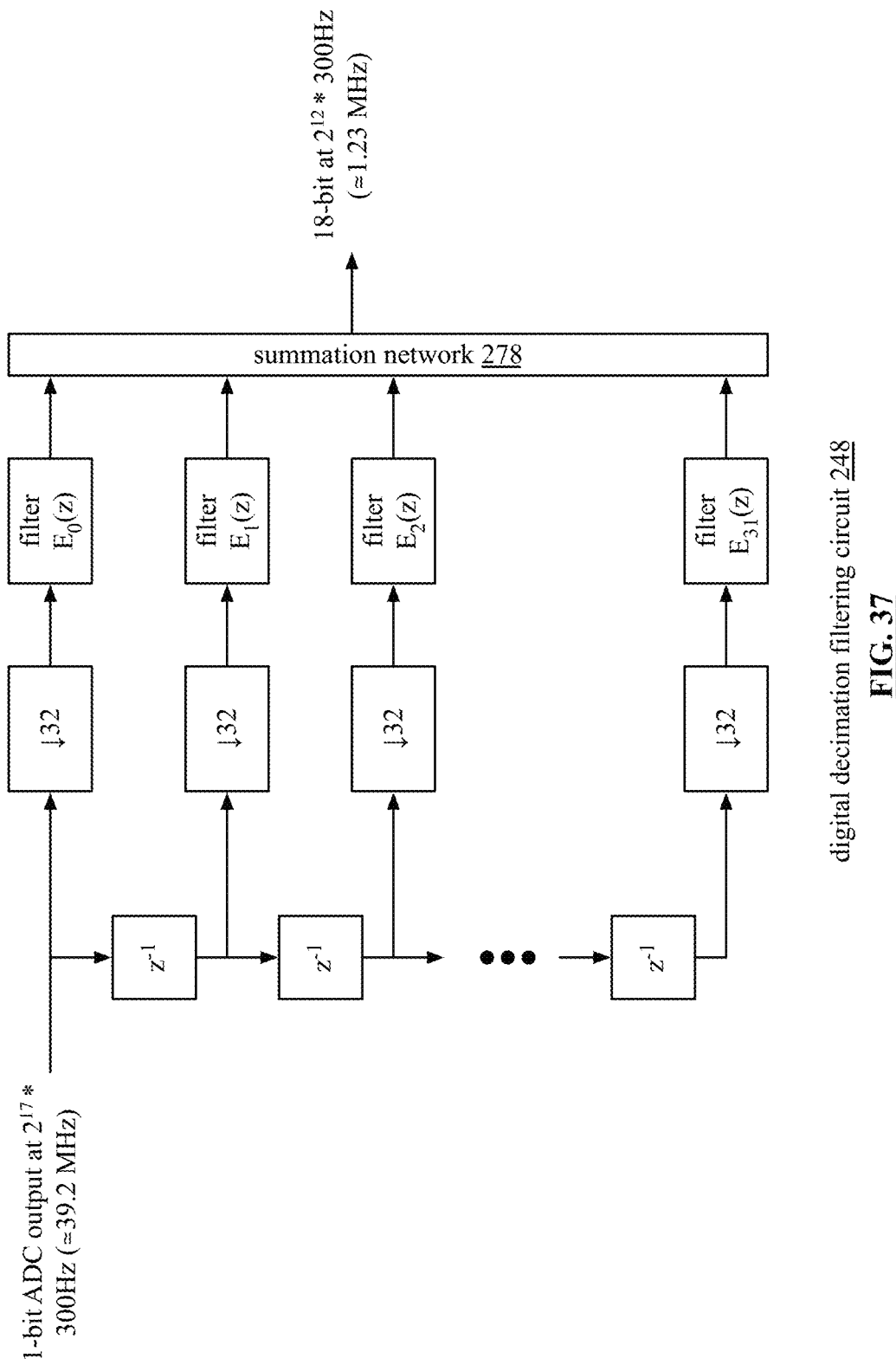
FIG. 37 is a schematic block diagram of another embodiment of digital decimation filtering circuit.

FIG. 37 is a schematic block diagram of another embodiment of digital decimation filtering circuit 248. In contrast to the 128-tap finite impulse response (FIR) anti-aliasing filter 274 and decimator 276 of FIGS. 31-36, the digital decimation filtering circuit 248 shown here includes 32 4-tap polyphase filters $E_0(z)$-$E_{31}(z)$ with coefficients e(n)=h(32n+1), n=0 . . . 3 and 1=0 . . . 31. Each polyphase filter includes a delay ($z^{-1}$) and a decimator ($\downarrow 32$) producing a result that is added by a summation network 278 to compute the final output.

In the example of FIGS. 31-36, the filter response is convolved with the full signal and many points that were just calculated are thrown away (e.g., the signal is filtered then decimated). Polyphase filters are a more efficient implementation for digital decimation filtering circuit 248 because the signal can be decimated prior to filtering and calculations are not wasted. Further, each polyphase filter in the digital decimation filtering circuit 248 runs at the slower digital decimation filtering circuit 248 output rate of 1.23 MHz (in comparison to the 128 FIR filter which runs at 39.32 MHz).

In this example, 32 polyphase filters are needed because the decimation rate is 32. Each sample on the input to digital decimation filtering circuit 248 is delivered to just one of the polyphase filters. 32 1-bit input samples (e.g., from the 1-bit ADC output stream at 39.32 MHz) are loaded into the 32 polyphase filters starting from the bottom (at stage 0) and working up. After 32 1-bit samples are loaded, the polyphase filters run to generate a single output point (e.g., an 18-bit output at 1.23 MHz). The procedure is repeated for the next 32 samples.

Figure 38:
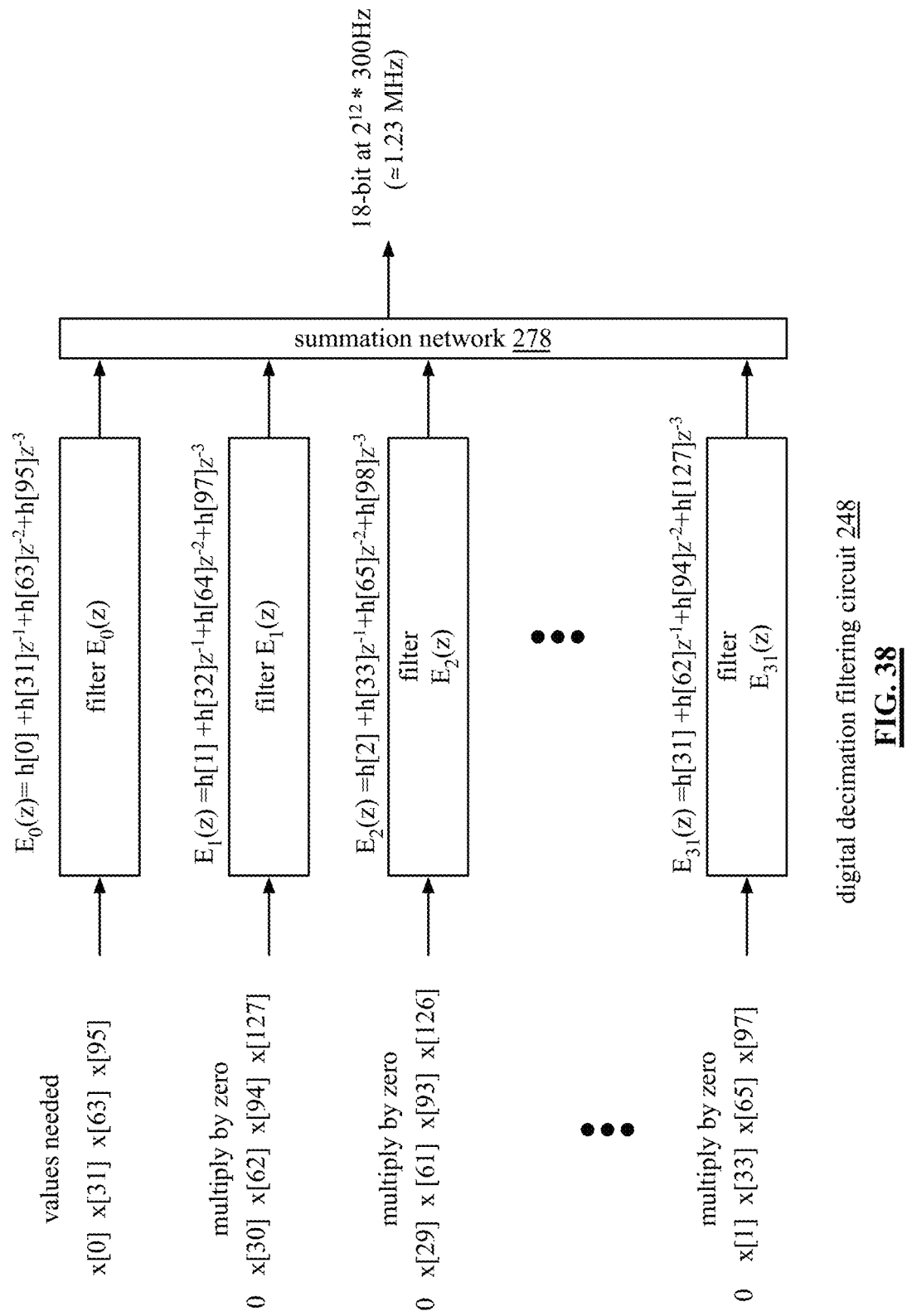
FIG. 38 is a schematic block diagram of an example of polyphase filters of digital decimation filtering circuit.

FIG. 38 is a schematic block diagram of an example of polyphase filters of digital decimation filtering circuit 248 shown in FIG. 37. Each polyphase filter $E_0(z)$-$E_{31}(z)$ includes 4 coefficients (e.g., 4 taps). The frequency response of the 128-tap FIR filter discussed in previous Figures can be rewritten as a summation of the frequency response of each filter $E_0(z)$-$E_{31}(z)$. Based on the decimation factor, the taps that produce an output can be included in one filter (e.g., $E_0(z)$ includes taps h[0], h[32]$z^{-1}$, h[64]$z^{-2}$ and h[96]$z^{-3}$ which extract data from the input signal at every $32^{nd}$ point. The input signal x[n] can then be broken up in order to decimate the signal prior to input into filters $E_0(z)$-$E_{31}(z)$. For example, x[n] values x[0], x[32], x[64], and x[96] are input into filter $E_0(z)$ which with produce the values needed for decimation. Other inputs are multiplied by zero in order to not waste calculations done by the filters. Summation network 278 adds the results (e.g., y[0], y[1], y[2], and y[3]) from the filters $E_0(z)$-$E_{31}(z)$ to produce an 18-bit output at the output rate of 1.23 MHz.

FIG. 39 is an example of a frequency band having n frequency channels 282. FIG. 42 is similar to the example of FIG. 35 except now the frequency band of interest 280 is shown in comparison to the decimation frequency fd=1.23 MHz after going through the digital decimation filtering circuit 248 (e.g., the digital decimation filtering circuit 248 cut off noise at higher frequencies than 1.23 MHz and reduced the sampling rate to 1.23 MHz). The frequency band of interest 280 begins at f1 and ends at fn. Frequency band of interest 280 includes channels 282 f1-fn spaced out at a desired channel spacing 255 (e.g., the data output rate of 300 Hz or another frequency). With a channel spacing of 300 Hz (e.g., the data output rate), the frequency band of interest is 128×300 Hz=38.4 KHz wide (i.e., nxchannel spacing 300 Hz). If f1 is at 100 KHz, the frequency band of interest 280 spans from 100 Khz to 138.4 KHz.

FIG. 40 is a schematic block diagram of an embodiment of digital bandpass filter (BPF) circuit 250. Digital bandpass filter (BPF) circuit 250 includes one or more finite impulse response (FIR) filters, one or more cascaded integrated comb (CIC) filters, one or more infinite impulse response (FIR) filters, one or more decimation stages, one or more fast Fourier transform (FFT) filters, one or more discrete Fourier transform (DFT) filters, and/or one or more polyphase filters. BPF 250 includes a plurality of taps having coefficients set to produce a bandpass region approximately centered at the oscillation frequency of the analog reference signal (e.g., 100 KHz) and having a bandwidth tuned for filtering a pure tone (e.g., f1). BPF 250 has a frequency response H(z).

Digital BPF circuit 250 takes the output of the digital decimation filtering circuit 248 (e.g., the 18-bit output at approximately 1.23 MHz representative of signal s1 at frequency f1) and shifts to the bandpass for frequency f1 (e.g., 100 KHz). When the output of the digital decimation filtering circuit 248 includes n 18-bit outputs from different channels (e.g., the analog input signal includes pure tone components f1-fn of FIG. 42), a digital BPF circuit is needed for each output to isolate each pure tone component.

Digital BPF circuit 250 applies a very narrow bandpass filter and outputs an affect value 254 (si) having real and imaginary components at the output frequency of 300 Hz. Because embedded data is a sinusoid (e.g., a pure tone) the desired information is at frequency f1 and based on magnitude and/or phase. Therefore, the bandpass filter can be very narrow (e.g., less than 0.05 the channel spacing (e.g., 10 Hz)) to capture the desired signal.

FIG. 41 is an example frequency response H(z) of digital bandpass filter (BPF) circuit 250. As an example, the digital BPF circuit 250 is a discrete Fourier transform (DFT) filter with length N. For example, digital BPF circuit 250 has a length 4096 in order to filter 4096 18-bit inputs to produce 1 48-output. A sin x/x (e.g., or "sinc") frequency response is shown. The sinc frequency response has a "notch" response (e.g., it can reject the line frequency when set to that frequency). With a sampling frequency of 1.23 MHz and length 4096, the frequency bin (i.e., intervals between samples in frequency domain) resolution is 1.23 MHz/4096=300 Hz. The notch position is also directly related to the output data rate. As shown, the sinc frequency response is equal to zero at integer multiples of the output data rate of 300 Hz (e.g., 600 Hz, 900 Hz, 1200 Hz, and so on).

FIG. 42 is an example frequency response H(z) of a digital bandpass filter (BPF) circuit 250. A finite impulse response (FIR) filter has a sin x/x (e.g., or "sinc") frequency response as shown. The sinc frequency response has a "notch" response (e.g., it can reject the line frequency when set to that frequency). With the signal s1 shifted to bandpass, a very narrow bandpass filter can be applied. For example, a bandpass filter of 10 Hz with center frequency 5 Hz is applied to isolate the pure tone. As shown, the first notch position is located at 10 Hz with a center frequency of 5 Hz.

FIGS. 43A-43D are examples of processing a signal by digital bandpass filter (BPF) circuit 1 250. BPF circuit 1 250 includes a plurality of taps having coefficients set to produce a bandpass region approximately centered at the oscillation frequency of an analog reference signal for s1 (e.g., 100 KHz) and having a bandwidth tuned for filtering a digital signal having frequency components at f1, f2, and f3. In FIG. 43A, digital BPF circuit 1 250 receives the output of the digital decimation filtering circuit 248 (e.g., the 18-bit output at approximately 1.23 MHz representative of signals s1 at frequency f1, s2 at frequency f2, and s3 at frequency f3).

In FIG. 43B digital BPF circuit 1 250 shifts the 18-bit output at approximately 1.23 MHz representative of signals s1 at frequency f1, s2 at frequency f2, and s3 at frequency f3 to the bandpass for frequency f1 (e.g., 100 KHz). For example, s1 is now at 0 Hz and s2 and s3 are spaced out evenly from s1 (e.g., at 300 Hz and 600 Hz).

In FIG. 43C, digital BPF circuit 1 250 applies a very narrow bandpass filter to isolate s1. Because the embedded data is a sinusoid (e.g., a pure tone) the desired information is at frequency f1 (e.g., 0 Hz) and based on magnitude and/or phase. Therefore, the bandpass filter can be very narrow (e.g., less than 0.05 the channel spacing (e.g., 10 Hz)) to capture the desired signal.

In FIG. 43D, digital BPF circuit 1 250 outputs an affect value 254 (s1) having real and imaginary components at the output frequency of 300 Hz. The affect value 254 (s1) is 48 bits with a 24-bit real part and a 24-bit imaginary part.

FIGS. 44A-44D are examples of processing a signal by digital bandpass filter (BPF) circuit 2 250. BPF circuit 2 250 includes a plurality of taps having coefficients set to produce a bandpass region approximately centered at the oscillation frequency of an analog reference signal for s2 (e.g., 100.3 KHz) and having a bandwidth tuned for filtering a pure tone (e.g., f2). In FIG. 47A, digital BPF circuit 2 250 receives the output of the digital decimation filtering circuit 248 (e.g., the 18-bit output at approximately 1.23 MHz representative of signals s1 at frequency f1, s2 at frequency f2, and s3 at frequency f3).

In FIG. 44B digital BPF circuit 2 250 shifts the 18-bit output at approximately 1.23 MHz representative of signals s1 at frequency f1, s2 at frequency f2, and s3 at frequency f3 to the bandpass for frequency f2 (e.g., 100.3 KHz). For example, s2 is now at 0 Hz and s3 at 300 Hz. S1 may fold over and be aligned with s3 or another frequency.

In FIG. 44C, digital BPF circuit 2 250 applies a very narrow bandpass filter to isolate s2. Because the embedded data is a sinusoid (e.g., a pure tone) the desired information is at frequency f2 (e.g., 0 Hz) and based on magnitude and/or phase. Therefore, the bandpass filter can be very narrow (e.g., less than 0.05 the channel spacing (e.g., 10 Hz)) to capture the desired signal.

In FIG. 44D, digital BPF circuit 2 250 outputs an affect value 254 (s2) having real and imaginary components at the output frequency of 300 Hz. The affect value 254 (s2) is 48 bits with a 24-bit real part and a 24-bit imaginary part.

Figure 45A:
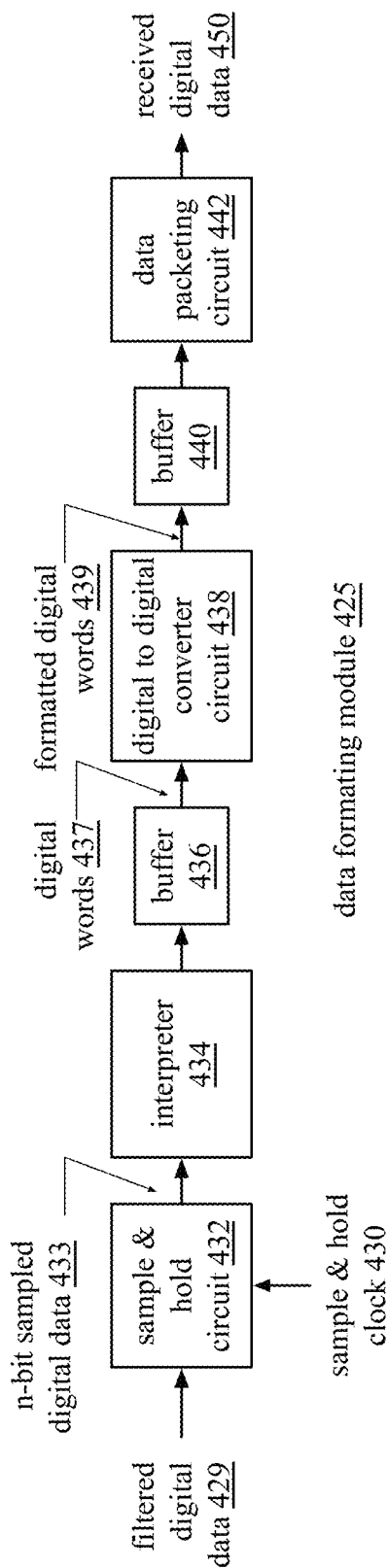
FIG. 45A is a schematic block diagram of an embodiment of data formatting module.

FIG. 45A is a schematic block diagram of an embodiment of a data formatting module 450 that includes sample & hold circuit 432, interpreter 434, buffer 436, digital to digital converter circuit 438, buffer 440, and data packeting circuit 442. Data formatting module 425 formats and packetizes filtered digital data 429 (e.g., the output of digital decimation filtering circuit 248, bandpass filter 250, etc.) in accordance with one or more receive parameters to produce received digital data 450.

Sample & hold circuit 432 samples and holds an "n"-bit digital value data of filtered digital data 429 (e.g., a pulse representative of 1-bit, 2-bit, etc., of data) received every data clock cycle from a digital filtering circuit at a sample & hold clock 430 rate to produce an n-bit sampled digital data 433 value. Interpreter 434 interprets the n-bit sampled digital data 433. For example, interpreter 434 converts n-bit sampled digital data 433 to a binary string. Interpreter 434 writes interpreted n-bit sampled digital data into buffer 436 operating according to a write rate/read rate clock cycle until a digital word 437 is formed (e.g., 8-bits of data, 16-bits of data, etc.). Buffer 436 outputs digital words 437 to digital to digital converter circuit 438 for further formatting.

Digital to digital converter circuit 438 formats digital words 437 to formatted digital words 439 and writes formatted digital words 439 to buffer 440. Data packeting circuit 442 creates data packets from formatted digital words 439 and outputs data packets as received digital data 88.

Figure 45B:
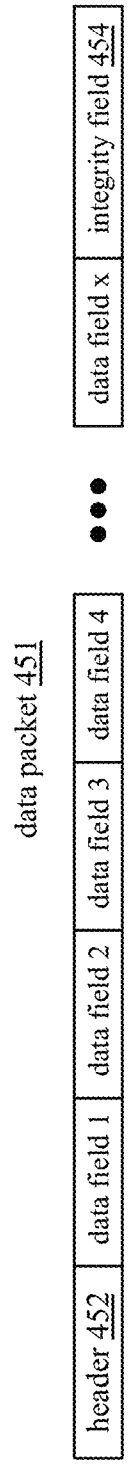
FIG. 45B is a schematic block diagram of an embodiment of received digital data.

FIG. 45B is an example of received digital data 450 formatted as a data packet 451. Data packet 451 includes a header 452, data fields 1-x, and integrity field 454. Header 452 includes information about the data carried by packet 251. For example, header 452 information includes packet length, synchronization, packet number, protocol, and/or addressing information. Data fields 1-x contain one or more digital words of any specified byte size (e.g., 64 bytes). Integrity field 242 includes error checking such as a Cyclic Redundancy Check (CRC), checksum, hash of the packet. If an error is detected via integrity field 454, the packet may be resent (i.e., feedback error correction) or an error-correcting code is used to correct certain errors (i.e., feed forward error correction such as Reed Solomon, etc.).

Figure 46:
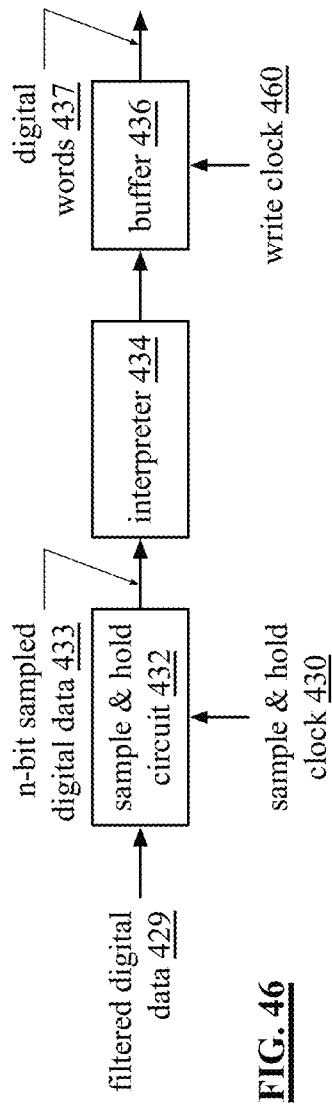
FIG. 46 is a schematic block diagram of an embodiment of a portion of a data formatting module.

FIG. 46 is a schematic block diagram of an embodiment of a portion of a data formatting module 425 that includes sample & hold circuit 432, interpreter 434, and buffer 436. Sample & hold circuit 432 samples and holds an n-bit digital value data of filtered digital data 204 (e.g., a pulse representative of 1-bit, 2-bit, etc., of data) received every data clock cycle from a digital filtering circuit (e.g., BPF 250) at a sample & hold clock 430 rate to produce an n-bit sampled digital data 433 value. Interpreter 434 interprets the n-bit sampled digital data 433. For example, interpreter 434 converts n-bit sampled digital data 433 to a binary string. Interpreter 434 writes interpreted n-bit sampled digital data into buffer 436 operating according to a write clock 460 cycle until a digital word 437 is formed (e.g., 8-bits of data, 16-bits of data, etc.).

Figure 47:
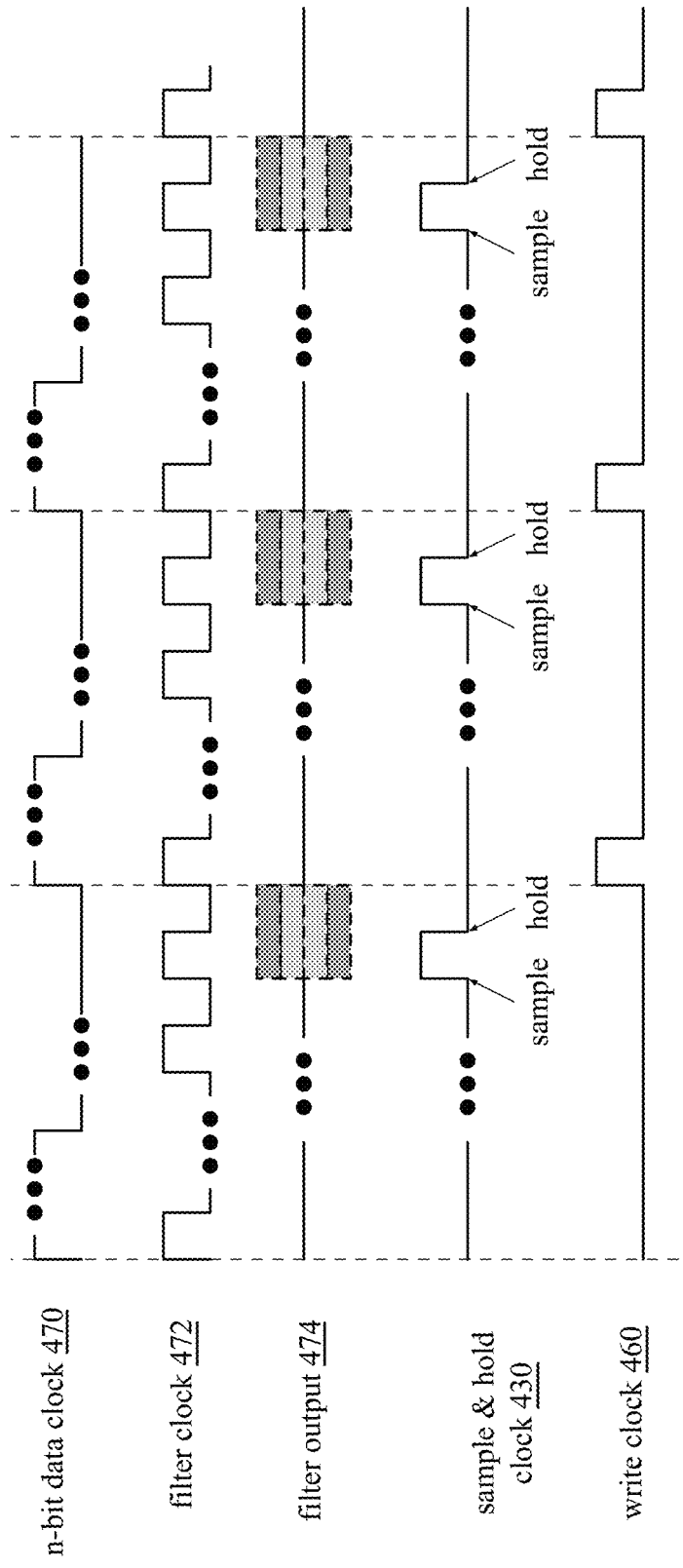
FIG. 47 is an example of clock signals of the portion of formatting module of FIG. 46.

FIG. 47 is an example of clock signals of the portion of formatting module 425 of FIG. 46. Sample & hold circuit 432 samples and holds an n-bit digital value data of filtered digital data 429 (e.g., a pulse representative of 1-bit, 2-bit, etc., of data) received every n-bit data clock 212 cycle. Filter clock 472 (e.g., of digital BPF 250) operates at "x" (e.g., where "x" is the number of filter taps) times the n-bit data clock 470. At the end of the data clock 470 cycle (e.g., after x cycles of the filter clock 472), the filter output 474 (e.g., a pulse representative of the input data (e.g., logic 1 or 0 for 1-bit or logic 00, 01, 10, or 11 for 2-bit based on magnitude, phase, and/or frequency, etc.)) is output as filtered digital data 429 to sample & hold circuit 432.

Sample & hold clock 430 is set to capture/sample the filtered digital data 429 on the rising edge of every filter output 474 for a certain time (e.g., ½ filter cycle) and hold for a certain time (e.g., ½ filter cycle). Sample & hold circuit 432 outputs n-bit sampled digital data 433 to interpreter 434 as discussed with reference to FIG. 46. Interpreter 434 writes interpreted n-bit sampled digital data (e.g., a plurality of n-bit digital values on an-bit digital value by n-bit digital value basis) into buffer 436, where buffer 436 stores the plurality of n-bit digital values on an n-bit digital value by n-bit digital value basis in accordance with a write clock operating according to a write clock cycle 460 until a digital word 437 is formed (e.g., 8-bits of data, 16-bits of data, etc.).

Figure 48:
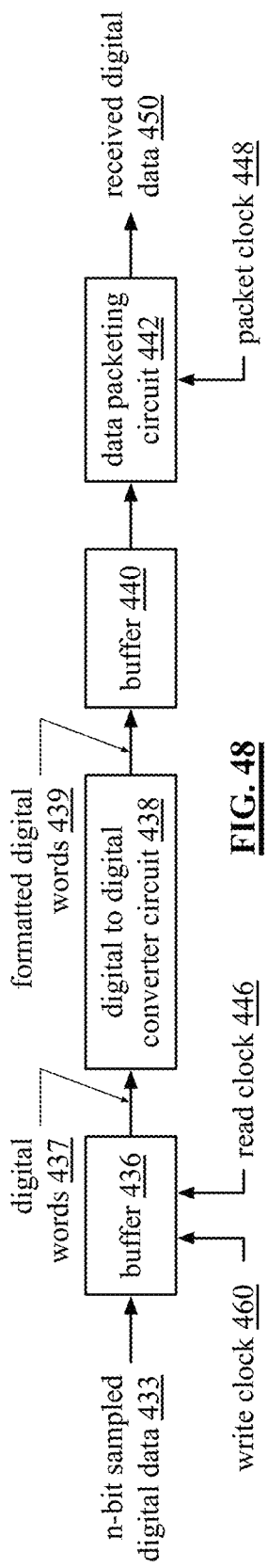
FIG. 48 is a schematic block diagram of an embodiment of a portion of a data formatting module.

FIG. 48 is a schematic block diagram of an embodiment of a portion of a data formatting module 425 that includes buffer 436, digital to digital converter circuit 438, buffer 440, and data packeting circuit 442. Interpreter 434 writes interpreted n-bit sampled digital data into buffer 436 operating according to a write clock 460 until a digital word 437 is formed. Buffer 436 outputs digital words 437 according to a read clock 246 to digital to digital converter circuit 224 for further formatting. Digital to digital converter circuit 224 formats digital words 234 to formatted digital words 236 and writes formatted digital words 236 to buffer 226. Data packeting circuit 228 creates data packets at a packet clock 248 rate from formatted digital words 236 and outputs data packets as received digital data 88.

Figure 49:
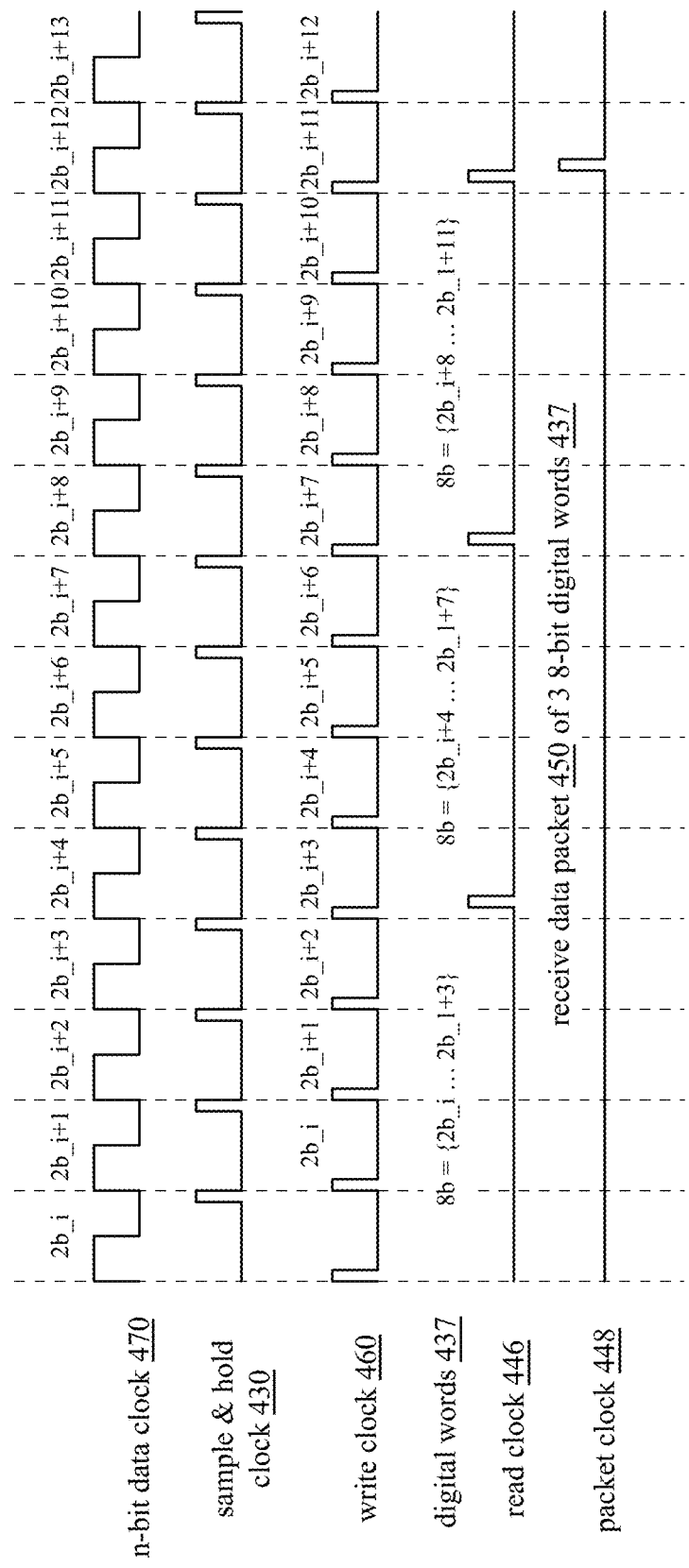
FIG. 49 is a schematic block diagram of clock signals of the portion of formatting module of FIG. 48.

FIG. 49 is an example of clock signals of the portion of formatting module 425 of FIG. 48. In this example, "n" is equal to 2, a digital word 437 is 8-bits, and a packet includes 3 digital words. Sample & hold clock 430 is set to capture/ sample the filtered digital data 429 on the rising edge of every filter output for a certain time (e.g., ½ filter cycle) and hold for a certain time (e.g., ½ filter cycle). At the end of the data clock cycle (e.g., after x cycles of the filter clock 472, where the filter has x taps), the filter output (e.g., a pulse representative of the input data (e.g., logic 00, 01, 10, or 11 for 2-bit based on magnitude, phase, and/or frequency, etc.)) is output as filtered digital data 429 to sample & hold circuit 432.

Interpreter 434 writes interpreted n-bit sampled digital data into buffer 436, where buffer 436 stores a plurality of interpreted n-bit digital values on an n-bit digital value by n-bit digital value basis in accordance with a write clock operating according to a write clock cycle 460 until a digital word 437 is formed (e.g., 8-bits of data). Buffer 436 outputs digital words 437 according to read clock 446. Write clock 460 is set to capture data during the hold of sample & hold clock 430. As shown, it takes four write clock 460 cycles (plus one initial cycle) to form an 8-bit digital word 437. As such, read clock 446 is set to output data every 4 write clock cycles (plus one additional initial write cycle). Buffer 436 outputs formatted digital words 439 from digital to digital converter circuit 438 to data packeting circuit 442 in accordance with packet clock 448. Packet clock 448 cycle is set to capture data after three read clock 446 cycles because in this example, a packet consists of 3 8-bit digital words in this example.

Figure 50:
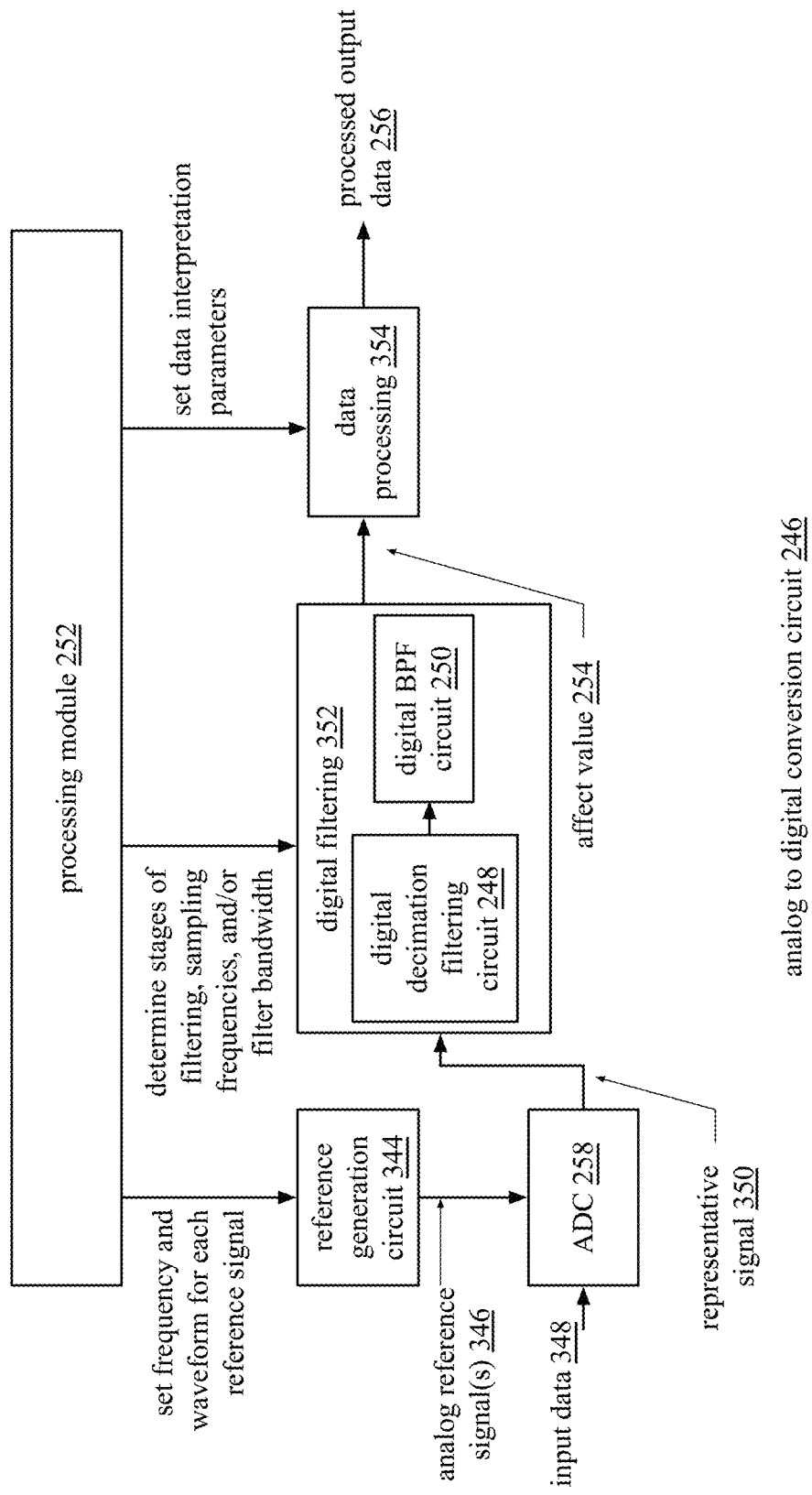
FIG. 50 is a schematic block diagram of another embodiment of analog to digital conversion circuit.

FIG. 50 is a schematic block diagram of an embodiment of processing module 252 controls within the analog to digital conversion circuit 246. Analog to digital conversion circuit 246 is a confined data communication system in which all variables are set by the processing module 252 and controlled for desired data processing. Processing module 252 is operable to control every stage of analog to digital conversion circuit 246 in order to produce the desired output 256.

For example, processing module 252 sets the frequency and waveform for each oscillating reference signal via reference generation circuit 344 (e.g., reference signal generator 149) to produce analog reference signals 346. DC component input data 348 is embedded in each analog reference signal 346. Processing module 252 also sets the sampling rate of ADC 258. ADC 258 processes the analog signal containing the analog reference signal and the DC component and outputs representative signal 350 to the digital filtering stages 352 (e.g., digital decimation filtering circuit 248 and digital BPF circuit 250).

Processing module 252 determines the stages (e.g., taps) of each filter, the sampling frequencies, the filter bandwidth, and any other desired filter parameters. Processing module 252 determines digital filtering parameters based on a desired output rate, desired linearity, and other factors. Processing module 252 inputs known frequencies and mutual frequency selections into the coefficient processor for digital BPF filters.

The digital filtering stage 352 produces an affect value 254 to be interpreted by the processing module 252 at the data processing circuit 354 stage. Processing module 252 sets data interpretation parameters based on the data output rate and the nature of the input data 348.

For example, input data 348 may be communicating one or more of current (I), voltage (V), or impedance (Z) changes. For example, if the input is a voltage measurement with a constant current, processing module 252 can analyze the voltage change to determine an impedance change value. Based on the data interpretation parameters, processing module 252 interprets affect value 254 and produces processed output data 256.

Various aspects, embodiments, and/or examples of the disclosure (and/or their equivalents) are directed towards configuration of one or more components of one or more programmable drive sense units (DSUs) and/or one or more components associated with one or more DSUs (e.g., not specifically implemented within the one or more DSUs but instead external to the one or more DSUs). Note that such a DSU may be implemented in any of a variety of architectures, and several different implementations are described herein. Note that the configuration of a DSU, regardless of the particular implementation, may be performed in a variety of ways. Examples of such configuration include one or more inputs provided to one or more processing modules that is configured to facilitate the configuration of one or more components of the DSU and/or one or more components associated with the DSU. In some examples, these one or more inputs may be provided to one of more processing modules in any of a variety of ways (e.g., from one or more other processing modules, from a computing device, from a computing device that receives input from a user or programmer via a user interface of the computing device, via one or more communication links, via one or more communication networks, etc. In other examples, these one or more inputs are based on outputs and more inputs of one or more components of a DSU and/or one or more components associated with one or more DSUs. Note that such operational parameters that are used to configure the one or more programmable drive sense units (DSUs) and/or one or more components associated with one or more DSUs may be predetermined (e.g., known beforehand, a priori, etc.), may be determined in real time, may be based on prior historical performance, and/or may be based on any such combination of combination of considerations.

In an example of operation and implementation, the one or more processing modules is configured to process the one or more inputs, then determines whether to perform any configuration of one or more components of the DSU and/or one or more components associated with the DSU. Based on a determination to configure of the one or more components of the DSU and/or the one or more components associated with the DSU, the one or more processing modules is configured to determine the one or more operational parameters to be used to configure one or more components of a DSU and/or one or more components associated with the DSU (e.g., such as one or more components external to the DSU). The one or more processing modules is also configured to facilitate the configuration of the one or more components of the DSU and/or the one or more components associated with the DSU based on the one or more operational parameters. Note that there may be instances when the one or more processing modules processes the one or more inputs, then determines that no configuration of the one or more components of the DSU and/or the one or more components associated with the DSU (e.g., the current configuration of the one or more components of the DSU and/or the one or more components associated with the DSU is appropriate for the current implementation). Also, in certain examples, note also that subsequent configuration of the one or more components of the DSU and/or the one or more components associated with the DSU is performed based on one or more criterion/criteria (e.g., change of operational conditions, change of environmental conditions, periodically checking/determining whether to perform subsequent configuration, etc.).

Figure 51A:
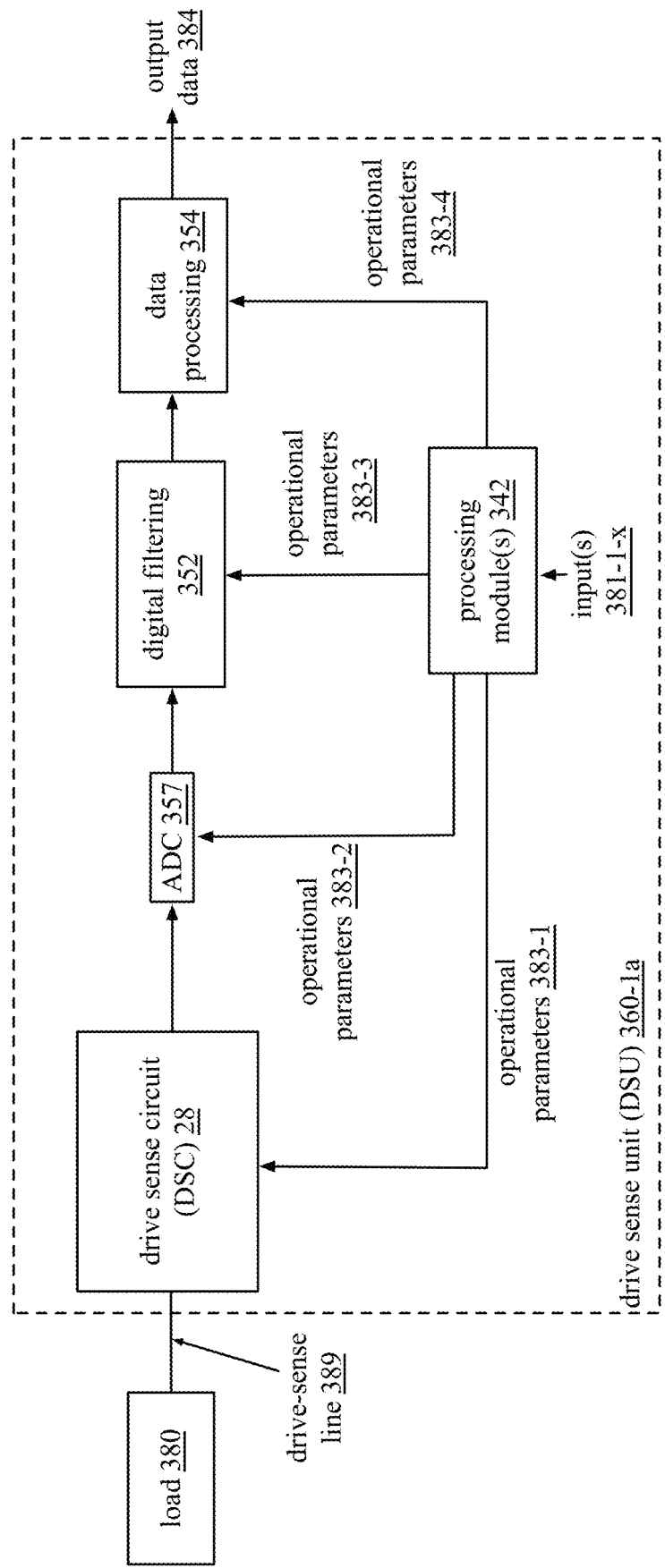
FIG. 51A is a schematic block diagram of an embodiment of drive sense unit.

FIG. 51A is a schematic block diagram of an embodiment of a programmable drive sense unit (DSU) 360-1a that includes a load 380 coupled via a drive-sense line to a drive-sense circuit (DSC) 28, an analog to digital converter 357, a digital filtering circuit 352, a data processing circuit 354, and one or more processing module 342. In this diagram as well as others included herein, note that the load 380 is configured to be driven and simultaneously sensed via a single-line. Each of the above mentioned circuits and/or modules may be implemented by a corresponding similar circuit and/or module of one or more other Figures. For example, the ADC 357 may be implemented by another ADC (e.g., ADC 258, ADC 204, etc.) as discussed in the previous Figures, the digital filtering circuit 352 may be implemented by another digital filtering circuit (e.g., digital BPF 234, digital decimation filtering 248, digital filtering 352, etc.) as discussed in the previous Figures, and the processing module 342 may be implemented by another processing module (e.g., processing module 252, processing module 42, etc.) as discussed in the previous Figures.

In general, the drive sense unit 360-1a is configured to produce output data 384 regarding sensing the load 380 in accordance with one or more load sensing objectives, data processing objectives and/or desired output data. The operation of DSU 360-1a is based on operational parameters 383-1 through 383-4 provided by one or more processing modules 342. The one or more processing modules 342 is configured to generate the operational parameters based on one or more inputs 381 (shown as inputs 381-1 to 381-x in the diagram, where x is a positive integer). In some examples, note that the one or more processing modules 342 is configured to receive as few as one input 381-1 that is used to generate operational parameters 383-1 through 383-4.

In one example, the one or more processing modules 342 is configured to determine the operational parameters 383-1 through 383-4 based on a number of loads to be sensed, a type of sensing (e.g., change in impedance, self-capacitance, frequency response, etc.) to be performed by the loads and/or a nature of the sensing (e.g., sensing a human touch, sensing a human movement, sensing a physical world parameter (e.g., temperature, humidity, pressure, velocity of object, etc.)).

One or more of the load sensing objectives, data processing objectives, and the desired characteristics of output data for sensing load 380 are interdependent and/or dependent on the load. For example, the one or more processing modules 342 is configured to determine an output sampling rate (e.g., 300 Hertz (Hz)) for sensing the load 380. The output sampling rate affects the bandwidth of digital filtering 352, which in turn affects the signal to noise ratio (SNR) for sampling the signaling output from DSC 28. For example, as the bandwidth increases, the SNR generally decreases (due to ability of more noise to be within the filter bandwidth). The SNR affects the power for the sensing. For example, as SNR increases, the power of signaling on drive-sense line 389 needs to increase to maintain the SNR. Further, a frequency of signaling on drive-sense line 389 also affects the power and the SNR. For example, as the reference signal frequency increases, the SNR decreases and the power increases.

As such, the one or more processing modules 342 is configured to determine operational parameters 383-1 through 383-4 to achieve the load sensing objectives, the data processing objectives and the desired characteristics (e.g., format, type, rate, etc.) of the output data. For example, the one or more processing modules 342 is configured to determine a frequency (e.g., 300 Hz) for a reference signal, determine an SNR (e.g., 20 dB), and determine a bandwidth (e.g., 10 Hz) for a specific (e.g., 300 Hz) output data rate. As another example, the one or more processing modules 342 is configured to determine a frequency for the signaling that will produce a power below a first power threshold level and that also will provide an SNR above a first SNR threshold level when output data is at a specific output sampling rate.

The one or more processing modules 342 is then configured to generate operational parameters 383-1 through 383-4 to configure the DSU 360-1a to sense the load 380 in accordance with the load sensing objectives. For example, a first operational parameter is a waveform (e.g., sinusoidal) for a reference signal, a second operational parameter is a frequency for the reference signal, a third operational parameter is a number of filter stages to activate, a fourth operational parameter is filter coefficients for the number of activated filter stages, a fifth operational parameter is a number of clock signals for sampling and filtering. The one or more processing modules 342 is configured to provide the operational parameters to the DSC 28, the ADC 357, the digital filtering 352, and the data processing circuit 354 such that the load 380 is sensed in accordance with the load sensing objectives.

Figure 51B:
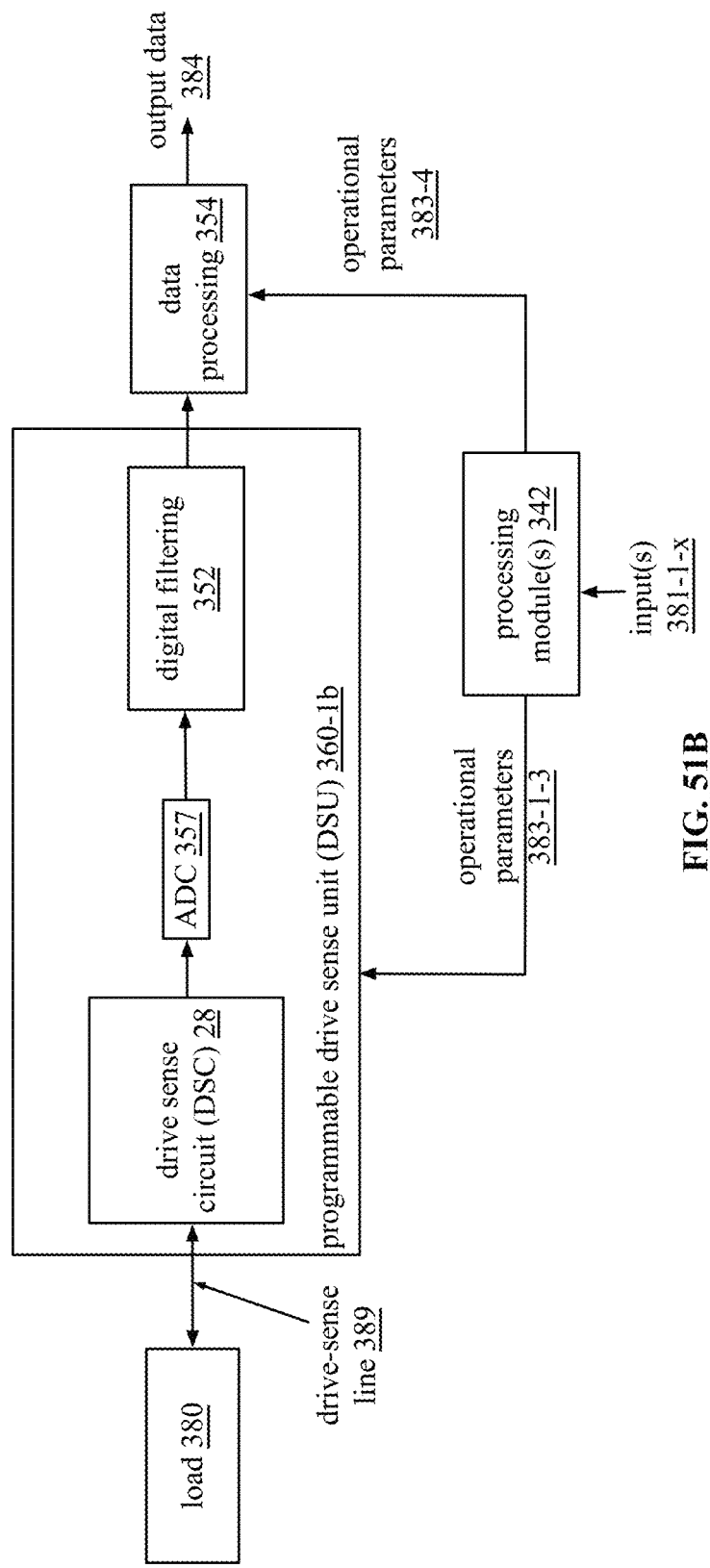
FIG. 51B is a schematic block diagram of another embodiment of drive sense unit.

FIG. 51B is a schematic block diagram of an embodiment of a programmable drive sense unit (DSU) 360-1b that is similar to FIG. 51A, with differences including the data processing circuit 354 and the one or more processing modules 342 being external to the DSU 360-1b. The one or more processing modules 342 provide operational parameters 383-1 through 383-3 to configure the DSU 360-1b to sense and/or drive the load 380.

Figure 51C:
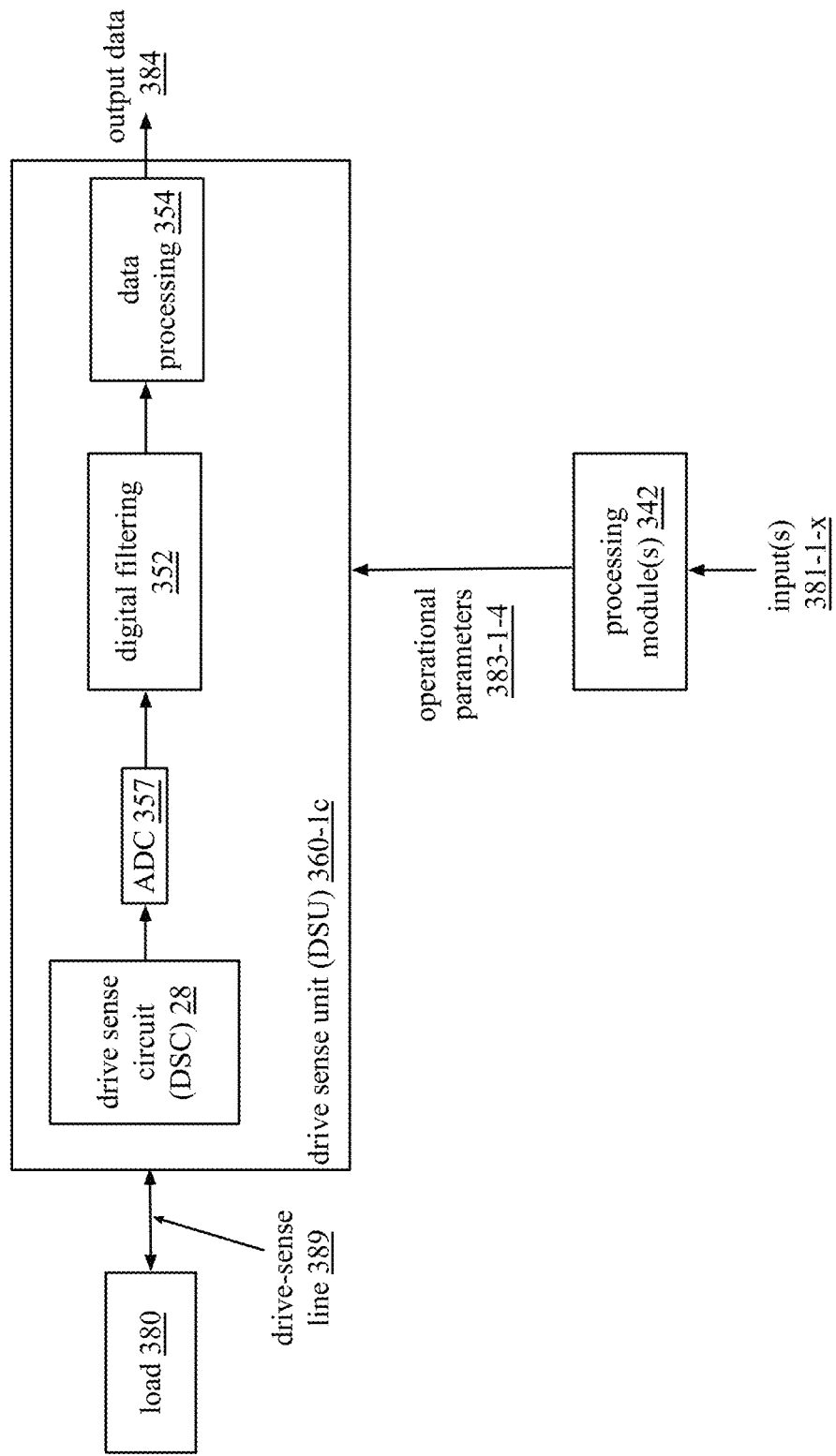
FIG. 51C is a schematic block diagram of another embodiment of drive sense unit.

FIG. 51C is a schematic block diagram of an embodiment of a programmable drive sense unit (DSU) 360-1c that is similar to FIG. 51C, with at least one difference being the DSU 360-1c includes the data processing circuit 354.

Figure 51D:
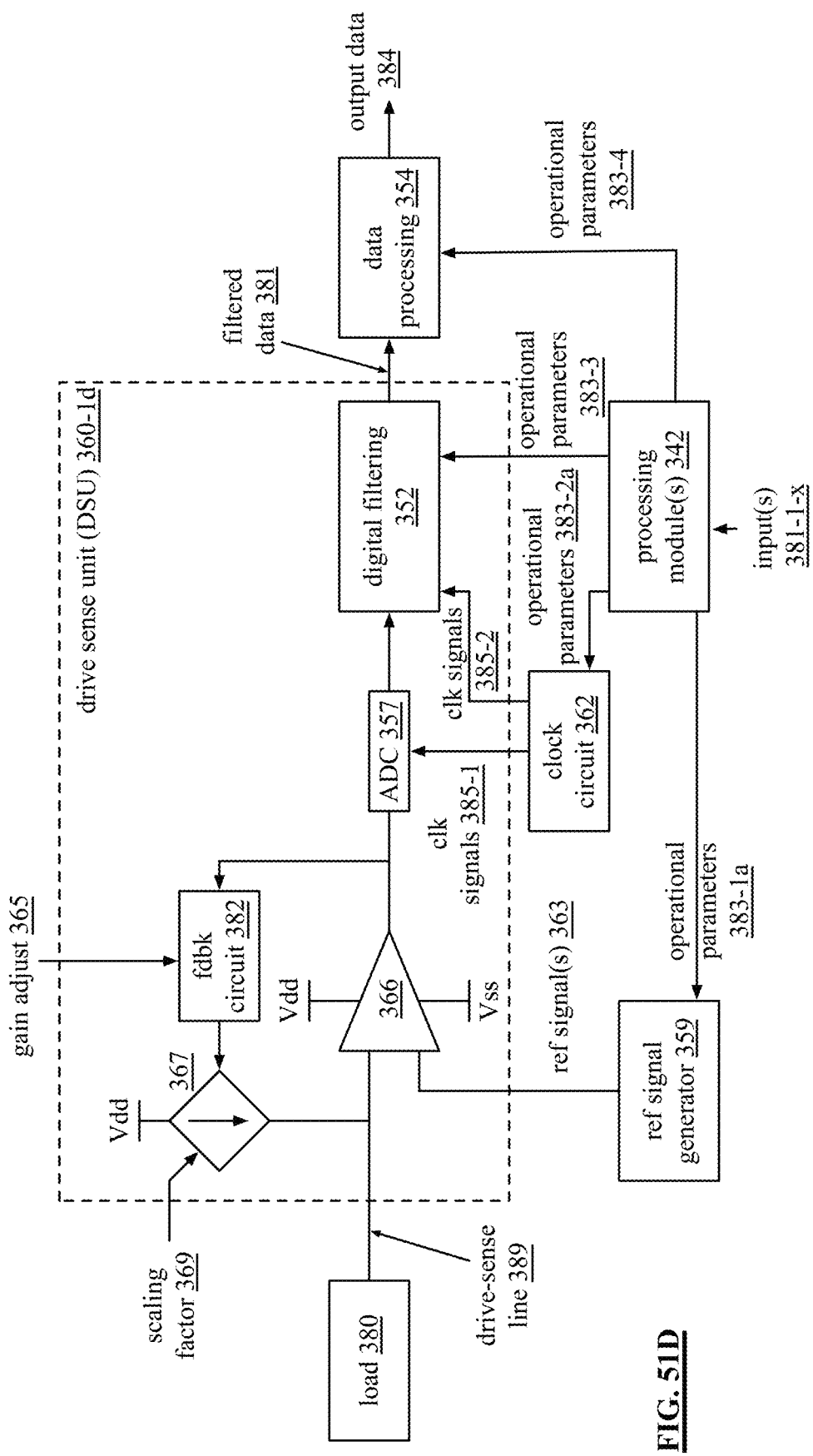
FIG. 51D is a schematic block diagram of another embodiment of drive sense unit.

FIG. 51D is a schematic block diagram of an embodiment of a programmable drive sense unit (DSU) 360-1d that includes an operational amplifier or comparator 366, a feedback circuit 382, a dependent current source 367, an analog to digital converter (ADC) 357, and a digital filtering circuit 352. Note that in an embodiment, the operational amplifier or comparator 366 may be replaced with a comparator.

In general, a processing module 342 of the one or more processing modules generates operational parameters 383-1 through 383-4 to program (e.g., configure) operation of the DSU 360-1d to drive and/or sense a load 380 in accordance with load sensing objectives. Examples of the load 380 include one or more of an electrode, a transducer, a variable capacitor, a variable resistor, an actuator, and/or any other component that includes one or more electrical characteristics. The DSU 360-1d generates filtered data 381 regarding the driving and/or sensing the load 380 in accordance with the operational parameters 383-1 through 383-4 (e.g., 383-1a, 383-2a, 383-3, etc.).

The data processing circuit 354 generates processed output data 384 based on the filtered data 381. In an example, the desired characteristics for the output data includes a desired output value type (e.g., absolute capacitance value, change in capacitance value, voltage value, etc.), a desired format (e.g., packet size), and/or a desired rate (e.g., 3 Mbits/sec, 300 Hz, etc.). The operational parameters 383-1 through 383-4 are generated based on one or more inputs 381-1 through 381-x (where x is a positive integer greater than or equal to 2). Note that as few as one input 381-1 is used in certain examples. Note also that the one or more inputs 381-1 through 381-x may be provided via a variety of sources including those described above and may one or more of a command from another processing module 342, previous output data 384, the load sensing objectives, data processing objectives, and/or desired output data. Note that certain inputs may be provided from one or more components of the DSU 360-1d and/or one or more components associated with the DSU 360-1d.

In an example of operation and implementation, the operational parameters 381-1 through 381-*x* include information regarding one or more of a number of reference signals, a waveform for at least one of the reference signals, a frequency for at least one of the reference signals, a phase for at least one of the reference signals, a gain 365 of a feedback circuit of the DSU, a scaling factor 369 for a dependent current supply of the DSU, a number of filtering stages to activate, a value of filter coefficients for each activated stage, a frequency for a rate of the output data 384, a number of clock signals 385, a waveform for at least one of the clock signals, and a frequency for at least one of the clock signals.

In an example of operation and implementation, the load sensing objectives include one or more of a sensitivity level, a signal to noise ratio, a sampling frequency, a power level, and a bandwidth (e.g., frequency band of interest 280 such as described with reference to FIG. 35, channel bandwidth, etc.). The load sensing objectives are based on one or more of a total number of loads to be sensed, a type of sensing to be performed by the load, and a nature of the sensing to be performed by the load. The type of sensing includes one or more of a self-capacitance, a mutual-capacitance, an impedance, a voltage, a current, a frequency response, and a tuning for a desired frequency. The nature of sensing includes one or more of sensing a touch, a hover, a movement, or a vital parameter regarding a human, a physical parameter (velocity of an object, etc.), and an environmental parameter (e.g., temperature, humidity, etc.). The data processing objectives include one or more of a filter channel bandwidth, filter slew rate, a resolution, a filter center frequency (e.g., for a channel), and an oversampling ratio (e.g., 8× the Nyquist rate, etc.).

In an example of operation, one or more processing modules 342 is configured to generate operational parameters 383-*x* (e.g., 383-1*a* through 383-4) for sensing the load 380 via the drive-sense line 389 in accordance with load sensing objectives (e.g., a signal to noise ratio (SNR) of >40 dB). The one or more processing modules 342 is configured to determine the load sensing objectives based on one or more of a type of sensing (e.g., an impedance change on a capacitive sensor (e.g., the load 380)), a number of loads (e.g., 1 (e.g., not in combination with another load)), and on a nature of the sensing (e.g., movement of human during a physical activity such as a sporting activity (e.g., basketball, tennis, rowing, etc.)).

The one or more processing modules 342 is also configured to determine data processing objectives and a desired characteristic for output data. For example, the one or more processing modules 342 is configured to determine an output data rate of data processing 354, a sampling rate for the ADC 357, and a number of taps of digital filtering 352 to enable, based on one or more of a desired or target (e.g., within threshold bounds, over a threshold, under a threshold, etc.) load sensing objective.

For example, in sensing human movement, the one or more processing modules 342 is configured to determine a desired output sampling rate of 300 Hz and a target channel bandwidth of 10 Hz. The processing module determines to enable 128 taps of the digital filtering based on the target bandwidth (e.g., 10 Hz) and determines an analog to digital conversion (ADC) sampling rate based on the output data rate (e.g., >Nyquist) and the load sensing objectives (e.g., SNR>40 dB).

Having generated the operational parameters 383-1-*x*, the processing module 342 provides the operational parameters to the reference signal generator 359, the clock circuit 362, the digital filtering circuit 352, the data processing circuit 354, the dependent current source (e.g., as scaling factor 369), and the feedback circuit 382 (e.g., as gain adjust 365). The DSU 360-1*d* drives and/or senses the load 380 via the drive-sense line 389 based on the operational parameters 383-1-*x* and functions to generate filtered data 381, which is provided to the data processing circuit 354 for subsequent processing in accordance with operational parameters 383-4.

In an example of operation and implementation, the one or more processing modules 342 is configured to modify an operational parameter 383. For example, an input 381 of input(s) 383-1 through 381-*x* indicates that load 380 has been replaced with a new load 380. As another example, the input 381 indicates the SNR threshold is lowered to >30 dB. As yet another example, the input 381 indicates an output data rate to sense the load has changed from 300 Hertz (Hz) to 5 Hz. The one or more processing modules 342 is then configured to generate updated operational parameters 383-1*a-x* to configure the DSU 360-1*d* in driving and/or sensing the load 380.

Figure 52:
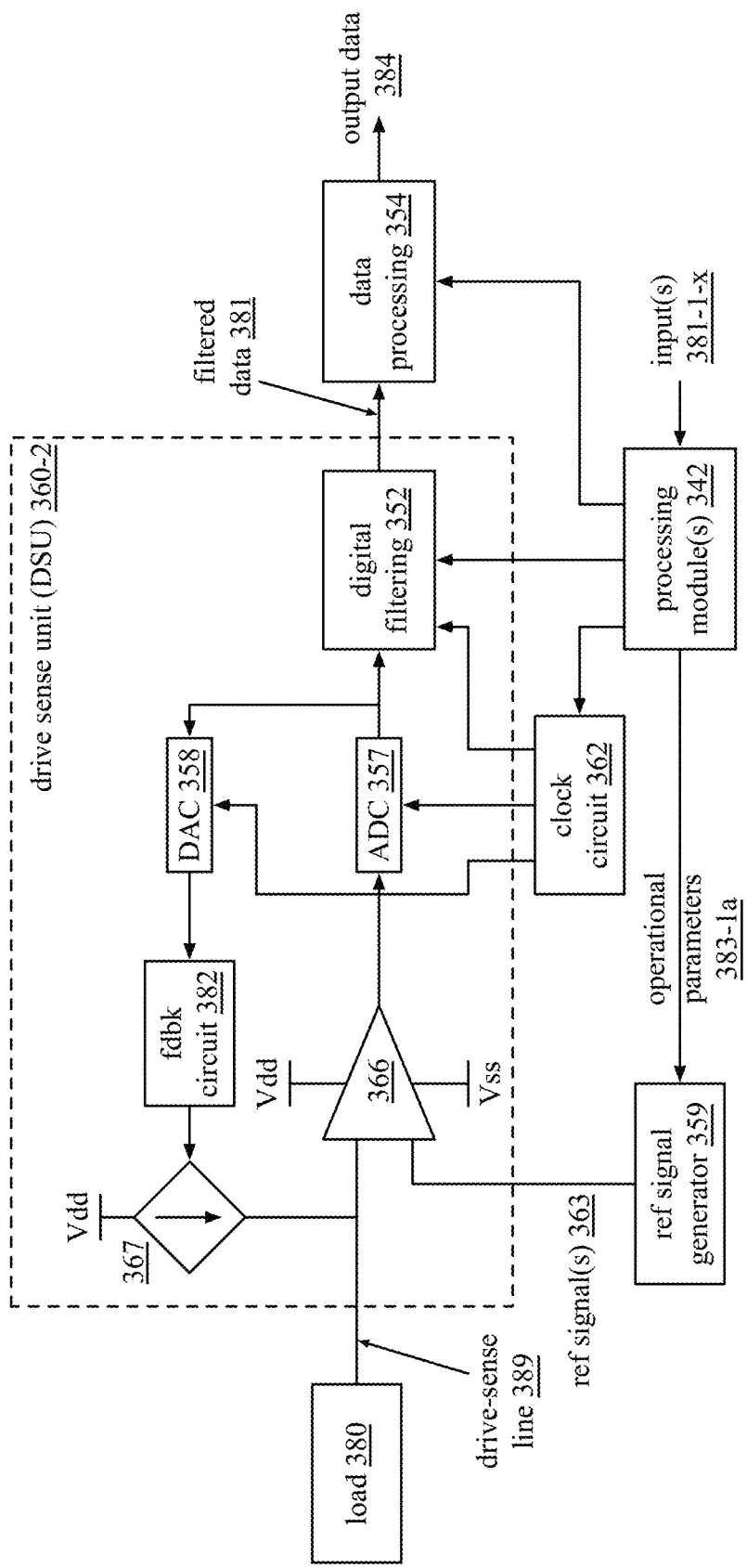
FIG. 52 is a schematic block diagram of another embodiment of drive sense unit.

FIG. 52 is a schematic block diagram of another embodiment of a drive sense unit (DSU) 360-2 that includes an operational amplifier or comparator 366, a feedback circuit 382, a dependent current source 367, an analog to digital converter (ADC) 357, a digital to analog converter (DAC) 358, and a digital filtering circuit 352. The present Figure is similar to FIG. 51, with at least one difference being that the feedback circuit 382 receives an error signal from the output of the DAC 358. In general, one or more processing modules 342 operate to configure the DSU 360-2 to generate filtered data 381 regarding sensing of the load 380.

In an example of operation, the one or more processing modules 342 is configured to determine the load sensing objectives. Examples of such load sensing objectives include sensing a touch on a touch screen via an electrode (e.g., load 380) and sensing a self-capacitance and/or mutual capacitance of the electrode. In one example, the one or more processing modules 342 is configured to determine a first frequency for the self-capacitance and a second frequency for the mutual capacitance. Reference signal generator 359 generates two reference signals 363 based on operational parameters 383-1*a* from the one or more processing modules 342, where the first reference signal has an oscillating component that oscillates at the first frequency, and the second reference signal has an oscillating component that oscillates at the second frequency. The one or more processing modules 342 is configured to determine the frequency based on one or more of the nature of sensing being a touch, the type of sensing being a capacitance, a desired power level (e.g., <2 milliwatts), a desired signal to noise ratio (SNR) (e.g., >40 dB), a desired bandwidth (e.g., approximately 20 Hz), a desired data output rate (e.g. 300 Hz), and a desired ADC sampling rate (e.g., oversample output data frequency by 25×).

The operational amplifier or comparator 366, the feedback circuit 382, and the dependent current source 367 operate in concert substantially to match signaling on the drive-sense line 389 with the reference signal(s) 363. As such, signaling on the line to the load includes the first and second frequencies. Note that by the DSU 360-2 providing a true tone (e.g., a pure sinusoid) in the frequency domain on the drive-sense line 389 allows for a high signal to noise ratio (e.g., due to no side band noise) at very low power (e.g., 5-75% of rail to rail voltage).

Clock circuit 362 generates clock signals for the DAC 358, the ADC 357, and the digital filtering 352 based on the operational parameters 383. For example, when the oversampling is 128× and the output data frequency is 345 Hz, the clock circuit generates a clock signal with a frequency of 44.16 KHz and provides the clock signal to the ADC 357. As another example, when the ADC sampling frequency is 44.16 KHz and the decimation factor is 16, clock circuit 362 generates another clock signal with a frequency of 2.76 KHz and provides the clock signal to the ADC 357 or the digital filtering circuit 352 based on whether the digital decimation filtering circuit 248 is implemented in the ADC or the digital filtering circuit 352.

As yet another example, the clock circuit 362 generates clock signals for the data filtering circuit 352 based on the output of the ADC and processing parameters that include one or more of digital word format, packet format, buffer size, and output data rate. For example, the clock circuit 362 generates a write clock, a read clock and a packet clock for the data filtering circuit 352 such that output filtered data is 2 Mbit/s. As yet still another example, the clock circuit 362 generates clock signals for data processing circuit 354 that include one or more of the write clock 360, the read clock 446, and the packet clock 448 of FIG. 48, when the data processing circuit 354 includes the data formatting module 425. Note the waveform of any of the clock signals may be one or more of a square, sinusoid, triangle and sawtooth.

Figure 53A:
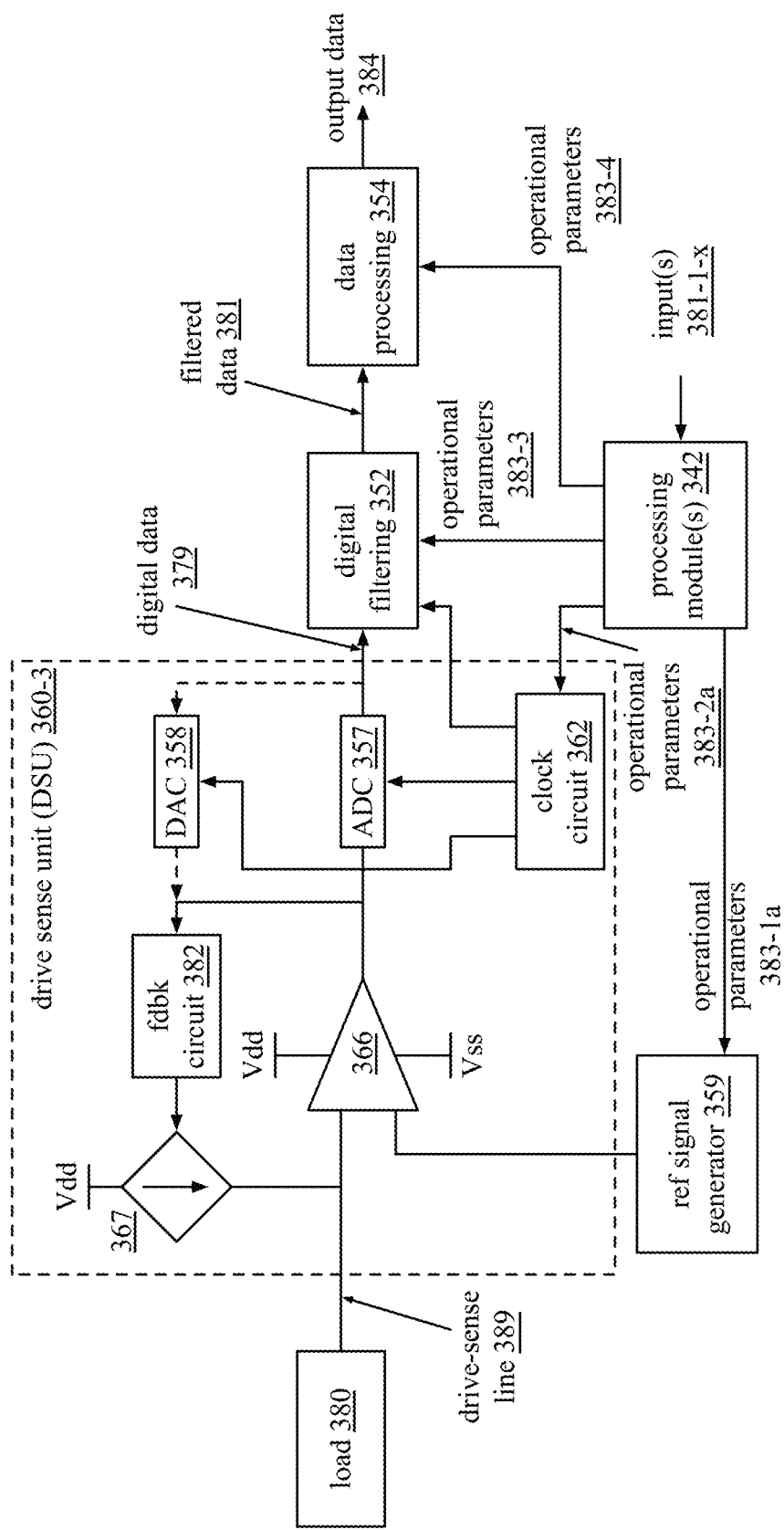
FIG. 53A is a schematic block diagram of another embodiment of drive sense unit.

FIG. 53A is a schematic block diagram of another embodiment of a drive sense unit (DSU) 360-3 that includes an operational amplifier or comparator 366, a feedback circuit 382, a dependent current source 367, an analog to digital converter (ADC) 357, a digital to analog converter (DAC) 358, and a clock circuit 362. In general, one or more processing modules 342 configures the DSU 360-3 to generate digital data 379 regarding sensing of the load 380. Note that in an embodiment, the feedback circuit 382 receives one of an output of the op amp 366 or the DAC 258, but not both during the same clock cycle.

In an example of operation, the ADC 357 is a sigma delta ADC and the one or more processing modules 342 is configured to determine to sense the load 380 at 20 KHz (e.g., 20 KHz being one or both of the signaling on the drive sense line and the output data rate). To achieve noise shaping to produce a target SNR greater than 20 dB, the one or more processing modules 342 is configured to determine a $2^{nd}$ order for the ADC modulator of the sigma delta ADC. Further, to produce the target (e.g., over a corresponding (e.g., first, second, etc.) threshold) SNR, the one or more processing modules 342 is configured to determine an ADC sampling rate to spread quantization noise over a broader frequency spectrum and that also satisfies the Nyquist Theorem. For example, the one or more processing modules 342 is configured to determine that by oversampling the highest frequency signal provided to the load 380 (e.g., 20 KHz) by 16× produces an SNR of greater than 20 dB. The one or more processing modules 342 is then configured to generate the operational parameters 383-1-x (e.g., 383-1a, 383-2a, etc.) and to provide the operational parameters to the DSU 360-3, the digital filtering circuit 352, the reference signal generator 359 and the data processing circuit 354. The DSU 360-3 generates digital data 379 regarding sensing of the load 380 in accordance with the operational parameters 383-1 through 383-2. The digital filtering circuit 352 generates filtered data 381 based on the digital data 379 and in accordance with the operational parameters 383-3. The data processing circuit 354 generates output data based on the filtered data 381 and in accordance with the operational parameters 383-4.

Figure 53B:
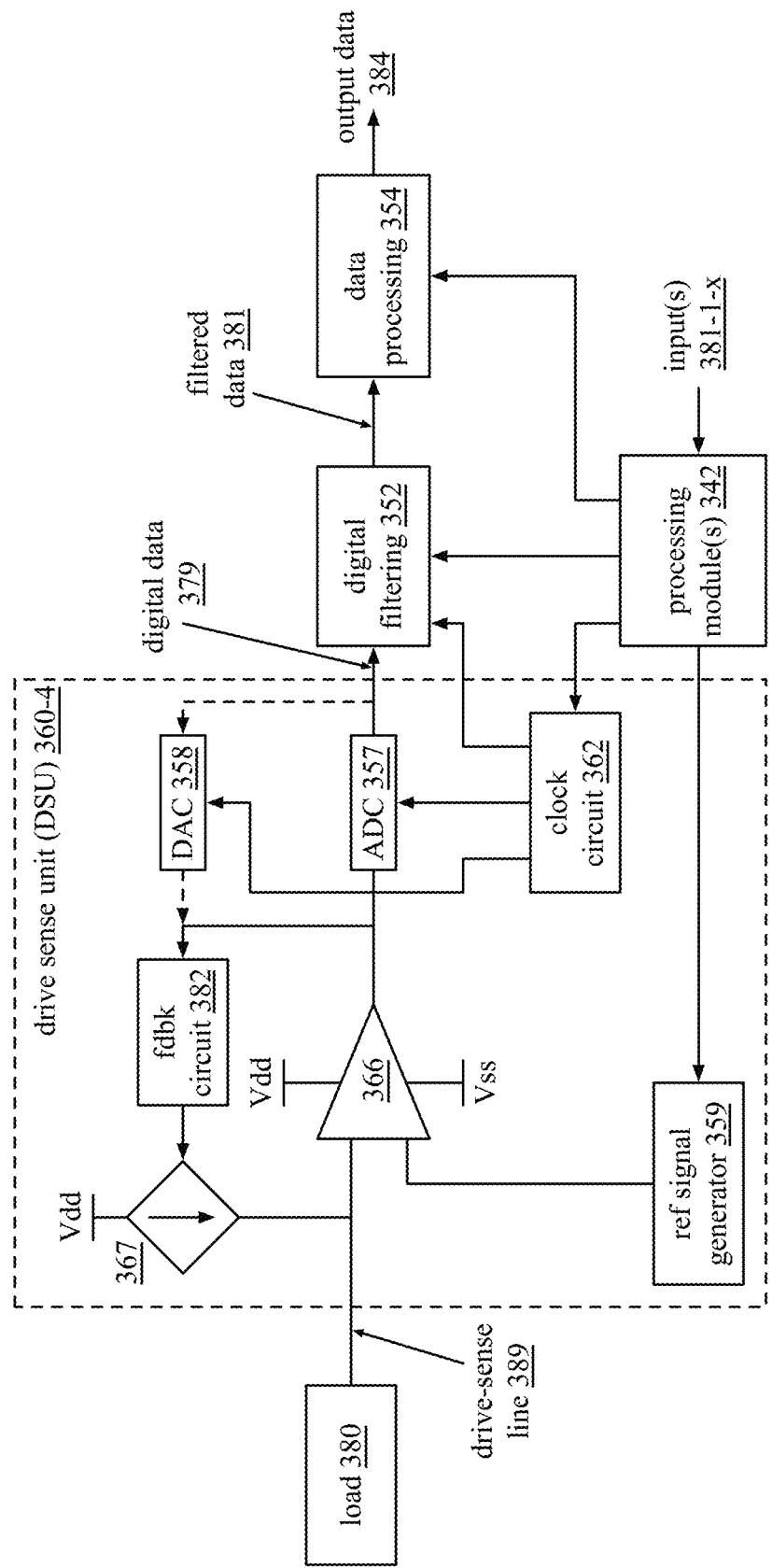
FIG. 53B is a schematic block diagram of another embodiment of drive sense unit.

FIG. 53B is a schematic block diagram of another embodiment of a drive sense unit (DSU) 360-4 that is similar to FIG. 53A, with at least one difference being that a reference signal generator 359 is part of the DSU 360-4. In general, one or more processing modules 342 operate to configure, the DSU 360-4 to generate digital data 379 regarding sensing of the load 380 based on inputs 381-1-x, configure the digital filtering circuit 352 to generate filtered data 381 based on the digital data 379, and configure the data processing circuit 354 to generate output data 384 based on the filtered data 381.

Figure 54:
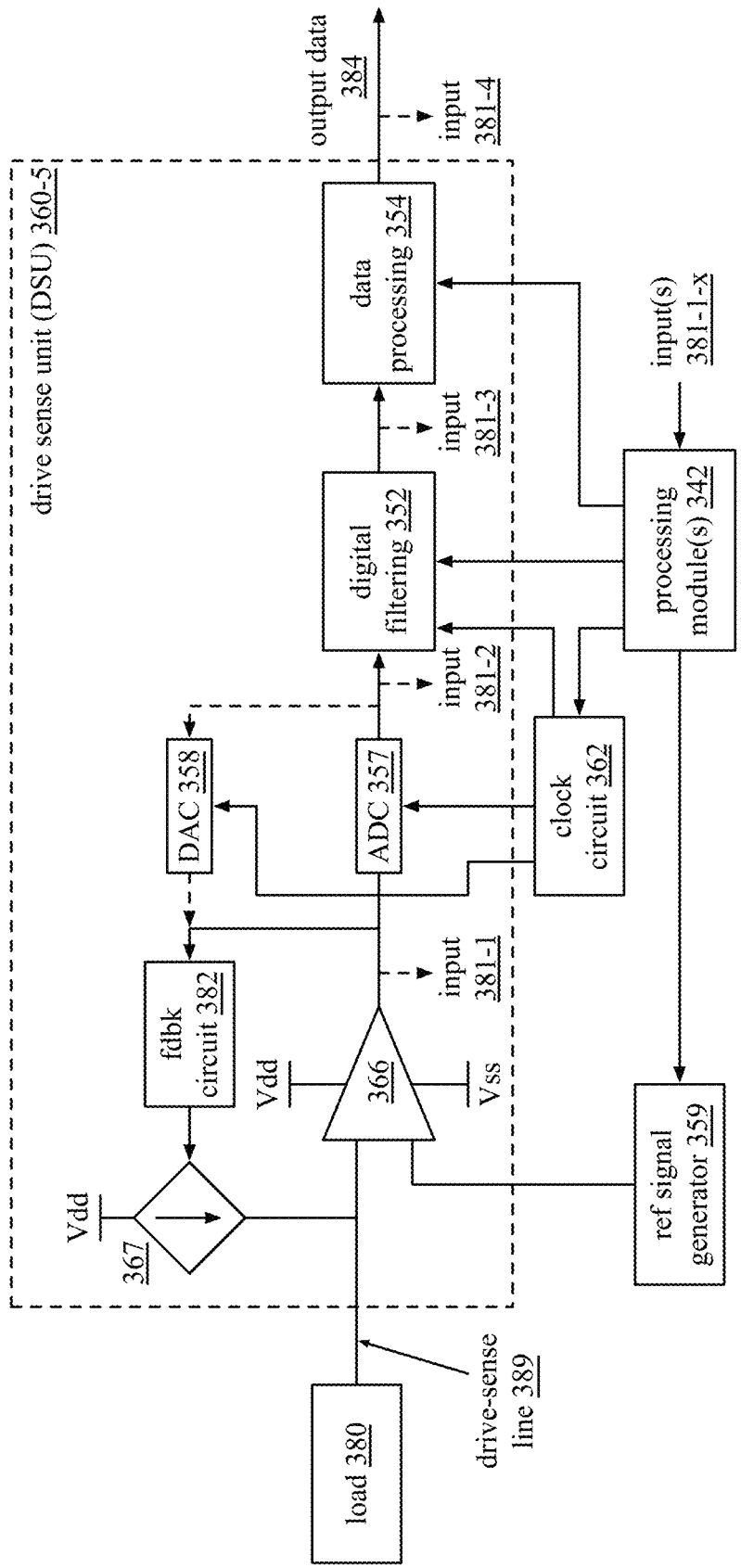
FIG. 54 is a schematic block diagram of another embodiment of drive sense unit.

FIG. 54 is a schematic block diagram of another embodiment of a drive sense unit (DSU) 360-5 that includes an operational amplifier or comparator 366, a feedback circuit 382, a dependent current source 367, an analog to digital converter (ADC) 357, a digital to analog converter (DAC) 358, a digital filtering circuit 352, and a data processing circuit 354.

In general, one or more processing modules 342 operate to configure the reference signal generator 359 to produce reference signals, configure clock circuit 362 to generate one or more clock signals, and configure the DSU 360-5, to output data 384 regarding sensing of the load 380. The configuring is based on one or more inputs 381-1 through 381-x. Note that as few as one input 381-1 is used in certain implementations. For example, the output of digital filtering 352 is an input 381-3 to a processing module 342 of one or more processing modules 342. In another example, the output data 384 is an input 381-4. In another example, the input 381-2 is the output of the ADC 357. In yet another example, the input 381-1 is the output of operational amplifier or comparator 366. In yet another example, an input 381-6 is a command from another processing module 342.

In an example of operation, one or more processing modules 342 is configured to modify an operational parameter based on one of the inputs. For example, the one or more processing modules 342 is configured to determine whether an output value of output data 384 exceeds a threshold value (e.g., greater than, less than, outside a bounded range, etc.). When the output of the output value of output data 384 exceeds the threshold (e.g., a voltage of 1.5 exceeds a voltage threshold of 1.48), the one or more processing modules 342 is configured to determine an updated sampling frequency for the ADC 357 (e.g., higher frequency, lower frequency), an updated reference signal (e.g., waveform from square wave to sinusoidal, amplitude from 30% to 5% of rail voltage, frequency from 2 Hz to 300 Hz, etc.) for reference signal generator, and/or an updated output data rate (e.g., modify a decimation factor, modify an interpolation factor, etc). For example, the one or more processing modules 342 is configured to determine that an output of 22 mV is above a 20 mV threshold for maintaining current operational parameters. As such, the one or more processing modules 342 is configured to determine to change the sampling frequency. In an example, the change is an increase to the sampling frequency to a set updated frequency (e.g., based on a predetermination (e.g., in a lookup table)). In another example, the change is an increase to the sampling frequency that corresponds to the difference between the threshold value and the output value. For instance, when the difference is a first level, the sampling frequency is increased a first value, and, when the difference is a second level, the sampling frequency is increased a second value.

As a specific example, when the output value is less than 5 mV above the threshold value, the one or more processing modules 342 is configured to determine a first increase value (e.g., from 20 Hz to 10 KHz), and when the output value is 5 mV or greater than the threshold value, the one or more processing modules 342 is configured to determine a second increase value (e.g., from 20 Hz to 20 KHz). In an instance, this allows automatic adaptation to driving and/or sensing the load. For example, the DSU 360-5 is in a low power state (e.g., sampling once every 10 minutes) until a value (e.g., output data) exceeds a threshold, then is automatically put into a next level power state (e.g., sampling once every 20 seconds). In an instance, when the threshold is no longer exceeding the threshold, the DSU 360-5 is set to revert to the low power state (e.g., sampling once every 10 minutes).

Figure 55:
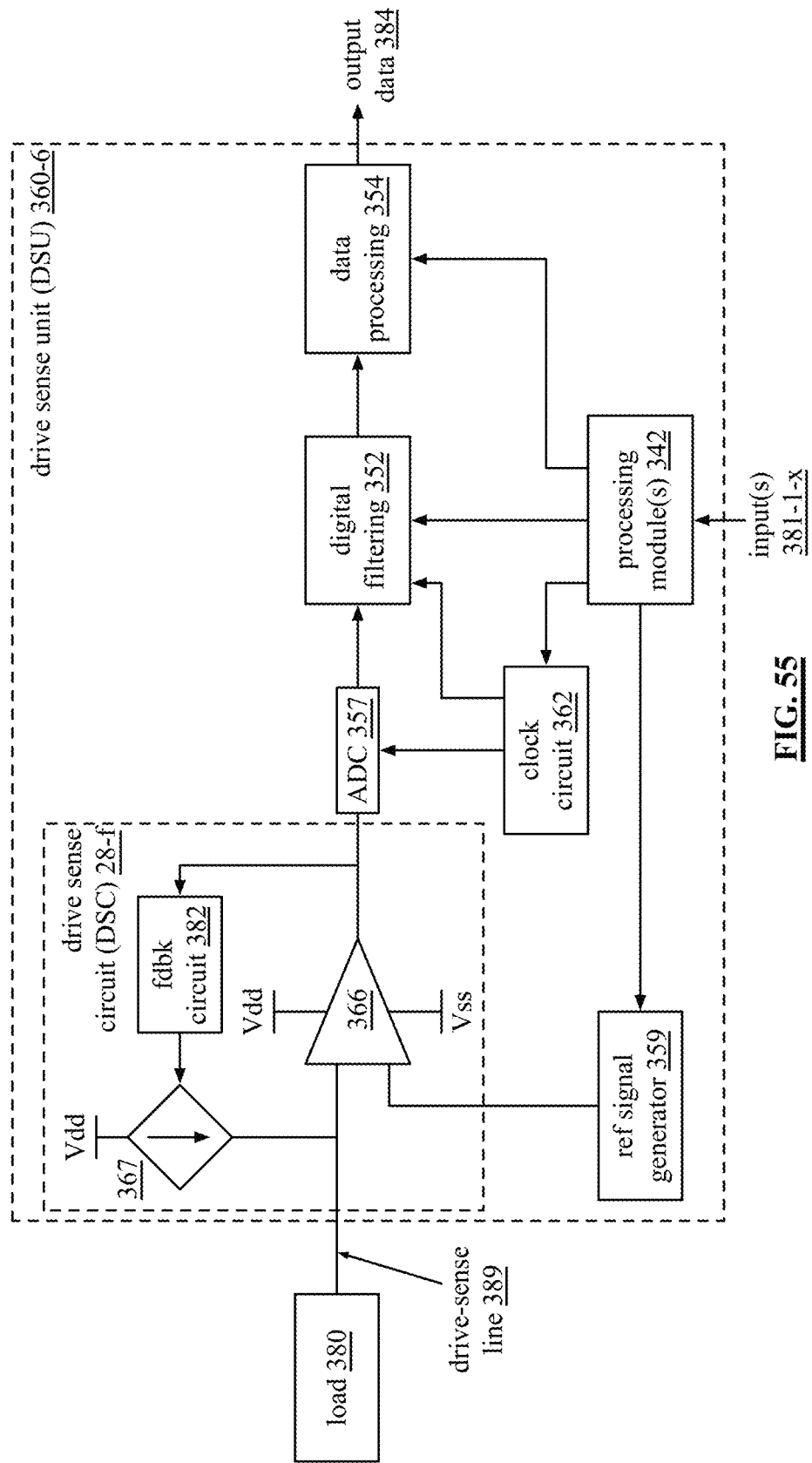
FIG. 55 is a schematic block diagram of another embodiment of drive sense unit.

FIG. 55 is a schematic block diagram of another embodiment of a drive sense unit (DSU) 360-6 that includes the drive sense circuit (DSC) 28-$f$ of FIG. 16D, an analog to digital converter (ADC) 357, a clock circuit 362, a reference signal generator 359, a digital filtering circuit 352, a data processing circuit 354, and one or more processing modules 342. The DSC 28-$f$ includes an operational amplifier or comparator 366, a feedback circuit 382, and a dependent current source 367. In general, the one or more processing modules 342 operate to configure, based on inputs 381-1-$x$, the DSU 360-6 to generate output data 384 regarding sensing of the load 380 via drive-sense line 389. In one example, an input of the one or more inputs 381-1-$x$ is from another processing module (e.g., associated with another DSU, etc.) and/or from any of the other sources described herein.

Figure 56:
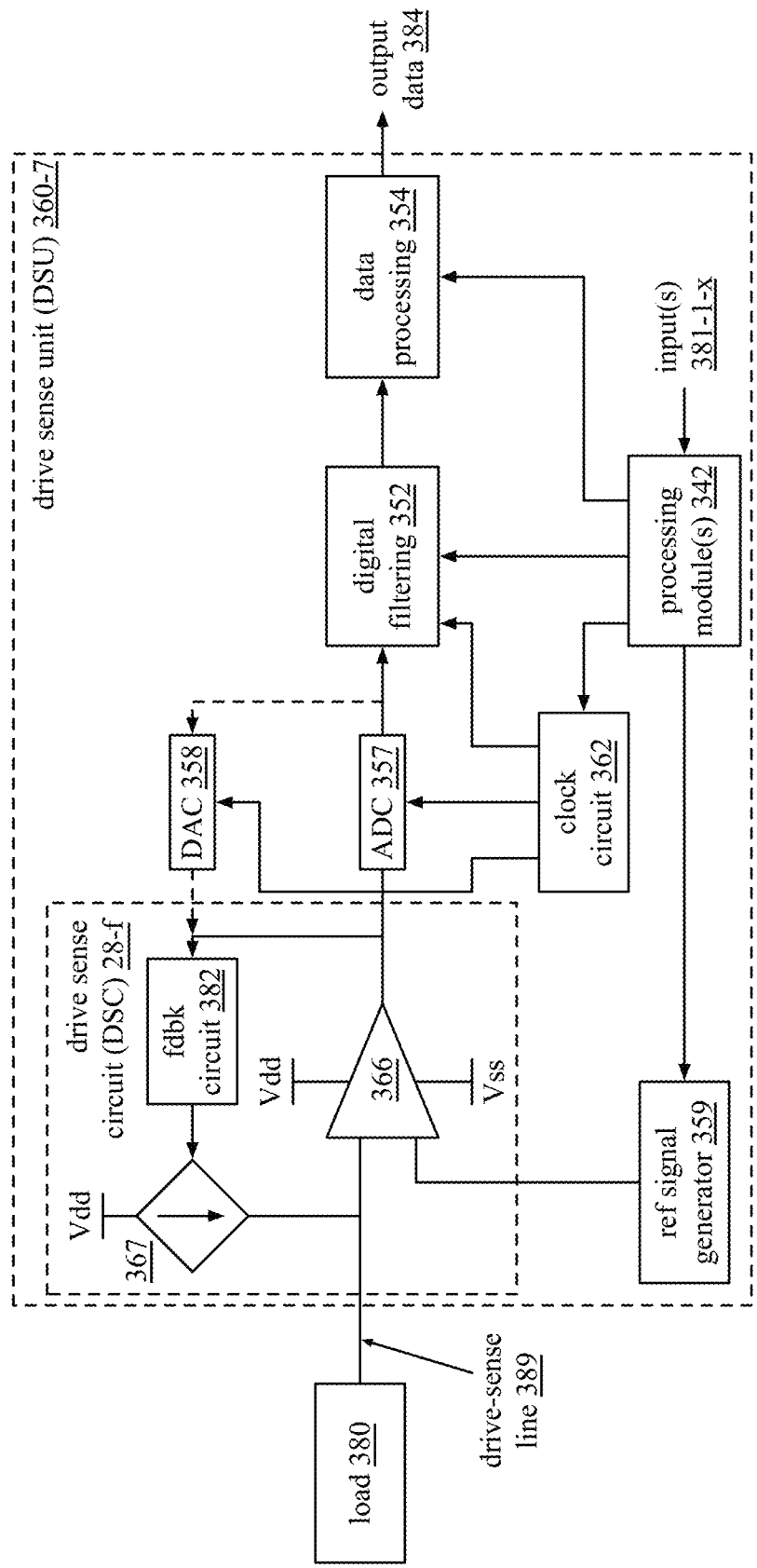
FIG. 56 is a schematic block diagram of another embodiment of drive sense unit.

FIG. 56 is a schematic block diagram of another embodiment of a drive sense unit (DSU) 360-7 that includes a drive sense circuit (DSC) 28-$f$ of FIG. 16D, an analog to digital converter (ADC) 357, a digital to analog circuit (DAC) 358, a clock circuit 362, a reference signal generator 359, a digital filtering circuit 352, a data processing circuit 354, and one or more processing modules 342. The DSC 28-$f$ includes an operational amplifier or comparator 366, a feedback circuit 382, and a dependent current source 367. In general, the one or more processing modules 342 operate to configure the DSU 360 to output data 384 regarding sensing of the load 380 via drive-sense line 389.

Figure 57:
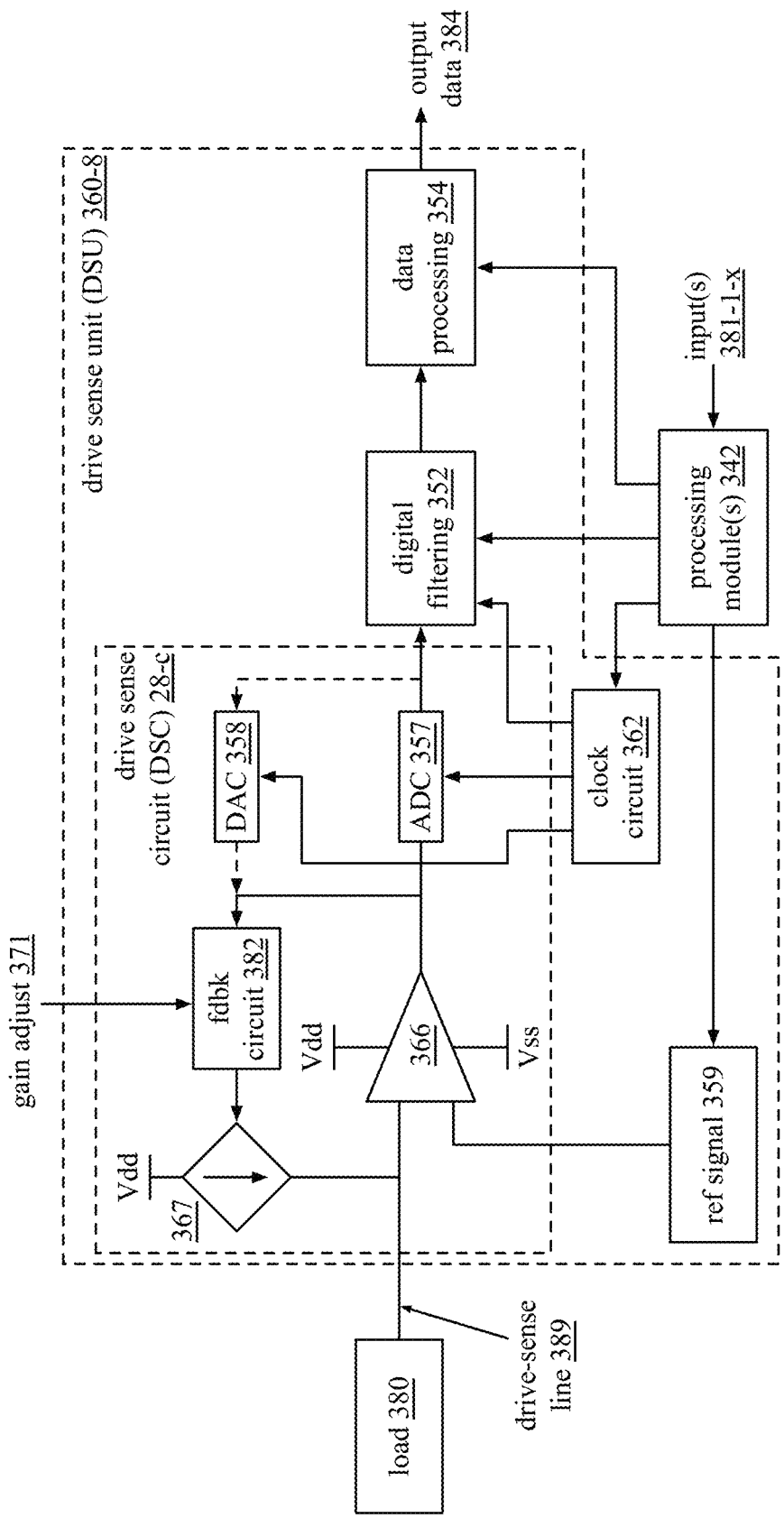
FIG. 57 is a schematic block diagram of another embodiment of drive sense unit.

FIG. 57 is a schematic block diagram of another embodiment of a drive sense unit (DSU) 360-8 that includes a drive sense circuit (DSC) 28-$c$ of FIG. 16A, a clock circuit 362, a reference signal generator 359, a digital filtering circuit 352, and a data processing circuit 354. The DSC 28-$c$ includes an analog to digital converter (ADC) 357, a digital to analog (DAC) circuit 358, an operational amplifier or comparator 366, a feedback circuit 382, and a dependent current source 367. In general, one or more processing modules 342 operate to configure, based on input(s) 381-1-$x$, the DSU 360-8 to generate output data 384 regarding sensing of the load 380 via the drive-sense line 389.

Figure 58:
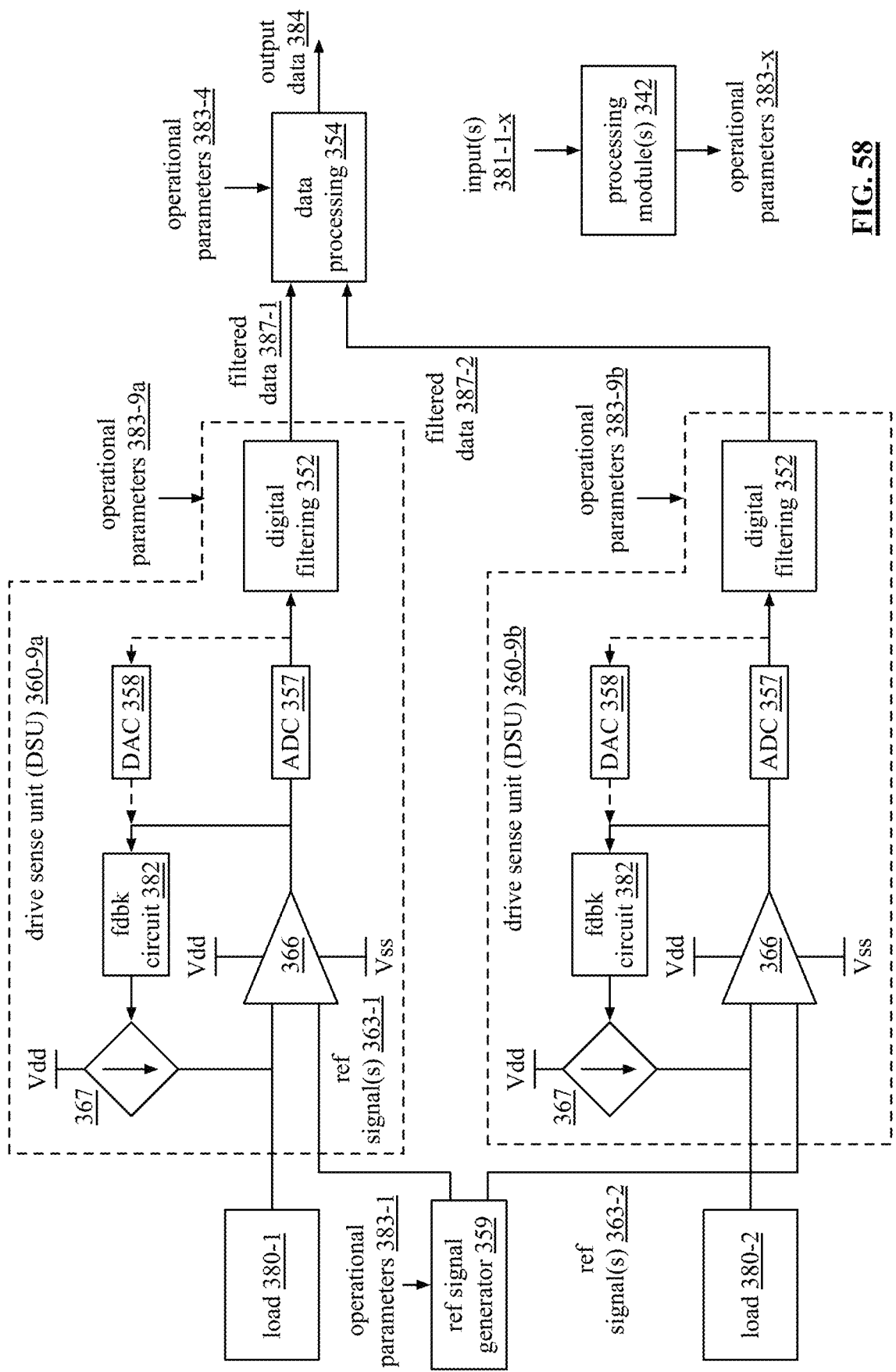
FIG. 58 is a schematic block diagram of an embodiment of multiple drive sense units.

FIG. 58 is a schematic block diagram of an embodiment of programming more than one drive sense unit (DSU) 360-9$a$, 360-9$b$ by one or more processing modules 342. The one or more processing modules 342 is configured to generate operational parameters 383-$x$ (e.g., 383-1, 383-9$a$, 383-9$b$, 383-4) based on inputs 381-1-$x$. The operational parameters 383-$x$ operate to configure the reference signal generator 359, a first DSU 360-9$a$, a second DSU 360-9$b$ to produce filtered data 387-1, 387-2 based on sensing one or more of the loads 380-1, 380-2, and configure a data processing circuit 354 to generate output data with desired characteristics based on the filtered data and in accordance with operational parameters 383-4.

Note as shown in the previous Figures, the data processing circuit 354 may be a part of one or more DSUs. In an example of operation and implementation, note that one or more processing modules 342 is configured to generate first operational parameters 383-9$a$ for the first DSU 360-1 and is also configured to generate second operational parameters 383-9$b$ for the second DSU 360-2, where one or more of the operational parameters are different and/or one or more of the operational parameters are the same. In an alternative embodiment, each of DSU 360-9$a$ and DSU 360-9$b$ is respectively coupled to an independent reference signal generator.

FIG. 59 is a flowchart of an example of configuring a programmable drive sense unit (DSU). Note that the various operational steps of the method of this diagram and others included herein may be performed by one or more processing modules, one or more components of a DSU, and/or one or more components associated with a DSU. Note that such configuration of one or more components of the DSU and/or one or more components associated with a DSU are performed in accordance with one or more load sensing objectives, data processing objectives and/or desired output data. Note also that such configuration of one or more components of the DSU and/or one or more components associated with a DSU are performed may be applied to various aspects, embodiments, and/or examples of the disclosure (and/or their equivalents) as disclosed herein including various architectures and implementations of DSUs.

The method of this diagram operates in step 590 by determining one or more load sensing objectives based on sensing a load using the DSU. The DSU is configured to drive and simultaneously to sense the load via a single drive-sense line.

Examples of one or more the load sensing objectives include one or more of a sensitivity, a signal to noise ratio (SNR), a power, a bandwidth, and/or a sampling rate. The one or more load sensing objectives are based on one or more of a number of loads to be sensed (where the loads include the load), a type of sensing to be performed by the one or more loads, a nature of the sensing to be performed by the one or more loads, data processing objectives and/or a duration of the sampling and/or sensing for the one or more loads.

In an example, the method operates by determining the type of sensing includes one or more of a self capacitance, a mutual capacitance, an impedance, a voltage, a current, a frequency response, and tuning for a desired frequency. In another example, the method operates by determining the nature of sensing includes one or more of a touch (e.g., a human finger), a hover, a movement (e.g., by a human (e.g., gesture, running, etc.), by an object (e.g., bike, car, plane, etc.), by an animal (e.g., bird, lion, etc.), etc.), a vital parameter (e.g., heart rate, blood pressure, etc.), and an environmental parameter (e.g., humidity, moisture, temperature, vibration, pressure, etc.). In yet another example, the method operates by determining a frequency or frequency range of a drive sense signal provided to the load based on one or more of the load sensing objectives.

The method further operates in step 592 by determining data processing objectives for the sensing the load by the programmable DSU. As an example, the method operates by determining the data processing objectives include one or more of a filter bandwidth, a filter coefficient, a filter type, a filter slew rate, a number of filter taps to enable, a filter center frequency, and an oversampling ratio.

The method further operates in step 594 by determining desired characteristics for output data regarding at least a first portion of the sensing. For example, the method operates by determining the desired characteristics for the output data includes one or more of a value type (e.g., absolute values, deltas, etc.), a format (e.g., packet size, etc.) and a data rate (e.g., 300 Mbits/sec, as a multiple of the sampling rate, 300 Hz, etc.).

The method continues with step 596 by determining operational parameters for the DSU based on one or more of the load sensing objectives, the data processing objectives, and the desired characteristics for the output data. For example, the method operates by determining the operational parameters include one or more of a number of reference signals, a waveform for at least one of the reference signals, a frequency for at least one of the reference signals, a phase for at least one of the reference signals, a gain of a feedback circuit of the DSU, a scaling factor of the dependent current supply of the DSU, a number of filtering stages to activate, a number of filter coefficients, a number of clock signals, a waveform for at least one of the clock signals, a phase for at least one of the clock signals, and a frequency for at least one of the clock signals.

The method further operates step 598 by configuring the DSU based on one or more of the operational parameters to achieve the one or more load sensing objectives for sensing the load. For example, the method includes providing control signals (e.g., operational parameters) to the DSU that cause the DSU to output data regarding sensing the load in accordance with a desired one or more of an SNR, a sensitivity level, a power level, a bandwidth and a sampling frequency.

In certain examples, the method may further operate by operating a data processing circuit that is configured to generate the output data and by operating one or more processing modules to generate updated operational parameters for the DSU based one or more of the output data, the load sensing objectives, the data processing objectives and the desired characteristics for the output data. The method may also further include determining to change one of the operational parameters based on the output data. The method then continues by generating the updated operational parameters based on the change, where the updated operational parameters include an updated operational parameter corresponding to the one of the operational parameters.

The method may also further include configuring a second programmable DSU. The configuring of the second programmable DSU includes determining one or more second load sensing objectives based on sensing of a second load that is operably coupled via a second single line to the second DSU, determining second data processing objectives associated with the sensing of the second load, and determining second desired characteristics for output data associated with the sensing of the second load. The configuring further includes generating second operational parameters for the second DSU based on one or more of the second load sensing objectives, the second data processing objectives and the second desired output data. The method continues by providing the second operational parameters to the second DSU to facilitate generating second output data regarding the sensing of the second load.

Figure 60A:
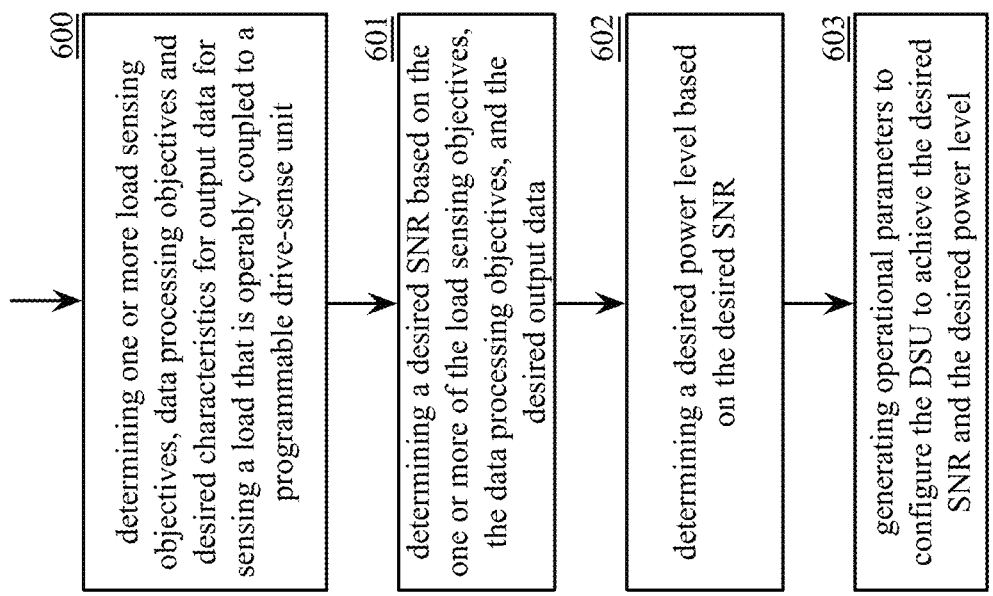
FIG. 60A is a flowchart of another example of a method of programming a drive sense unit.

FIG. 60A is a flowchart of another example of configuring a programmable drive sense unit (DSU) operably coupled via a drive sense line to a load. The method operates in step 600 by determining one or more load sensing objectives, data processing objectives, and desired characteristics for output data regarding sensing of the load. For example, a load sensing objective is voltage sensing performed by the load, a data processing objective is a maximum number of filter taps and a desired characteristic is an output data rate.

The method further operates in step 601 by determining a target (e.g., desired, over a threshold, etc.) signal to noise ratio based on the one or more load sensing objectives, data processing objectives and desired characteristics for output data. For example, the method operates by determining a target SNR is greater than 10 dB based on the voltage sensing, the maximum number of filter taps and the output data rate. As another example, the method operates by determining a number of the FIR filter taps available and a number of FIR filter taps to be enabled to achieve the desired SNR. In general, increasing the number of FIR filter taps decreases noise, which improves the SNR.

In another example, the method operates by determining a noise floor level based on the voltage level on the load. Based on the noise floor level, the method operates by determining whether the number of FIR filter taps to enable provides a predicted (e.g., estimated, based on a lookup table, based on a message, etc.) SNR that compares favorably (e.g., exceeds) to the desired SNR. When the predicted SNR compares unfavorably (e.g., is not equal to or greater than) to the desired SNR, the method operates by modifying at least one of an operational parameter of the DSU, a data processing objective, a load sensing objective and a desired characteristic for the output data. For example, the processing module determines to enable more FIR filter taps such that the predicted SNR compares favorably to the desired SNR. As another example, the method operates by determining to increase an oversampling ratio such that the predicted SNR compares favorably to the desired SNR. Note that the term SNR as used herein may include other factors (e.g., interference (e.g., SINR, SNIR), distortion (e.g., SINAD), etc).

The method further operates in step 602 by determining a desired (e.g., estimated, target, below a threshold, etc.) power level for the signaling based on the desired SNR. For example, when the power of the DSU increases, the noise also increases. Thus, the method operates by determining operational parameters for the DSU that exceed a threshold SNR (e.g., the desired SNR), but are less than a target (e.g., desired, threshold) power level. This includes one or more of adjusting the number of FIR filter taps, adjusting an oversampling ratio, adjusting bandwidth of a bandpass filter, adjusting an output sampling rate adjusting gain of a feedback circuit, adjusting a scaling factor of a dependent current source, adjusting magnitude of a reference signal, and adjusting frequency of the reference signal such that the threshold SNR is achieved at minimal (e.g., desired) power. In an example of implementation and operation, the method operates by performing a test, determining to adjust power and/or SNR during the sensing and/or utilizing a lookup table to determine one or more of the desired SNR, power level, load sensing objectives, data processing objectives and operational parameters.

The method further operates in step 603 by generating operational parameters to configure the DSU to achieve the desired SNR at the desired power level. For example, consider a situation where the desired SNR is 10 dB, then the method operates by generating operational parameters to include a reference signal having a 500 mV power level which produces an SNR that is greater than or equal to the desired SNR of 10 decibels (dB).

Figure 60B:
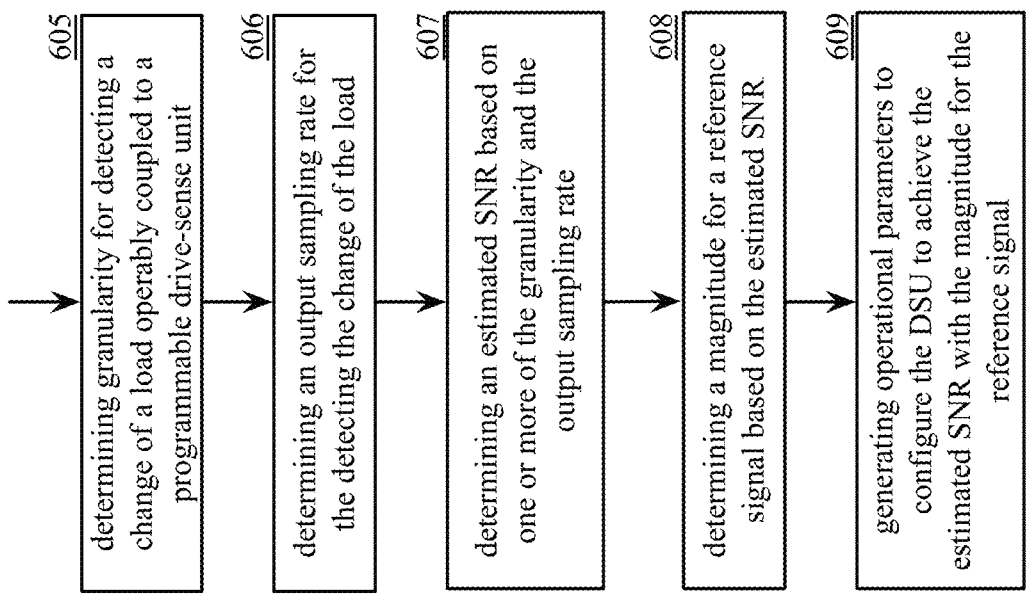
FIG. 60B is a flowchart of another example of a method of programming a drive sense unit.

FIG. 60B is a flowchart of another example of configuring a programmable drive sense unit (DSU) operably coupled via a drive sense line to a load. The method operates in step 605 by determining a granularity (e.g., delta, amount, variance, etc.) for detecting a change (e.g., in impedance, voltage, current, power, etc.) of the load. For example, the method operates by determining the granularity is two microohms. As another example, the method operates by determining the granularity is 5 millivolts. As yet another example, the method operates by determining the granularity is logarithmic scale of one tenth of one order of magnitude. As a still further example, the method operates by determining the granularity is three decibels (dB).

The method further operates in step 606 by determining an output sampling rate for detecting the change associated with the load. For example, the method operates by determining the output sampling rate for detecting a human movement is 300 hertz. The method further operates in step 607 by determining a target signal to noise ratio (SNR) based on the granularity and the output sampling rate. For example, method operates by setting the target SNR based on a level of oversampling to be performed at the analog to digital converter (ADC) in accordance with the output sampling rate.

The method further operates in step 608 by determining a magnitude for the reference signal. In general, as the amplitude of the reference signal increases, the susceptibility to noise issues decreases. In an example, for a first SNR, the method operates by determining a first magnitude for the reference signal, and, for a second SNR, that is greater than the first SNR, the method operates by determining a second magnitude for the reference signal, where the second magnitude is greater than the first magnitude. The method further includes step 609, where the method operates by generating operational parameters to configure the DSU for sensing the load in to achieve the estimated SNR, and in accordance with the magnitude of the reference signal. For example, the operational parameters configure the DSU to generate output data based on sensing the load with an SNR equal to or greater than the estimated SNR.

Figure 61:
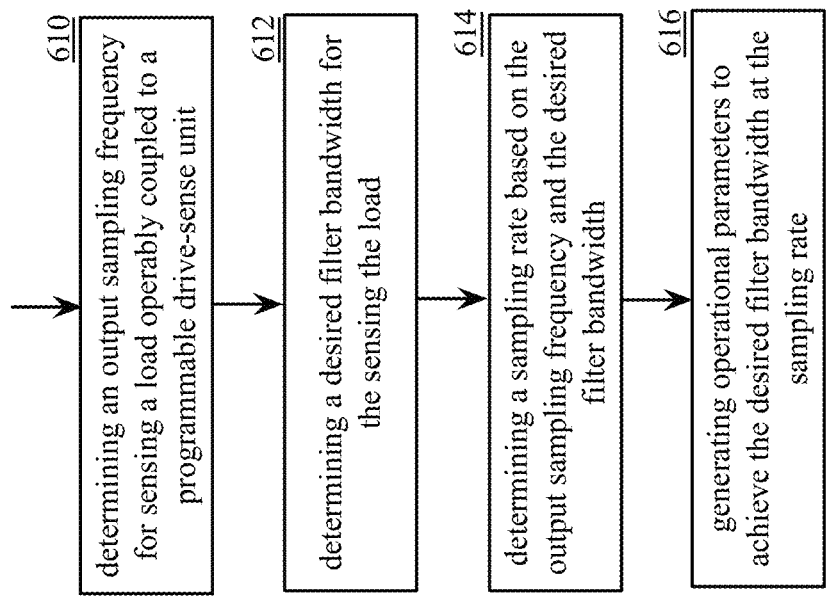
FIG. 61 is a flowchart of another example of a method of programming a drive sense unit.

FIG. 61 is a flowchart of another example of configuring a programmable drive sense unit (DSU). The method operates in step 610 by determining an output sampling frequency for sensing a load operably coupled to the programmable DSU. For example, the method operates by determining the load needs to be sensed three hundred times a second (e.g., based on the sampling frequency of 300 Hz).

The method further operates in step 612 by determining a desired (e.g., target, over a threshold, a set value, etc.) filter bandwidth for the sensing of the load. For example, the method operates by determining a filter bandwidth of 10 Hz based on a target signal to noise ratio and the output sampling frequency. As another example, the method operates by determining the filter bandwidth of 20 Hz based on a number of filter taps that are able to be enabled for digital filtering.

The method continues with step 614, where the method operates by determining a sampling rate (e.g., of an analog to digital converter) based on the output sampling frequency and the desired bandwidth for the sensing. In an example, for a given digital clock rate, as the sampling rate increases, the filter bandwidth also increases (due to less processing cycles to perform the digital filtering (e.g., fewer filter taps)). Conversely, for the given digital clock rate, as the sampling rate decreases, the filter bandwidth decreases.

As a specific example, the filter routine needs to be performed within one sampling clock period. Thus, for a filter with 100 taps enabled that can complete a multiply-accumulate instruction in 13.3 nanoseconds, and requires 105 instructions, the total execution time of the filter routine is approximately 1.4 microseconds. This corresponds to a maximum possible sampling rate of 714 Kilohertz (kHz) and thus the Nyquist theorem dictates the maximum bandwidth of signaling on the load is 357 kHz.

Thus, in the example where the frequency of f1 (e.g., in FIG. 39) is 100 KHz, the Nyquist theorem dictates the sampling rate should be at least 200 kHz. The method may also operate by increasing the sampling rate (e.g., 600 kHz) to push quantization noise into higher frequencies of the frequency spectrum. For example, the method operates by determining to increase the sampling rate (e.g., when implemented with a different digital filter than the example above limited to 714 kHz) to 39.32 MHz and/or change the order of a sigma delta modulator of the ADC to obtain a desired noise shaping.

The method continues in step 616 by generating operational parameters for the DSU to achieve the desired bandwidth (e.g., 1.23 MHz) and the sampling rate (e.g., 39.32 MHz). For example, the method operates by generating the operational parameters to include coefficients of the digital filter such that the filter has a bandwidth of 10 Hz, centered at 300 Hz.

Figure 62:
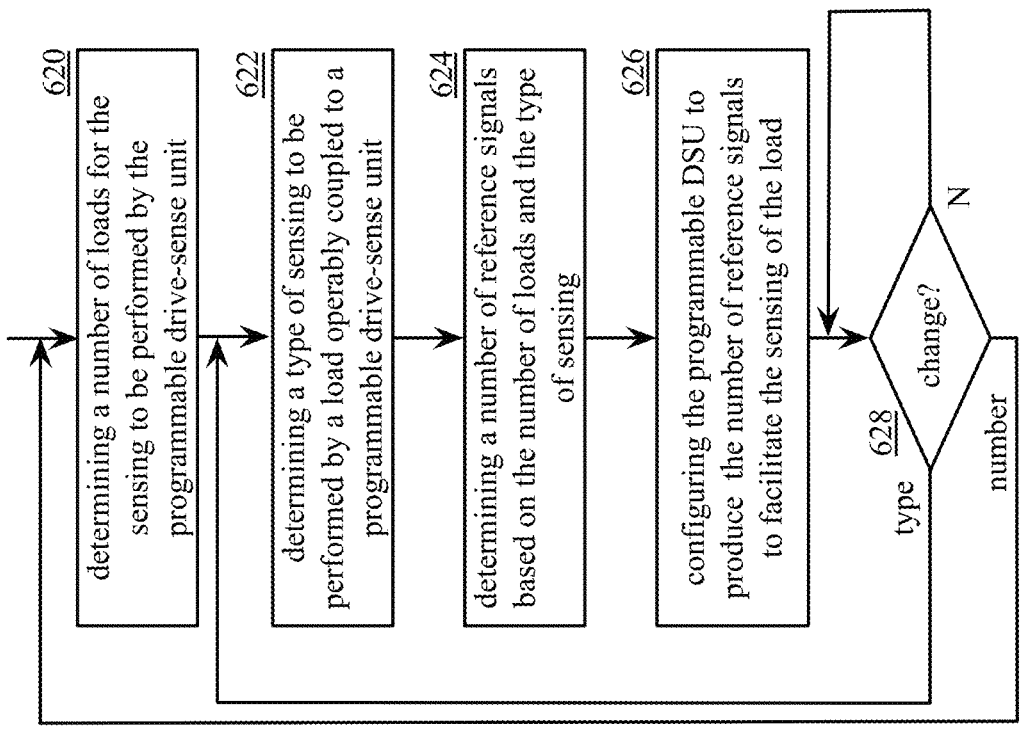
FIG. 62 is a flowchart of another example of a method of programming a drive sense unit.

FIG. 62 is a flowchart of another example of configuring a programmable drive sense unit (DSU). The method operates in step 620 by determining a number of loads to be sensed by the programmable DSU. For example, the method operates by determining the number of loads to be sensed is two. The method further operates in step 622 by determining a type of sensing regarding the sensing the loads operably coupled via a drive sense line to the drive sense unit (DSU). For example, the method operates by determining the type of sensing includes (a) sensing a self-capacitance for a first load of the two loads; and (b) sensing a self-capacitance and a mutual capacitance for a second load of the two loads. In another example, the method operates by determining the type of sensing is frequency sweeping the first load via 20 frequencies to determine an optimal frequency to sense load. The example may further include determining the type of sensing for the second load based on the frequency sweep results (e.g., setting frequency of second load at the optimal (e.g., impedance matching, resonance, etc.) frequency).

The method further operates in step 624 by determining a number of reference signals based on the type of sensing and the number of the loads to be utilized in the sensing. For example, the method operates by determining the number of reference signals is 3 (e.g., 1 for sensing self-capacitance of the first load and 2 for sensing the self and mutual capacitance of the second load). As another example, the method operates by determining the number of reference signals is 21 (e.g., 20 for the frequency sweep of first load and 1 for the second load). In a first instance, the 20 frequencies for the first load are simultaneously driven onto a drive sense line coupled to the load. In a second instance, the 20 frequencies for the first load driven onto the drive sense line individually. In a third instance, the 20 frequencies for the first load driven onto the drive sense line in sub groups (e.g., 5 of 20 in a first group, a next 5 of the remaining 15 in a second group, a next 3 of remaining 10 in a third group, etc.).

The method further operates in step 626 by configuring the programmable DSU to generate the number of reference signals to facilitate the sensing of the load. For example, the method operates by generating operational parameters and provides the operational parameters to the DSU such that the DSU enables one or more reference signal generators to generate the number of reference signals with particular characteristics (e.g., frequency, waveform, amplitude, etc.) in accordance with the operational parameters.

The method further operates in step 628 by determining whether the type of sensing and/or the number of loads to be sensed has changed. For example, the method operates by determining the type of sensing changed from sensing a self capacitance to sensing a self capacitance and a mutual capacitance. As another example, the method operates by determining the number of loads to be sensed changed from 2 to 1.

When the number of loads to be sensed has changed, the method loops back to step 620. When the type of sensing has changed, the method loops back to step 622. When neither the type nor the number has changed, the method loops back to step 628. In an example, step 628 is performed at a set interval (e.g., every 5 seconds, every 10 minutes, etc.). In another example, step 628 is performed when an output of the DSU compares favorably to an output threshold. For example, when the output of the DSU indicates a bit pattern that matches an output threshold bit pattern, the method operates by determining a favorable comparison and performs step 628. As another example, when an output voltage exceeds an output voltage threshold, method operates by determining a favorable comparison and performs step 628.

Figure 63:
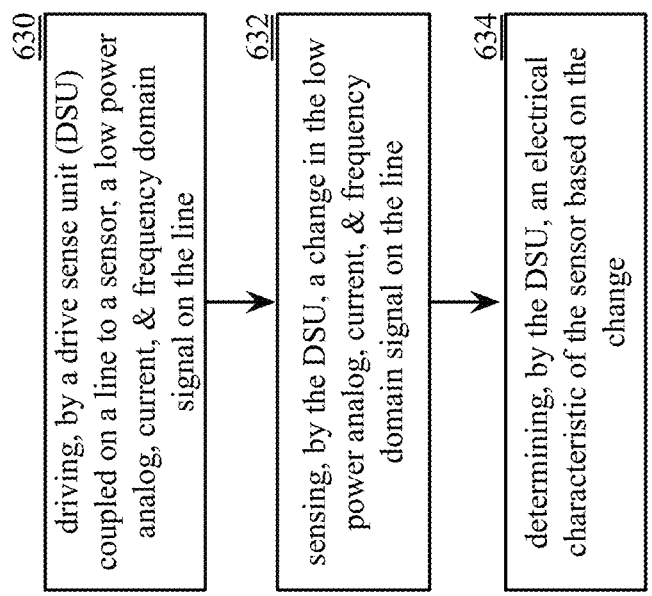
FIG. 63 is a flowchart of an example of a method of driving a current domain, frequency domain and low power analog signal onto a line coupled between a sensor and a drive sense unit for sensing the sensor.

FIG. 63 is a flowchart of an example of a drive sense unit (DSU) providing a low power analog domain, current domain, and frequency domain (ACFD) signal to a sensor. The method includes step 630, where the DSU drives the low power analog domain, current domain, frequency domain (ACFD) signal on to a line that couples the DSU to a sensor. For example, the DSU generates a sinusoidal signal having a power of 5%-25% of the rail to rail voltage, a current of 0.02 micro amps ($\mu A$), and a frequency of 20 MHz. The method continues in step 632 by sensing a change to the ACFD signal on the line. For example, the DSU generates an error signal based on comparing a reference signal of 0.02 $\mu A$ to the current on the line, where the error signal indicates the change in current. For example, when the current on the line is 0.022 $\mu A$, the error signal represents a 0.002 $\mu A$ change.

The method continues in step 634 by determining an electrical characteristic (impedance, voltage, current, etc.) of the sensor based on the sensed change to the ACFD signal. Note that such determination of the electrical characteristic is performed by a configured DSU that has been configured by one or more methods in accordance with various aspects, embodiments, and/or examples of the disclosure (and/or their equivalents). For example, the DSU regulates a voltage to be constant on the line, and determines an impedance change based on the change in current in accordance with V=IZ. This increases accuracy of the sensing (e.g., increases SNR) and decreases power consumption for the sensing.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., indicates an advantageous relationship that would be evident to one skilled in the art in light of the present disclosure, and based, for example, on the nature of the signals/items that are being compared. As may be used herein, the term "compares unfavorably", indicates that a comparison between two or more items, signals, etc., fails to provide such an advantageous relationship and/or that provides a disadvantageous relationship. Such an item/signal can correspond to one or more numeric values, one or more measurements, one or more counts and/or proportions, one or more types of data, and/or other information with attributes that can be compared to a threshold, to each other and/or to attributes of other information to determine whether a favorable or unfavorable comparison exists. Examples of such an advantageous relationship can include: one item/signal being greater than (or greater than or equal to) a threshold value, one item/signal being less than (or less than or equal to) a threshold value, one item/signal being greater than (or greater than or equal to) another item/signal, one item/signal being less than (or less than or equal to) another item/signal, one item/signal matching another item/signal, one item/signal substantially matching another item/signal within a predefined or industry accepted tolerance such as 1%, 5%, 10% or some other margin, etc. Furthermore, one skilled in the art will recognize that such a comparison between two items/signals can be performed in different ways. For example, when the advantageous relationship is that signal 1 has a greater magnitude than signal 2, a favorable comparison may be achieved when the magnitude of signal 1 is greater than that of signal 2 or when the magnitude of signal 2 is less than that of signal 1. Similarly, one skilled in the art will recognize that the comparison of the inverse or opposite of items/signals and/or other forms of mathematical or logical equivalence can likewise be used in an equivalent fashion. For example, the comparison to determine if a signal X>5 is equivalent to determining if −X<−5, and the comparison to determine if signal A matches signal B can likewise be performed by determining ~A matches ~B or not(A) matches not(B). As may be discussed herein, the determination that a particular relationship is present (either favorable or unfavorable) can be utilized to automatically trigger a particular action. Unless expressly stated to the contrary, the absence of that particular condition may be assumed to imply that the particular action will not automatically be triggered. In other examples, the determination that a particular relationship is present (either favorable or unfavorable) can be utilized as a basis or consideration to determine whether to perform one or more actions. Note that such a basis or consideration can be considered alone or in combination with one or more other bases or considerations to determine whether to perform the one or more actions. In one example where multiple bases or considerations are used to determine whether to perform one or more actions, the respective bases or considerations are given equal weight in such determination. In another example where multiple bases or considerations are used to determine whether to perform one or more actions, the respective bases or considerations are given unequal weight in such determination.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While transistors may be shown in one or more of the above-described figure(s) as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

As applicable, one or more functions associated with the methods and/or processes described herein can be implemented via a processing module that operates via the non-human "artificial" intelligence (AI) of a machine. Examples of such AI include machines that operate via anomaly detection techniques, decision trees, association rules, expert systems and other knowledge-based systems, computer vision models, artificial neural networks, convolutional neural networks, support vector machines (SVMs), Bayesian networks, genetic algorithms, feature learning, sparse dictionary learning, preference learning, deep learning and other machine learning techniques that are trained using training data via unsupervised, semi-supervised, supervised and/or reinforcement learning, and/or other AI. The human mind is not equipped to perform such AI techniques, not only due to the complexity of these techniques, but also due to the fact that artificial intelligence, by its very definition—requires "artificial" intelligence—i.e., machine/non-human intelligence.

As applicable, one or more functions associated with the methods and/or processes described herein can be implemented as a large-scale system that is operable to receive, transmit and/or process data on a large-scale. As used herein, a large-scale refers to a large number of data, such as one or more kilobytes, megabytes, gigabytes, terabytes or more of data that are received, transmitted and/or processed. Such receiving, transmitting and/or processing of data cannot practically be performed by the human mind on a large-scale within a reasonable period of time, such as within a second, a millisecond, microsecond, a real-time basis or other high speed required by the machines that generate the data, receive the data, convey the data, store the data and/or use the data.

As applicable, one or more functions associated with the methods and/or processes described herein can require data to be manipulated in different ways within overlapping time spans. The human mind is not equipped to perform such different data manipulations independently, contemporaneously, in parallel, and/or on a coordinated basis within a reasonable period of time, such as within a second, a millisecond, microsecond, a real-time basis or other high speed required by the machines that generate the data, receive the data, convey the data, store the data and/or use the data.

As applicable, one or more functions associated with the methods and/or processes described herein can be implemented in a system that is operable to electronically receive digital data via a wired or wireless communication network and/or to electronically transmit digital data via a wired or wireless communication network. Such receiving and transmitting cannot practically be performed by the human mind because the human mind is not equipped to electronically transmit or receive digital data, let alone to transmit and receive digital data via a wired or wireless communication network.

As applicable, one or more functions associated with the methods and/or processes described herein can be implemented in a system that is operable to electronically store digital data in a memory device. Such storage cannot practically be performed by the human mind because the human mind is not equipped to electronically store digital data. While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules to configure a programmable drive-sense unit (DSU), the method comprising:
    determining one or more load sensing objectives based on sensing a load using the DSU that is configured to drive and simultaneously to sense the load via a single line, wherein the DSU includes:
        a comparator configured to produce an error signal based on comparison of a reference signal to a drive-sense signal, wherein the reference signal is received at a first input of the comparator, and the drive-sense signal is received at a second input of the comparator, and wherein the second input is coupled to the single line;
        a feedback circuit operably coupled to the comparator and configured to process the error signal to generate a control signal; and
        a dependent current supply operably coupled to the feedback circuit and configured to generate the drive-sense signal based on the control signal and to provide the drive-sense signal via the single line;
    determining one or more data processing objectives associated with sensing the load;
    determining desired characteristics for output data regarding the sensing the load;

determining operational parameters for the DSU based on one or more of the load sensing objectives, the data processing objectives, and the desired characteristics for the output data; and configuring the DSU based on the operational parameters to achieve the one or more load sensing objectives.

2. The method of claim 1, wherein the one or more load sensing objectives associated with sensing the load comprises one or more of:
a signal to noise ratio, a sensitivity, a bandwidth, a sampling rate, and a power.

3. The method of claim 1, wherein the one or more load sensing objectives are based on one or more of:
a number of loads, wherein the loads include the load.
a type of the sensing performed by the load; and
a nature of the sensing performed by the load.

4. The method of claim 3, wherein the type of sensing comprises one or more of:
a self capacitance;
a mutual capacitance;
an impedance;
a voltage;
a current;
a frequency response; and
tuning for a desired frequency.

5. The method of claim 3, wherein the nature of the sensing comprises one or more of:
a touch;
a hover;
a movement;
a vital parameter regarding a human; and
an environmental parameter.

6. The method of claim 1, wherein the data processing objectives associated with sensing the load comprise one or more of:
a filter bandwidth;
a filter coefficient;
a filter slew rate;
a number of filter taps;
a filter center frequency; and
an oversampling ratio.

7. The method of claim 1, wherein the desired characteristics for the output data comprises one or more of:
an output value type;
an output data format; and
an output data rate.

8. The method of claim 1, wherein the operational parameters comprise one or more of:
a number of reference signals;
a waveform for at least one of the reference signals;
a frequency for at least one of the reference signals;
a phase for at least one of the reference signals;
a gain of the feedback circuit;
a scaling factor of the dependent current supply;
a number of filtering stages to activate;
a number of filter coefficients;
a frequency for a rate of the output data;
a number of clock signals;
a waveform for at least one of the clock signals; and
a frequency for at least one of the clock signals.

9. The method of claim 1 further comprises:
modifying one or more of the load sensing objectives, the data processing objectives and the desired characteristics for the output data.

10. The method of claim 1 further comprises:
modifying one or more of the load sensing objectives, the data processing objectives and the desired characteristics for the output data based on the output data.

11. The method of claim 1 further comprises:
configuring, by the one or more processing modules, a second programmable DSU by:
determining one or more second load sensing objectives based on sensing a load using the second DSU that is configured to drive and simultaneously to sense the second load via a second single line;
determining one or more second data processing objectives associated with sensing the second load;
determining second desired characteristics for the output data associated with sensing the load;
determining second operational parameters for the second DSU based on one or more of the second load sensing objectives, the second data processing objectives, and the second desired characteristics for the output data; and
configuring the second DSU based on the second operational parameters to achieve the one or more second load sensing objectives.

12. A method for execution by one or more processing modules to configure a programmable drive-sense unit (DSU), the method comprising:
determining one or more load sensing objectives based on sensing, via a line, a load using the DSU, wherein the DSU includes:
a comparator configured to produce an error signal based on comparison of a reference signal to a drive-sense signal, wherein the reference signal is received at a first input of the comparator, and the drive-sense signal is received at a second input of the comparator, and wherein the second input is coupled to the line;
a feedback circuit operably coupled to the comparator and configured to process the error signal to generate a control signal; and
a dependent current supply operably coupled to the feedback circuit and configured to generate the drive-sense signal based on the control signal and to provide the drive-sense signal via the line;
determining one or more data processing objectives associated with sensing the load;
determining operational parameters for the DSU based on one or more of the load sensing objectives and the data processing objectives; and
configuring the DSU based on the operational parameters to achieve the one or more load sensing objectives.

13. The method of claim 12, wherein the one or more load sensing objectives associated with sensing the load comprises one or more of:
a signal to noise ratio, a sensitivity, a bandwidth, a sampling rate, and a power.

14. The method of claim 12, wherein the one or more load sensing objectives are based on one or more of:
a number of loads, wherein the loads include the load.
a type of the sensing performed by the load; and
a nature of the sensing performed by the load.

15. The method of claim 14, wherein the type of sensing comprises one or more of:
a self capacitance;
a mutual capacitance;
an impedance;
a voltage;
a current;
a frequency response; and
tuning for a desired frequency.

16. The method of claim 14, wherein the nature of the sensing comprises one or more of:
- a touch;
- a hover;
- a movement;
- a vital parameter regarding a human; and
- an environmental parameter.

17. The method of claim 12, wherein the data processing objectives associated with sensing the load comprise one or more of:
- a filter bandwidth;
- a filter coefficient;
- a filter slew rate;
- a number of filter taps;
- a filter center frequency; and
- an oversampling ratio.

18. The method of claim 12 further comprises:
- determining desired characteristics for output data associated with sensing the load; and
- determining the operational parameters for the DSU based on one or more of the load sensing objectives, the data processing objectives, and the desired characteristics for the output data.

19. The method of claim 18, wherein the desired characteristics for the output data comprises one or more of:
- an output value type;
- an output data format; and
- an output data rate.

20. The method of claim 12, wherein the operational parameters comprise one or more of:
- a number of reference signals;
- a waveform for at least one of the reference signals;
- a frequency for at least one of the reference signals;
- a phase for at least one of the reference signals;
- a gain of the feedback circuit;
- a scaling factor of the dependent current supply;
- a number of filtering stages to activate;
- a number of filter coefficients;
- a frequency for a rate of the output data;
- a number of clock signals;
- a waveform for at least one of the clock signals; and
- a frequency for at least one of the clock signals.

* * * * *